(12) United States Patent
Heo et al.

(10) Patent No.: US 10,306,780 B2
(45) Date of Patent: May 28, 2019

(54) DISPLAY DEVICE

(71) Applicant: LG ELECTRONICS INC., Seoul (KR)

(72) Inventors: Jinha Heo, Seoul (KR); Sangtae Park, Seoul (KR); Jonghyun Byeon, Seoul (KR); Jeongsik Choi, Seoul (KR); Hyunjong Ryu, Seoul (KR); Myeongwook Bae, Seoul (KR); Jingyu Kim, Seoul (KR); Kyounghwa Park, Seoul (KR); Sangdon Park, Seoul (KR); Jongjin Woo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 34 days.

(21) Appl. No.: 15/607,245

(22) Filed: May 26, 2017

(65) Prior Publication Data

US 2017/0347469 A1    Nov. 30, 2017

Related U.S. Application Data

(60) Provisional application No. 62/342,208, filed on May 27, 2016.

(30) Foreign Application Priority Data

Aug. 8, 2016    (KR) .................... 10-2016-0100631
Aug. 8, 2016    (KR) .................... 10-2016-0100634

(51) Int. Cl.
*H05K 1/00*    (2006.01)
*H05K 5/00*    (2006.01)
(Continued)

(52) U.S. Cl.
CPC ....... *H05K 5/0017* (2013.01); *G02F 1/13452* (2013.01); *G02F 1/133308* (2013.01);
(Continued)

(58) Field of Classification Search
USPC .................................................. 361/748, 760
See application file for complete search history.

(56) References Cited

U.S. PATENT DOCUMENTS

2005/0243239 A1    11/2005    Kondo et al.
2013/0170115 A1*    7/2013    Jung .................... G02F 1/00
                                                           361/679.01
(Continued)

OTHER PUBLICATIONS

European Patent Office Application Serial No. 17172873.6, Search Report dated Oct. 11, 2017, 8 pages.

*Primary Examiner* — Andargie M Aychillhum
(74) *Attorney, Agent, or Firm* — Lee, Hong, Degerman, Kang & Waimey

(57) ABSTRACT

A display device of the present disclosure includes a transparent plate, a first display panel disposed at on a first surface of the transparent plate, a first transparent frame disposed at on the first surface of the transparent plate and adjacent to a side of the first display panel, a first receiving portion formed on at the transparent plate and positioned between the transparent plate and the first display panel, a slot formed at at least one of the transparent plate or the first transparent frame, a first member layer connected to a first side of the first display panel, a first PCB connected to the first member layer and positioned at the first receiving portion, and a first cable extended extending from the first PCB and inserted into the slot.

20 Claims, 81 Drawing Sheets

(51) Int. Cl.
*G06F 3/041* (2006.01)
*H01L 51/00* (2006.01)
*H01L 51/52* (2006.01)
*H05K 5/02* (2006.01)
*H05K 7/14* (2006.01)
*G02F 1/1333* (2006.01)
*G02F 1/1345* (2006.01)

(52) U.S. Cl.
CPC .......... *G06F 3/041* (2013.01); *H01L 51/0097* (2013.01); *H01L 51/5237* (2013.01); *H05K 5/0217* (2013.01); *H05K 7/1427* (2013.01); *G02F 2001/133314* (2013.01); *G02F 2001/133342* (2013.01); *G02F 2202/09* (2013.01); *H01L 2251/5338* (2013.01)

(56) References Cited

U.S. PATENT DOCUMENTS

| | | | |
|---|---|---|---|
| 2013/0258246 A1 | 10/2013 | Kim et al. | |
| 2014/0168263 A1* | 6/2014 | Avci | G06T 11/60 345/633 |
| 2015/0295015 A1 | 10/2015 | Yu et al. | |

* cited by examiner

DISPLAY DEVICE

Pursuant to 35 U.S.C. § 119, this application claims the benefit of earlier filing date and right of priority to Korean Application Nos. 10-2016-0100631 and 10-2016-0100634, filed on Aug. 8, 2016, and also claims the benefit of U.S. Provisional Application No. 62/342,208, filed on May 27, 2016, the contents of which are all incorporated by reference herein in their entirety.

BACKGROUND OF THE INVENTION

Field of the Invention

This document relates to a display device which has a slim profile and maintains rigidity.

Discussion of the Related Art

With the development of the information society, various demands for display devices for displaying images are on the rise. In line with this, a variety of display devices have been recently developed and used, including LCDs (liquid crystal displays), PDPs (plasma display panels), ELDs (electroluminescent displays), VFDs (vacuum fluorescent displays), and OLEDs (organic light-emitting displays), and the like.

Among them, OLED panels can display images because a self-emitting organic layer is deposited on a substrate with a transparent electrode. The OLED panels are thin and flexible. There is a lot of research being done now on structural characteristics of display devices equipped with such OLED panels.

SUMMARY OF THE INVENTION

An aspect of the present invention is to improve the above discussed technologies. Another aspect of the present invention is to make the thickness of a display device slim while maintaining rigidity.

Yet another aspect of the present invention is to provide a display device with a transparent bezel.

A further aspect of the present invention is to provide a display device which is built on glass.

To accomplish the above-mentioned or other aspects, one exemplary embodiment of the present invention provides a display device comprising: a transparent plate; a display panel on a surface of the transparent plate; a transparent frame on the surface of the transparent plate and adjacent to a side of the display panel; a first receiving portion formed on the transparent plate and positioned between the transparent plate and the display panel; a slot formed at at least one of the transparent plate or the transparent frame; a member layer connected to a side of the display panel; a PCB connected to the member layer and positioned at the first receiving portion; and a cable extended from the PCB and inserted into the slot.

The first receiving portion may be adjacent to the side of the display panel and formed along a length of the side of the display panel.

The slot may be adjacent to another side of the display panel, wherein the another side of the display panel meets the side of the display panel.

The slot may be connected to an outer surface of the transparent plate or transparent frame.

The member layer may be positioned between the display panel and the transparent plate.

The cable may bend or fold between the first receiving portion and the slot.

The display device may further comprise a second receiving portion formed on the transparent plate, wherein the second receiving portion is positioned between the side of the display panel and another side of the display panel, wherein the another side of the display panel is parallel to the side of the display panel.

The second receiving portion may be formed to go through the transparent plate.

At least a part of the cable may be positioned at the second receiving portion.

The cable may comprise a plurality of cables, and bending or folding portions of the cables may be positioned at the second receiving portion.

The second receiving portion may be formed lengthwise along a length of the side or the another side of the display panel.

The transparent plate and the transparent frame may be formed integrally.

A boundary line may be formed between the transparent plate and the transparent frame.

The display device may further comprise a touch panel positioned in front of the display panel.

The display panel may further comprise a touch panel cable connected to the touch panel, wherein the touch panel cable may be inserted into the slot.

Another exemplary embodiment of the present invention provides a display device comprising: a first display panel positioned on a surface of the transparent plate; a second display panel positioned on another surface of the transparent plate; a first transparent frame on the surface of the transparent plate and adjacent to the side of the first display panel; a second transparent frame on another surface of the transparent plate and adjacent to the side of the second display panel; a first receiving portion positioned between the transparent plate and the first display panel; a third receiving portion positioned between the transparent plate and the second display panel; a slot formed at least one of the transparent plate, the first transparent frame, or the second transparent frame; a first member layer connected to a side of the first display panel; a second member layer connected to a side of the second display panel; a first PCB connected to the first member layer and positioned at the first receiving portion; a second PCB connected to the second member layer and positioned at the third receiving portion; a first cable extended from the first PCB and inserted into the slot formed at at least one of the transparent plate, the first transparent frame, or the second transparent frame; and a second cable extended from the second PCB and inserted into the slot formed at at least one of the transparent plate, the first transparent frame, or the second transparent frame.

The slot may further comprise: a first slot formed at least one of the surface of the transparent plate or the first transparent frame; and a second slot formed at at least one of the another surface of the transparent plate or the second transparent plate, wherein the first cable is inserted into the first slot, and the second cable is inserted into the second slot.

The display device may further comprise a second receiving portion formed on the transparent plate, wherein the second receiving portion goes through the transparent plate and is positioned between the first receiving portion and the third receiving portion, wherein the first cable may face the second cable at the second receiving portion.

The first cable and the second cable each may bend or fold at the second receiving portion.

The first slot and the second slot may be integrated together and connected to an outer surface of at least one of the transparent plate, the first transparent frame, or the second transparent frame.

According to at least one of the exemplary embodiments of the present invention, a slim display device may be provided.

According to at least one of the exemplary embodiments of the present invention, a display device with a transparent bezel may be provided.

According to at least one of the exemplary embodiments of the present invention, a display device built on glass may be provided.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
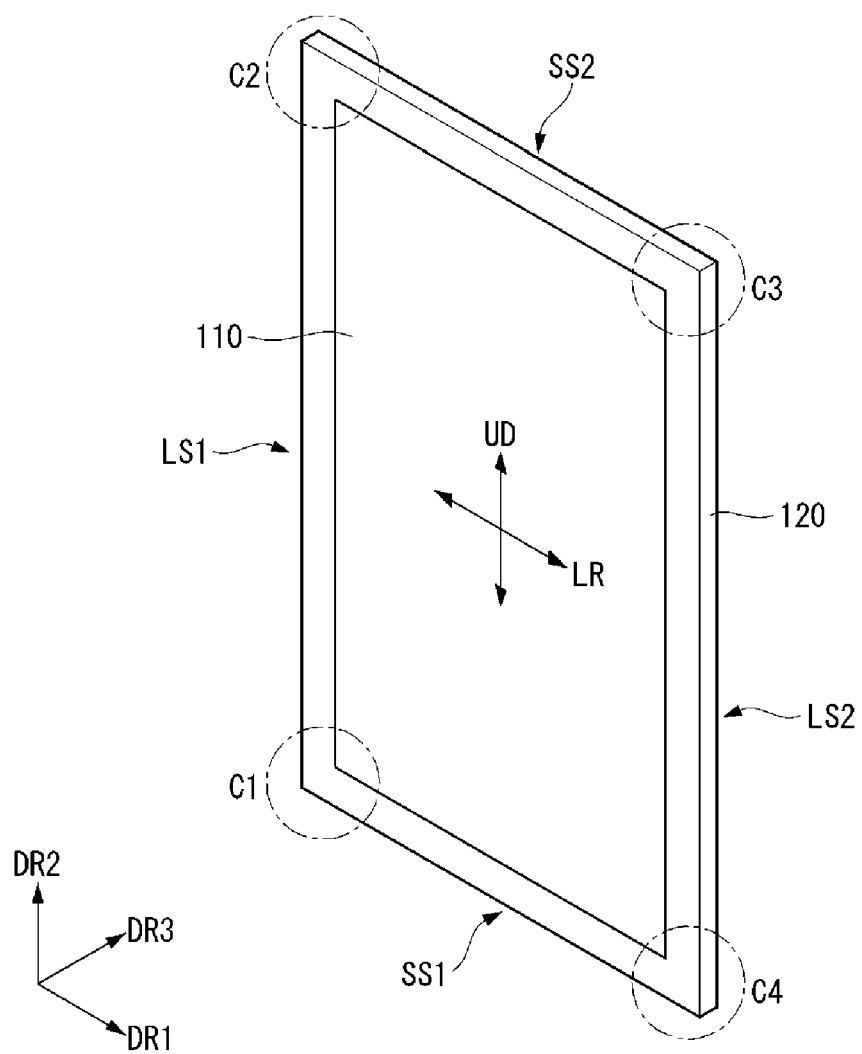
FIGS. 1 and 2 are views illustrating examples of a display device according to an exemplary embodiment of the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention is not limited to specific disclosed embodiments, but includes all modifications, equivalents and substitutes included within the spirit and technical scope of the present invention as will be understood by one of ordinary skill in the art.

The terms "first", "second", etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, an embodiment of the invention is described using an organic light emitting diode (OLED) display panel as an example of a display panel. Other display panels may be used. For example, a plasma display panel (PDP), a field emission display (FED) panel, and a liquid crystal display panel may be used.

As shown in the example of FIG. 1, a display device may include a first long side LS1, a second long side LS2 opposite the first long side LS1, a first short side SS1 adjacent to one end of the first long side LS1 and one end of the second long side LS2, and a second short side SS2 opposite the first short side SS1.

In the embodiment disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

The embodiment of the invention describes that lengths of the first and second long sides LS1 and LS2 are longer than lengths of the first and second short sides SS1 and SS2 for the sake of brevity and ease of reading. However, in some embodiments the lengths of the first and second long sides LS1 and LS2 may also be almost equal or even equal to the lengths of the first and second short sides SS1 and SS2.

In the following description, a first direction DR1 may be a direction parallel to the short sides SS1 and SS2 of the display device, and a second direction DR2 may be a direction parallel to the long sides LS1 and LS2 of the display device.

A third direction DR3 may be a direction perpendicular to the first direction DR1 and/or the second direction DR2.

The first direction DR1 and the second direction DR2 may be commonly referred to as a horizontal direction, and the third direction DR3 may be referred to as a vertical direction.

From a different perspective, the side where the display device displays an image may be the front or front side. The side that is not visible when viewing the image may be the back or back side. When viewing the display from the front or front side, the second short side SS2 may be the bottom or bottom side. Likewise, the first long side LS1 may be the left or left side, and the second long side LS2 may be the right or right side.

As another example, if the display device displays an image in two directions, one of the directions may be the front or front side. In this case, if the image is displayed in the other direction, the opposite direction may be the back or back side.

Moreover, the first long side LS1, second long side LS2, first short side SS1, and second short side SS2 may be referred to as the edges of the display device. Also, the positions where the first long side LS1, second long side LS2, first short side SS1, and second short side SS2 meet may referred to as corners. For example, the position where the first long side LS1 and the first short side SS1 meet may be a first corner C1, the position where the first long side LS1 and the second short side SS2 meet may be a second corner C2, the position where the second short side SS2 and the second long side LS2 may be a third corner C3, and the position where the second long side LS2 and the first short side SS1 may be a fourth corner C4.

Here, the direction from the first short side SS1 to the second short side SS2 or the direction from the second short side SS2 to the first short side SS1 may be an up-down direction UD. The direction from the first long side LS1 to the second long side LS2 or the direction from the second long side LS2 to the first long side LS1 may be a left-right direction LR.

Figure 2:
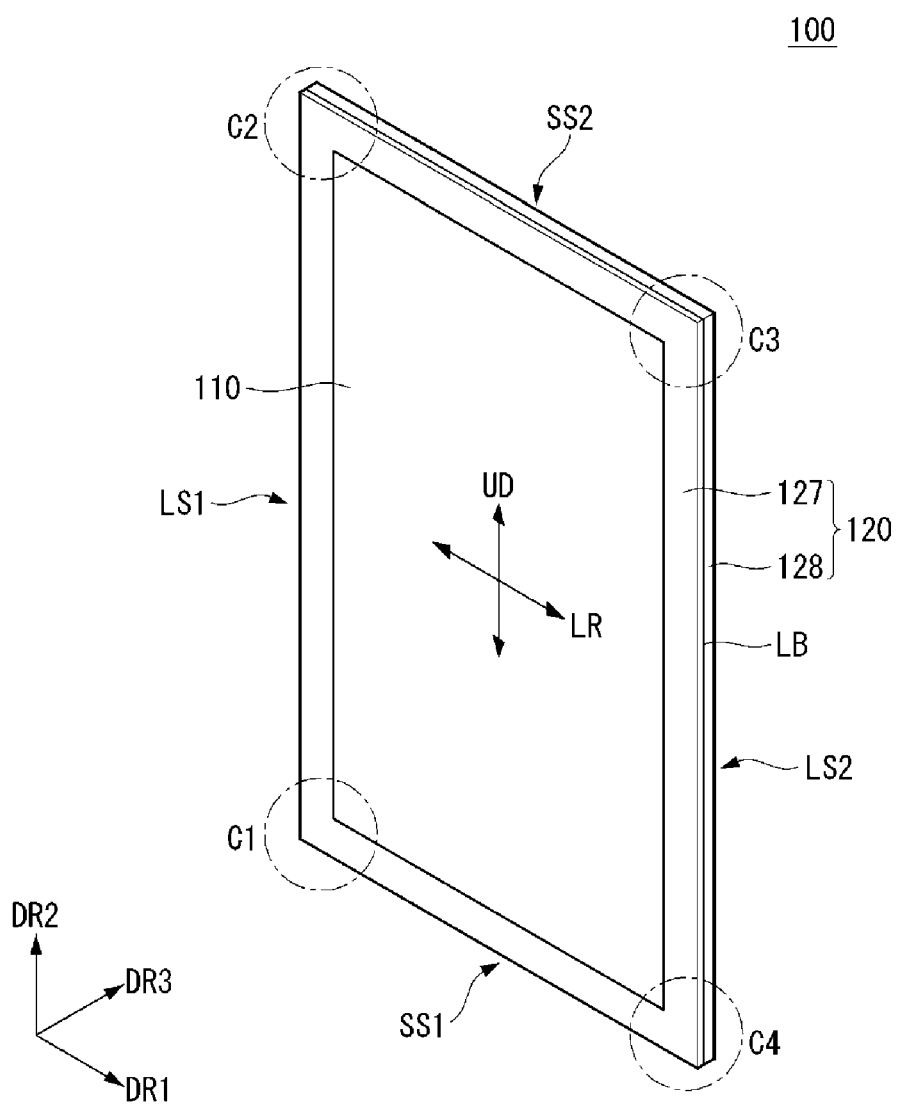

FIGS. 1 and 2 are views illustrating examples of a display device according to an exemplary embodiment of the present invention.

A display panel 110 may be visible on the front of the display device 100. The display panel 110 may provide an image towards the front of the display device 100. A transparent body 120 may be positioned on the back of the display panel 110.

The transparent body 120 may receive the display panel 110 on the back side. Portions of the transparent body 120 may face or surround the side of the display panel 110. The transparent body 120 may fix the display panel 110. The transparent body 120 may be connected or fixed externally. For example, the transparent body 120 may be hung or mounted on a ceiling or wall. For example, the transparent body 120 may be connected or fixed to the upper side of an external structure. For example, the transparent body 120 may be connected or fixed to the side of an external structure. For example, the transparent body 120 may be positioned between external structures.

The part of the transparent body 120 facing or surrounding the side of the display panel 110 and the part of the transparent body 120 facing the back side of the display panel 110 may be formed integrally, for example, as shown in FIG. 1. The part of the transparent body 120 facing or surrounding the side of the display panel 110 and the part of the transparent body 120 facing the back side of the display panel 110 may be distinguished from each other, for another example, as shown in FIG. 2.

A transparent frame 127 may face or surround the side of the display panel 110, as shown in FIG. 2. A part of a transparent plate 128 may be attached to the transparent frame 127. Another part of the transparent plate 128 may face or abut the back side of the display panel 110. A boundary line LB may be formed between the transparent frame 127 and the transparent plate 128.

Figure 3:
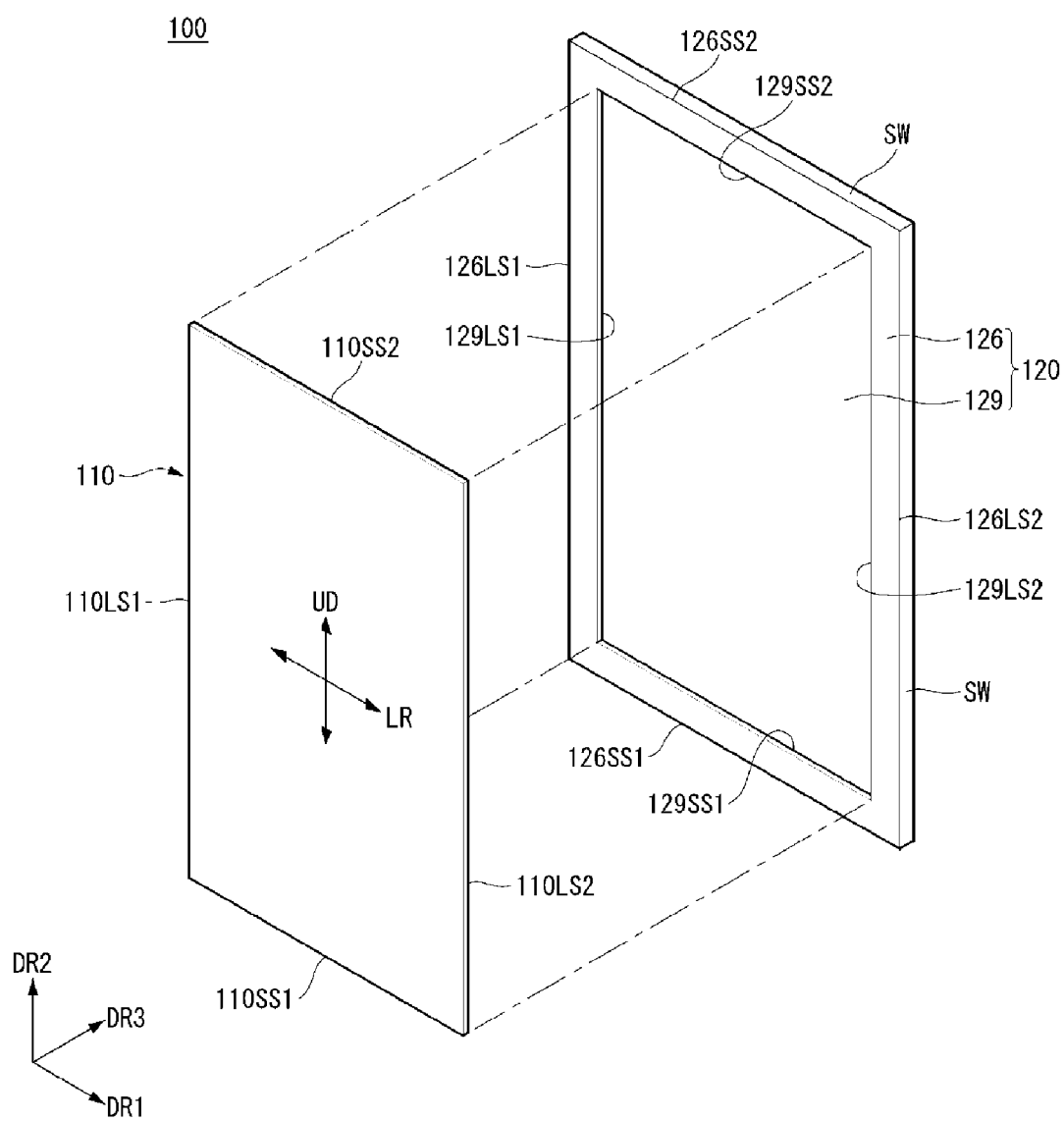
FIGS. 3 and 4 are views illustrating examples of the configuration of a display device according to an exemplary embodiment of the present invention.
Figure 4:
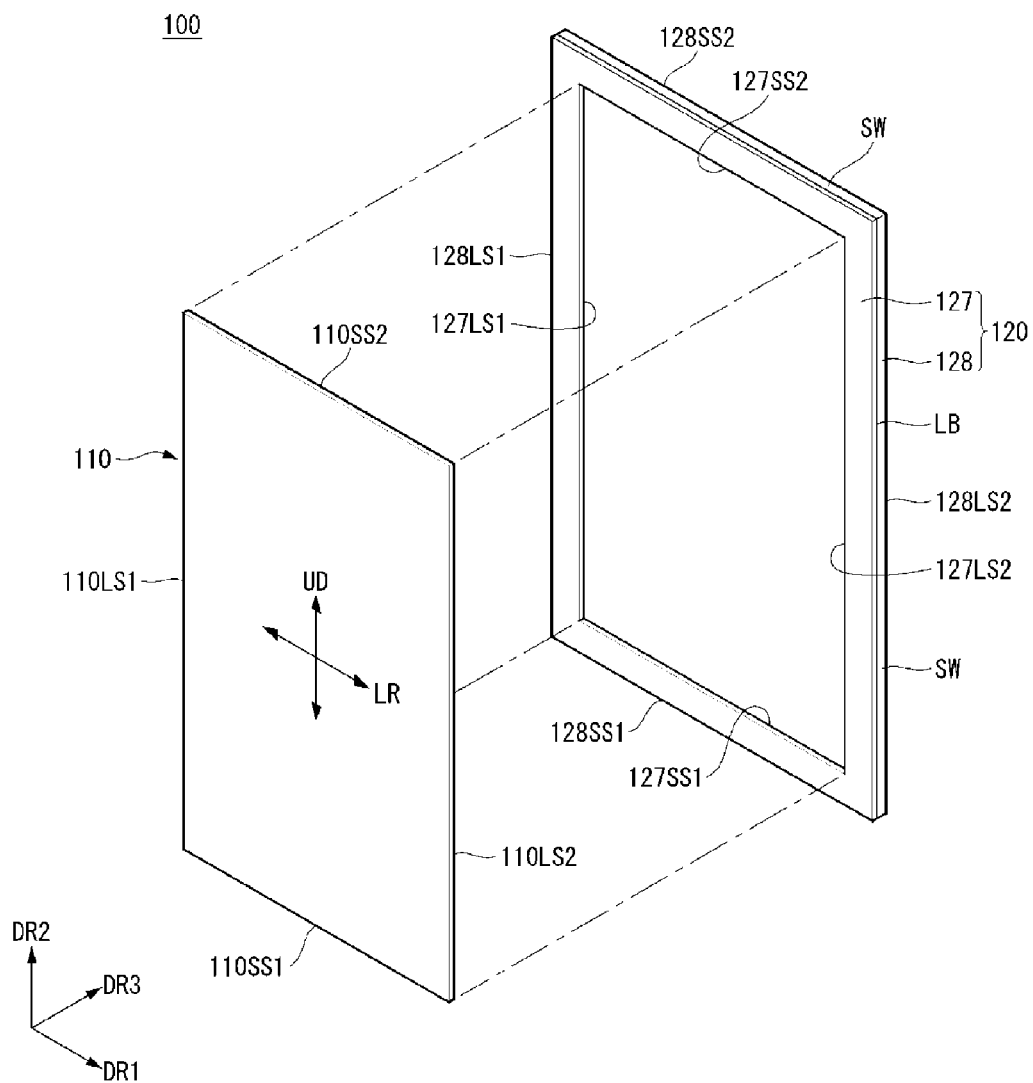

FIGS. 3 and 4 are views illustrating examples of the configuration of a display device according to an exemplary embodiment of the present invention.

Referring to FIG. 3, a surface of the display panel 110 may be visible at the front of the display device 100. A surface of the display panel 110 may display an image. The display panel 110 may be divided into an active area where an image is displayed and an inactive area where no image is displayed.

The display panel 110 may be positioned in front of the transparent body 120. The side or edge of the display panel 110 may be covered by the transparent body 120. The display panel 110 may be attached to the transparent body 120. The display panel 110 may be detachable from the transparent body 120. The display panel 110 may be flexible.

The display panel 110 may obtain a certain amount of rigidity from the transparent body 120.

The transparent body 120 may be divided into a transparent flange 126 facing or surrounding the side of the display panel 110 and a transparent board 129 facing or abutting the back side of the display panel 110. The transparent flange 126 and the transparent board 129 may be formed integrally.

The transparent board 129 may face the back side of the display panel 110. The transparent board 129 may correspond to the shape of the display panel 110. For example, a first long side 129LS1, second long side 129LS2, first short side 129SS1, and second short side 129SS2 of the transparent board 129 may correspond to a first long side 110LS1, second long side 110LS2, first short side 110SS1, and second short side 110SS2 of the display panel 110.

The side of the transparent board 129 may be covered by the transparent flange 126. For example, the first long side 129LS1, second long side 129LS2, first short side 129SS1, and second short side 129SS2 of the transparent board 129 may be positioned underneath or on the interior of the transparent body 120.

The transparent flange 126 may be shaped to cover a portion of the display panel 110. The transparent flange 126 may have sides corresponding to the sides of the transparent board 129. For example, a first long side 126LS1, second long side 126LS2, first short side 126SS1, and second short side 126SS2 of the transparent flange 126 may be adjacent or parallel to the first long side 129LS1, second long side 129LS2, first short side 129SS1, and second short side 129SS2 of the transparent board 129, respectively.

The transparent body 120 may have sidewalls SW. The sidewalls SW may be positioned on the first long side 126LS1, second long side 126LS2, first short side 126SS1, and second short side 126SS2 of the transparent flange 126.

The length of the first long side 110LS1 of the display panel 110 may be only slightly shorter than the length of the first long side 129LS1 of the transparent board 129. The length of the first short side 110SS1 of the display panel 110 may be only slightly shorter than the length of the first short side 129SS1 of the transparent board 129. The display panel 110 may be fixed to the transparent board 129. The display panel 110 may be attached to the transparent board 129 by magnetic force, adhesive, attachment members, or the like. The display panel 110 may be fitted to the transparent flange 126.

Referring to FIG. 4, the transparent frame 127 may be shaped to cover at least a portion of the display panel 110. The interior of the transparent frame 127 may have space for receiving a portion the display panel 110.

The shape of the interior of the transparent frame 127 may correspond to the shape of the display panel 110. For example, a first long side 127LS1, second long side 127LS2, first short side 127SS1, and second short side 127SS2 of the interior of the transparent frame 127 may correspond to the first long side 110LS1, second long side 110LS2, first short side 110SS1, and second short side 110SS2 of the display panel 110.

The transparent plate 128 may be positioned on the back side of the display panel 110. The transparent plate 128 may be positioned on the back side of the transparent frame 127. The transparent plate 128 may be attached to the transparent frame 127.

The sides on the exterior of the transparent plate 128 may correspond to the sides on the interior of the transparent frame 127. For example, a first long side 128LS1, second long side 128LS2, first short side 128SS1, and second short side 128SS2 of the transparent plate 128 may be formed adjacent to the first long side 127LS1, second long side 127LS2, first short side 127SS1, and second short side 127SS2 of the interior of the transparent frame 127, respectively.

The transparent body 120 may have sidewalls SW. The sidewalls SW may be positioned on the first long side 128LS1, second long side 128LS2, first short side 128SS1, and second short side 128SS2 of the transparent plate 128.

The length of the first long side 110LS1 of the display panel 110 may be only slightly shorter than the length of the first long side 127LS1 of the interior of the transparent frame 127. The length of the first short side 110SS1 of the display panel 110 may be only slightly shorter than the length of the first short side 127SS1 of the interior of the transparent frame 127. The display panel 110 may be fixed to the transparent plate 128. The display panel 110 may be attached to the transparent plate 128 by magnetic force, adhesive, attachment members, or the like. The display panel 110 may be fitted to the transparent frame 127.

Figure 5:
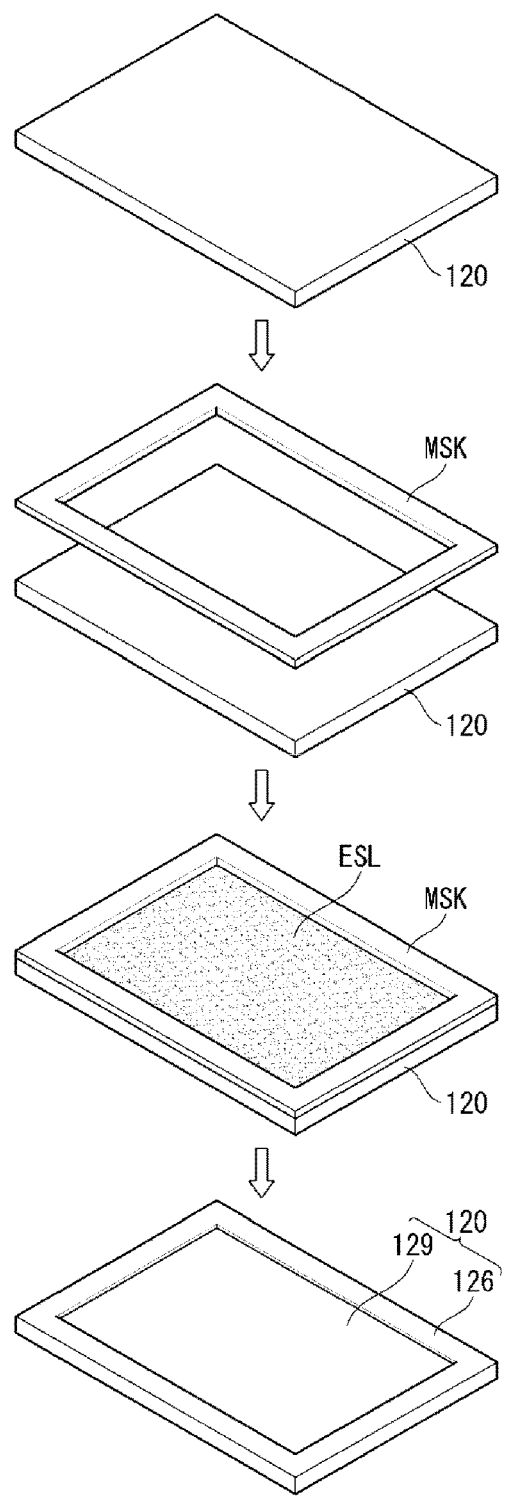
FIGS. 5 and 6 are views illustrating an example of a process for forming a transparent body of a display device according to an exemplary embodiment of the present invention.
Figure 6:
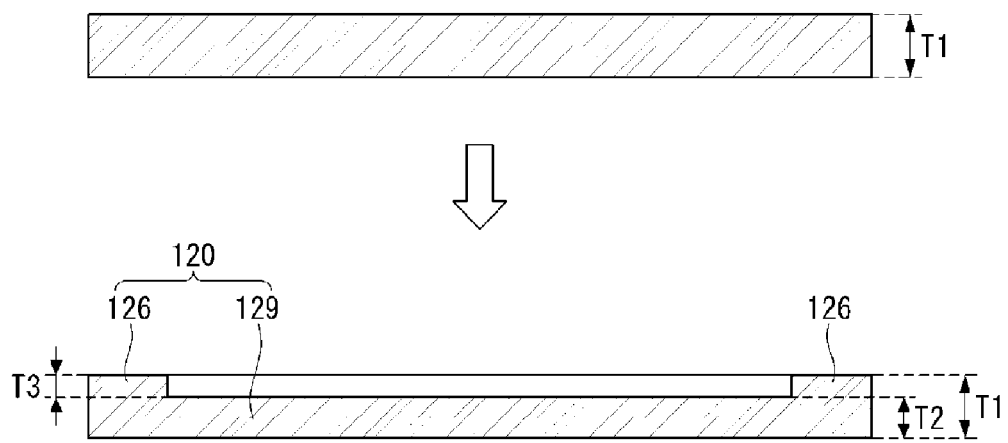

FIGS. 5 and 6 are views illustrating an example of a process for forming a transparent body of a display device according to an exemplary embodiment of the present invention.

Referring to FIG. 5, a slab-like, flat transparent body 120 may be prepared. The transparent body 120 may be made of transparent material. For example, the transparent body 120 may comprise glass. For example, the transparent body 120 may contain silicon dioxide. For example, the transparent body 120 may comprise plastic or other composite material.

The transparent body 120 may be made of semi-transparent material. For example, the transparent body 120 may comprise semi-transparent glass. Or, the transparent body 120 may comprise transparent material and semi-transparent material. For example, the transparent body 120 may be made of a transparent material containing an opaque/semi-transparent material. The transparent body 120 may have both a transparent region and a semi-transparent region, for example.

For instance, the transparent body 120 may pass at least a part of incident light through it or diffract, refract, or reflect it. For instance, the transparent body 120 may have a color.

A mask MSK may be placed on the slab-like transparent body 120. The mask MSK is of a certain height, and may be positioned on a surface of the transparent body 120. The mask MSK may be positioned on the transparent body 120, along the edge of a surface of the transparent body 120. The mask MSK, placed on the transparent body 120, may form a partially open space.

An etching solution ESL may be contained in the space formed by the mask MSK and the transparent body 120. The etching solution ESL may chemically etch the space part of the transparent body 120. The etching solution ESL may contain hydrofluoric acid, for example. The mask MSK may protect the corresponding portions of the transparent body 120 from the etching solution ESL since it has tolerance to the etching solution ESL.

Although not shown, the transparent body 120 may be etched by plasma etching, for example. When a plasma is applied towards a surface of the transparent body 120 while the mask MSK is mounted on the transparent body 120, the part of the transparent body 120 that is exposed to the plasma may be etched. The mask MSK may protect the transparent body 120 from the plasma since it has tolerance to plasma. The plasma may be atmospheric plasma, for example.

After the etching, the mask MSK may be removed from the transparent body 120. The slab-like transparent body 120 may have a stepped portion after the etching. The part which had been facing the mask MSK may be the transparent flange 126. The part that is exposed to and etched with the etching solution ESL may be the transparent board 129. Due to the etching, the transparent flange 126 may be thicker than the transparent board 129.

Referring to FIG. 6, a cross-section of the slab-like, flat transparent body 120 may be depicted. The thickness of the slab-like transparent body 120 may be T1. Part of a surface of the slab-like transparent body 120 may be exposed to an etching solution as discussed above.

The part of the transparent body 120 that is exposed to an etching solution may be the portion of the transparent board 129 with a thickness T2. The part of the transparent body 120 that is protected from the etching may be the transparent flange 126 with the thickness T1. The thickness T2 may be smaller than the thickness T1.

The stepped portion formed between the transparent flange 126 and the transparent board 129 may have a thickness T3. The thickness 3 may correspond to the thickness of the display panel. For example, the thickness T3 may be slightly larger than the thickness of the display panel.

Figure 7:
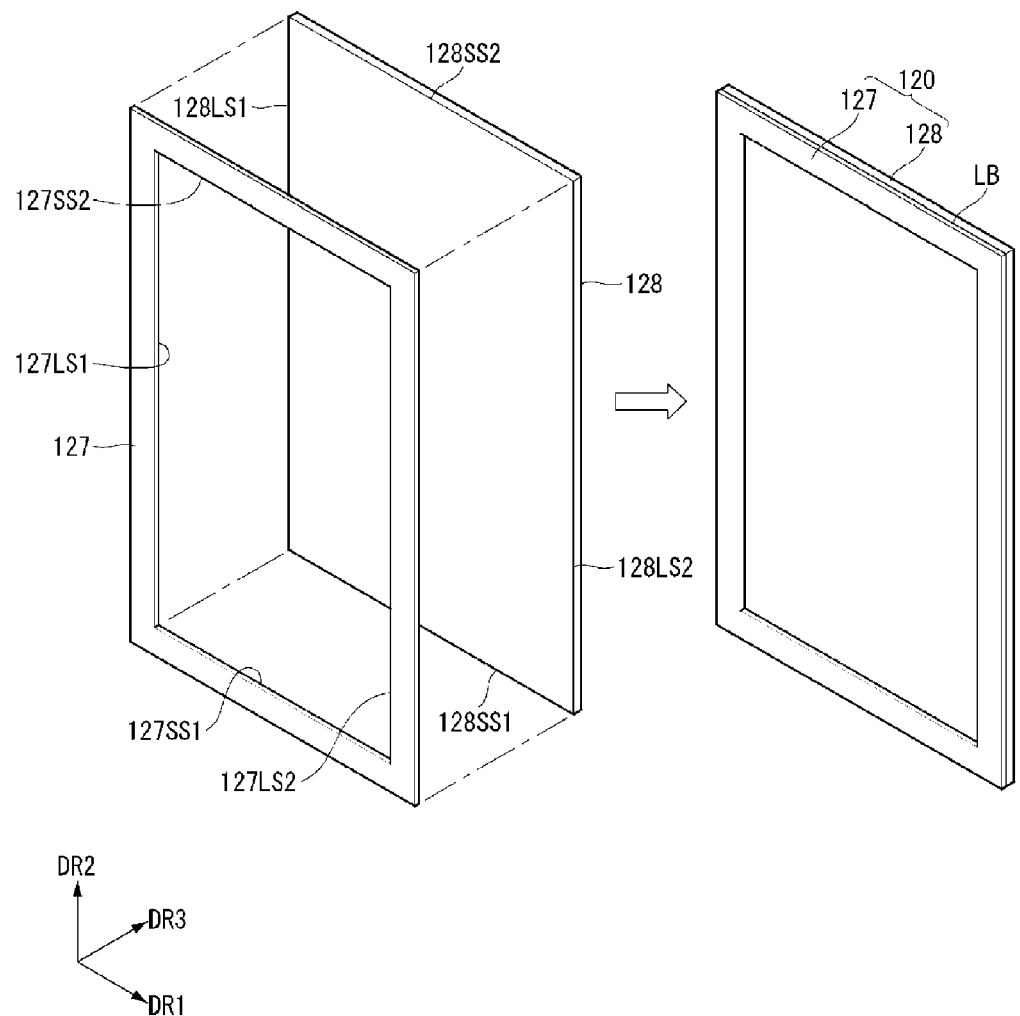
FIGS. 7 and 8 are views illustrating another example of a process for forming a transparent body of a display device according to an exemplary embodiment of the present invention.
Figure 8:
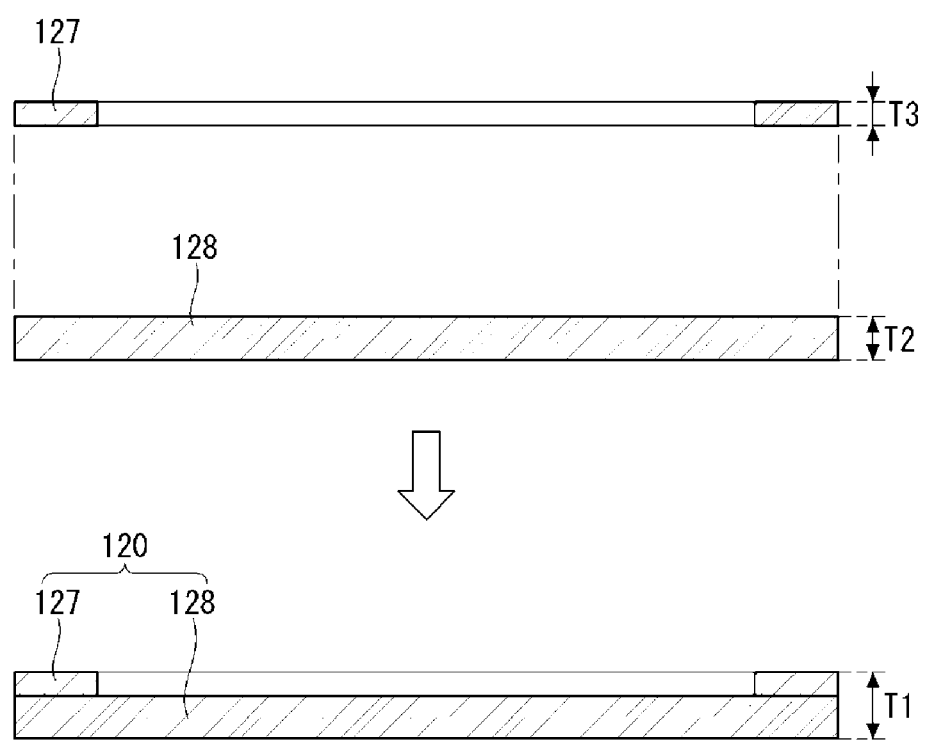

FIGS. 7 and 8 are views illustrating another example of a process for forming a transparent body of a display device according to an exemplary embodiment of the present invention.

Referring to FIG. 7, a slab-like, flat transparent plate 128 may be prepared. The transparent plate 128 may be made of transparent material. For instance, the transparent plate 128 may pass at least a part of incident light through it. For instance, the transparent plate 128 may have a color. For instance, the transparent plate 128 may contain at least one among glass, plastic, crystal, and quartz. The transparent plate 128 may be made of semi-transparent material. For instance, the transparent plate 128 may diffusely reflect light because its outer surface is rough.

The transparent plate 128 may comprise fiber in order to add rigidity. For example, the transparent plate 128 may comprise at least one among glass fiber, carbon fiber, metallic wire, and metallic fiber. The transparent plate 128 may comprise microfiber.

The transparent frame 127 may be affixed to a surface of the transparent plate 128. The transparent frame 127 may be made of transparent material. The transparent frame 127 may be made of the same material as the transparent plate 128.

For instance, the transparent frame 127 may be made of a different material from the transparent plate 128. For instance, the transparent frame 127 and the transparent plate 128 may differ in color, transparency, reflectivity, or refractive index. For instance, the transparent frame 127 may have different rigidity than the transparent plate 128. For instance, the transparent frame 127 may have a different outline shape from the transparent plate 128.

A boundary line LB may be formed by attaching the transparent frame 127 to the transparent plate 128. The boundary line LB may be formed along the outer edge of the transparent body 120. The boundary line LB may indicate the boundary between the transparent plate 128 and the transparent frame 127.

Referring to FIG. 8, a cross-section of the slab-like, flat transparent plate 128 may be depicted. The thickness of the slab-like transparent plate 128 may be T2. The transparent frame 127 may be affixed to a surface of the transparent plate 128. For instance, the transparent frame 127 may be attached to the transparent plate 128 with an adhesive, attachment members, magnetic force, or the like. For instance, the transparent frame 127 may be attached to the transparent plate 128 by heat. For instance, the transparent frame 127 may be attached to the transparent plate 128 by pressure. For instance, the transparent frame 127 may be attached to the transparent plate 128 by using fritted glass or fritted glaze.

The transparent frame 127 may have a thickness T3. The transparent frame 127 may be surface-treated so that the transparent frame 127 can be affixed easily to the transparent plate 128. Alternatively, at least a part of a surface of the transparent plate 128 may be surface-treated so that it can be affixed easily to the transparent frame 127.

Once the transparent frame 127 is attached to the transparent plate 128, a stepped portion may be formed on a surface of the transparent body 120. The stepped portion formed on a surface of the transparent body 120 may have a thickness T3. The thickness T3 may correspond to the thickness of the display panel. For example, the thickness T3 may be slightly larger than the thickness of the display panel. The transparent body 120 may have a thickness T1 at one point. The thickness T1 may be the largest one among the thicknesses at different points on the transparent body 120.

FIGS. 9 to 31 are views illustrating examples of a transparent body according to an exemplary embodiment of the present invention. In what follows, the term "PCB receiving portion" may be referred to as "first receiving portion". In what follows, the term "cable receiving portion" may be referred to as "second receiving portion".

Figure 9:
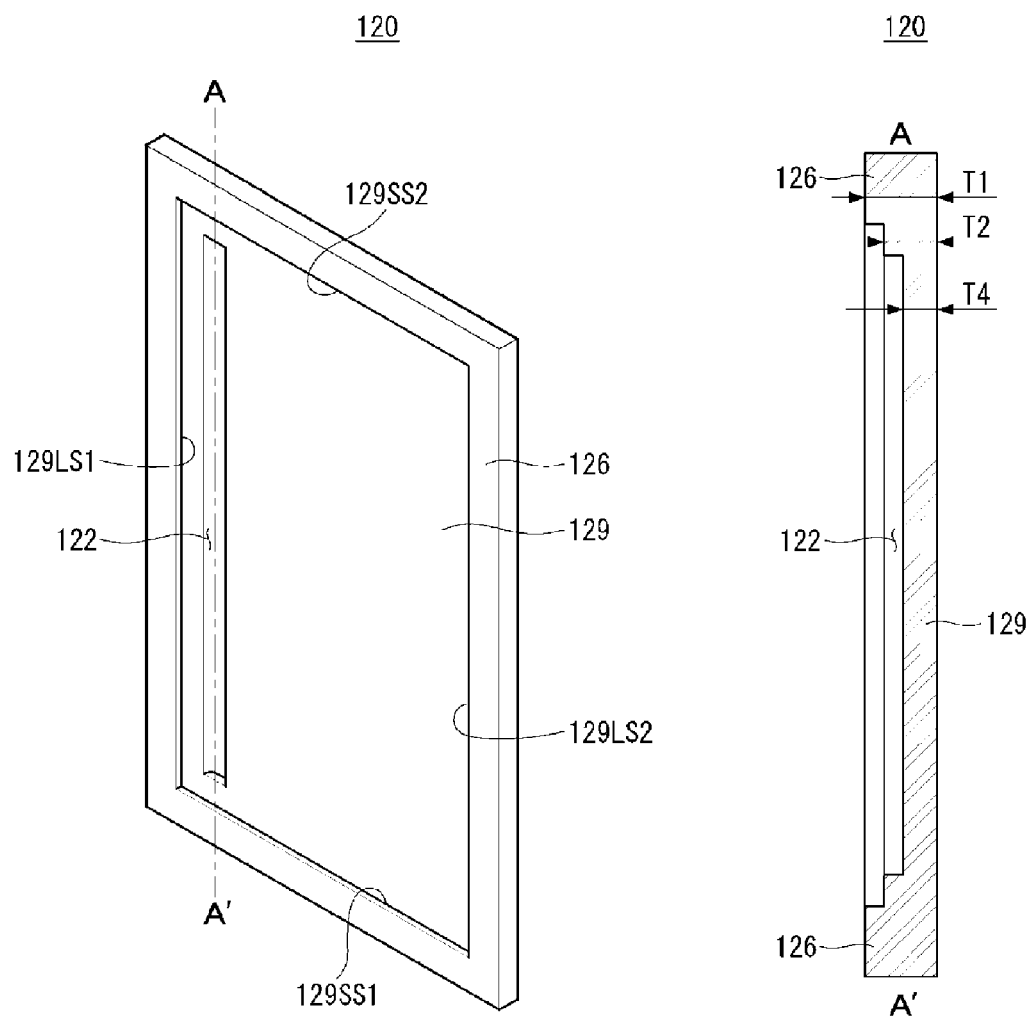
FIGS. 9, 10, 11, 12, 13, 14, 15, 16, 17, 18, 19, 20, 21, 22, 23, 24, 25, 26, 27, 28, 29, 30, and 31 are views illustrating examples of a transparent body according to an exemplary embodiment of the present invention.

Referring to the embodiment shown in FIG. 9, a PCB receiving portion 122 may be formed on a surface of the transparent body 120. For example, the PCB receiving portion 122 may be formed on a surface of the transparent board 129. The PCB receiving portion 122 may be visible on the front of the transparent body 120. The PCB receiving portion 122 may be formed in a direction from the first short side 129SS1 of the transparent board 129 towards the second short side 129SS2. The PCB receiving portion 122 may be formed adjacent to either the first long side 129LS1 or second long side 129LS2 of the transparent board 129. For example, the PCB receiving portion 122 may be formed adjacent to the first long side 129LS1 of the transparent board 129.

The PCB receiving portion 122 may be formed by physical action. For example, the PCB receiving portion 122 may be formed by cutting the transparent board 129 using a tool with higher rigidity than the transparent board 129. The PCB receiving portion 122 may be formed by chemical action. For example, the PCB receiving portion 122 may be formed by reacting with a chemical acting on the transparent board 129. The PCB receiving portion 122 may also be formed at the time the transparent board 129 is created, for example in injection molding or extrusion processes, the creation of the board may include a design for the PCB receiving portion.

The PCB receiving portion 122 may receive at least a part of the PCB connected to the display panel. The PCB receiving portion 122 may correspond to the shape of the PCB connected to the display panel. The PCB receiving portion 122 may be shaped like a groove.

Referring to a cross-section taken along the line A-A' parallel to the length of the PCB receiving portion 122, the transparent flange 126 may have a thickness T1. The transparent board 129 may have a thickness T2. T2 may be smaller than T1. The thickness T1 may be the thickness of the outer edge of the transparent body 120.

The transparent board 129 may have a thickness T4 in the part where the PCB receiving portion 122 is formed. The transparent board 129 may be divided into a part for the PCB receiving portion 122 and the remaining part. The part for the PCB receiving portion 122 may be thinner than the remaining part. T4 may be smaller than T2.

Figure 10:
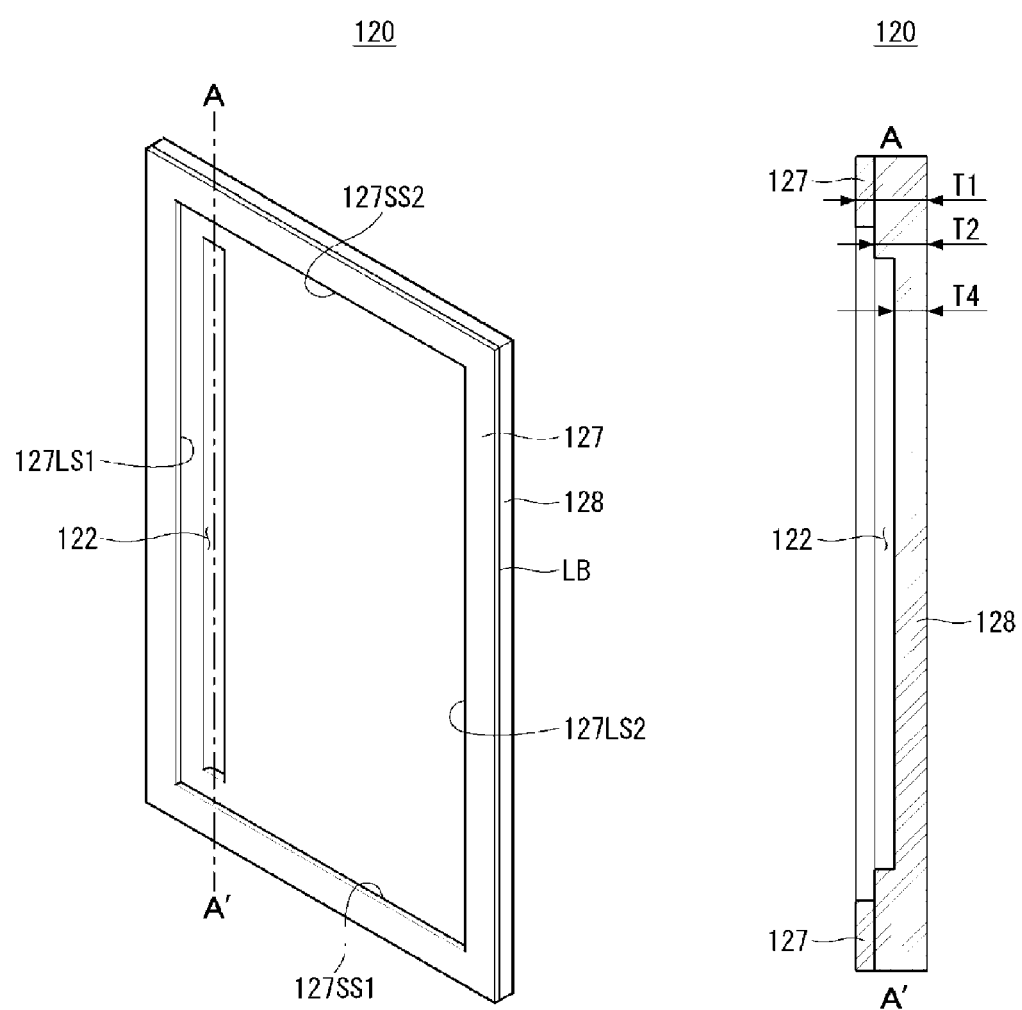

Referring to the embodiment shown in FIG. 10, the PCB receiving portion 122 may be formed at a surface of the transparent body 120. The PCB receiving portion 122 may disposed at the front of the transparent body 120. The PCB receiving portion 122 may be formed at a surface of the transparent plate 128. The PCB receiving portion 122 may be formed adjacent to either the first long side 127LS1 or second long side 127LS2 of the interior of the transparent frame 127. For example, the PCB receiving portion 122 may be formed adjacent to the first long side 127LS1 of the interior of the transparent frame 127. The PCB receiving portion 122 may be formed in a direction from the first short side 127SS1 of the interior of the transparent frame 127 towards the second short side 127SS2.

The PCB receiving portion 122 may be positioned within the area defined by the interior sides of the transparent frame 127. For example, the PCB receiving portion 122 may be formed within the area defined by the first long side 127LS1, second long side 127LS2, first short side 127SS1, and second short side 127SS2 of the interior of the transparent frame 127.

The PCB receiving portion 122 may be formed by physical action. For example, the PCB receiving portion 122 may be formed by cutting the transparent plate 128 using a tool with higher rigidity than the transparent plate 128. The PCB receiving portion 122 may be formed by chemical action. For example, the PCB receiving portion 122 may be formed by reacting with a chemical acting on the transparent plate 128. The PCB receiving portion 122 may also be formed at the time the transparent plate 128 is created, for example in injection molding or extrusion processes, the creation of the board may include a design for the PCB receiving portion.

The PCB receiving portion 122 may face the front. The PCB receiving portion 122 may receive at least a part of the PCB connected to the display panel. The PCB receiving portion 122 may be shaped like a groove.

Referring to a cross-section taken along the line A-A' parallel to the length of the PCB receiving portion 122, the transparent plate 128 may have a thickness T4 at one point on the part where the PCB receiving portion 122 is formed. The transparent plate 128 may have a thickness T2 at a point where the PCB receiving portion 122 is not formed. The outer edge of the transparent body 120 may have a thickness T1.

Figure 11:
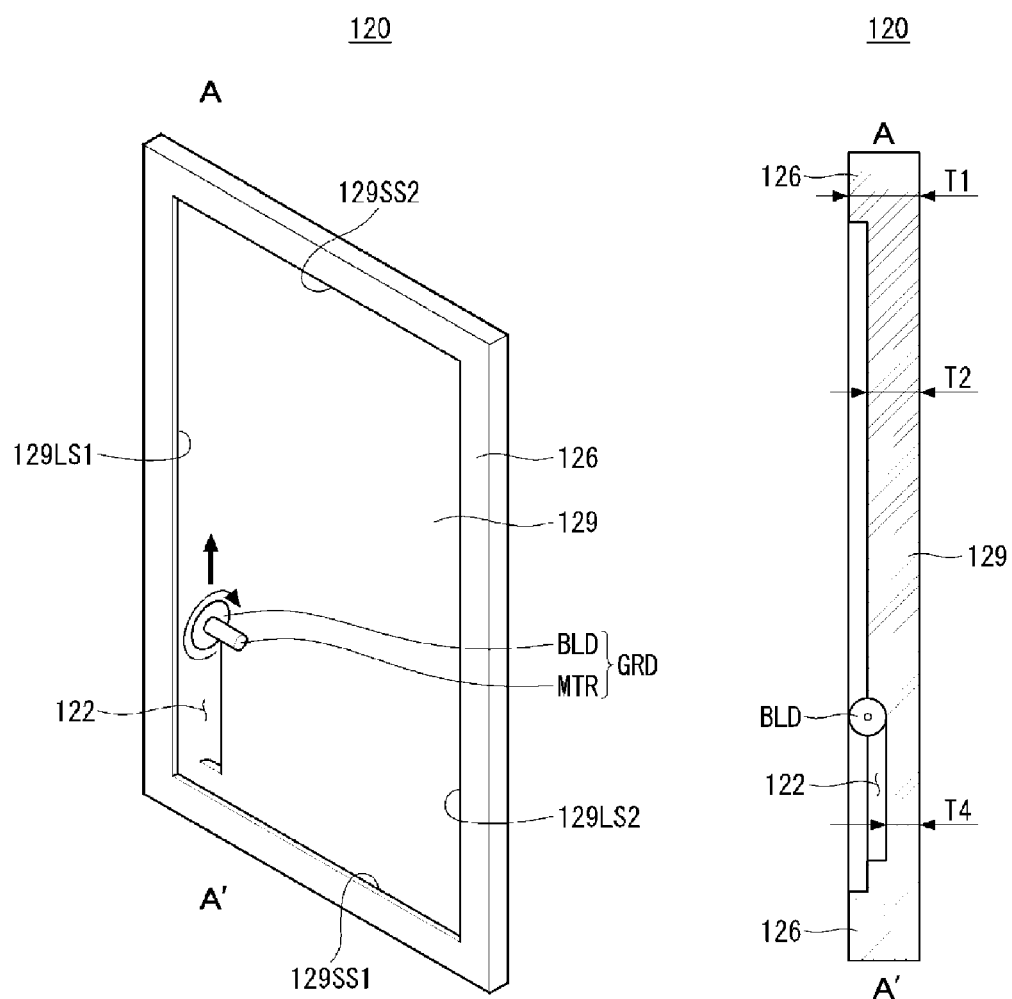

Referring to the embodiment shown in FIG. 11, a grinder GRD may form a groove on a surface of the transparent body 120 in an example of another process. For example, the PCB receiving portion 122 may be formed by the grinder GRD. Although not shown, the grinder GRD may form a hole on a surface of the transparent body 120.

The grinder GRD may comprise a blade BLD. The blade BLD may have higher rigidity than the transparent body 120. The blade BLD may rotate. The blade BLD may be connected to a motor MTR and receive torque. The blade BLD may form a groove by applying torque to a surface of the transparent board 129.

Referring to a cross-section taken along the line A-A' parallel to the length of the PCB receiving portion 122, the blade BLD may reduce the thickness of the transparent board 129. The transparent board 129 may have a thickness T2 in the part where the blade BLD is not applied. The transparent board 129 may have a thickness T4 in the part where the blade BLD is applied. T4 may be smaller than T2.

Figure 12:
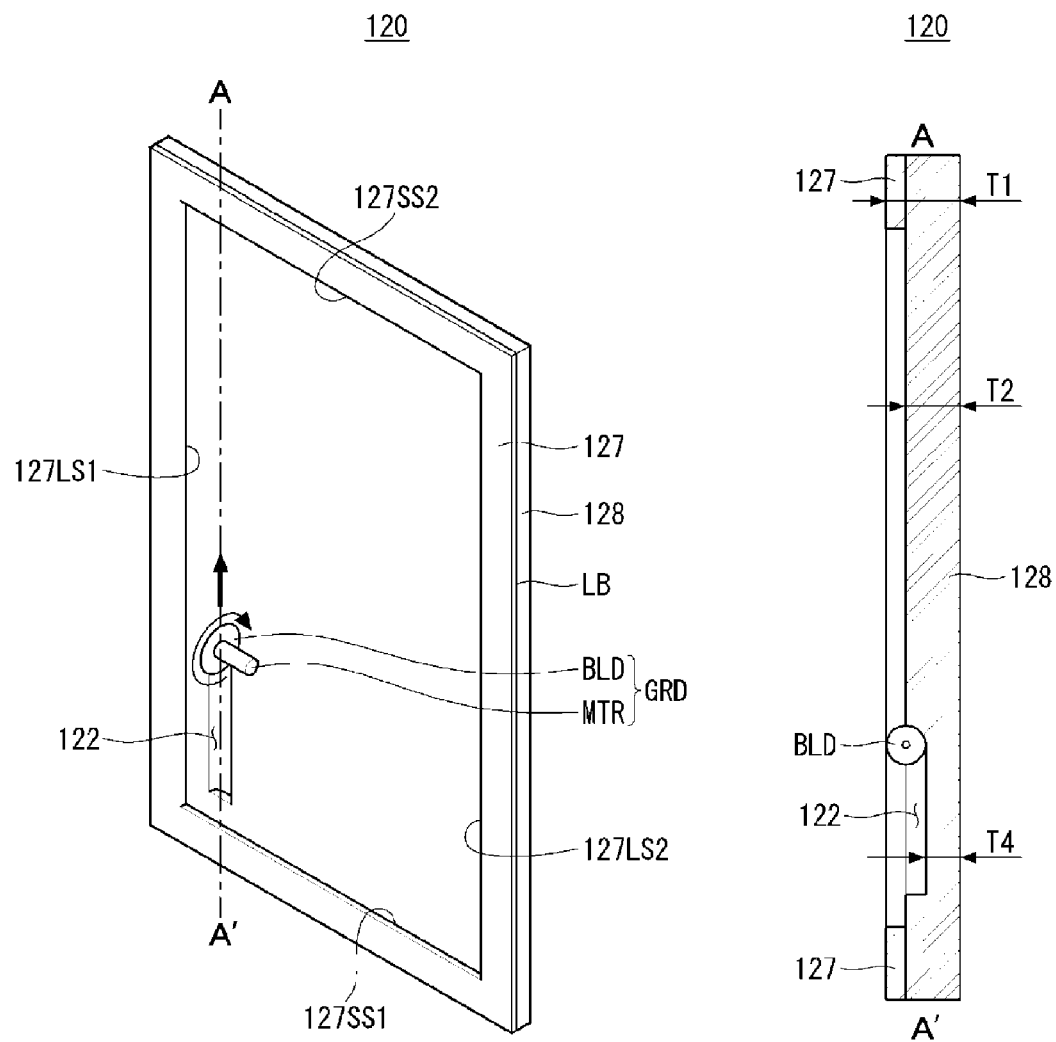

Referring to the embodiment shown in FIG. 12, a grinder GRD may form a groove on a surface of the transparent body 120. For example, the PCB receiving portion 122 may be formed on a surface of the transparent plate 128 by the grinder GRD. Although not shown, the grinder GRD may form a hole on a surface of the transparent body 120.

The grinder GRD may comprise a blade BLD. The blade BLD may have higher rigidity than the transparent plate 128. The blade BLD may receive torque from the motor MTR and transfer it to the transparent plate 128.

Referring to a cross-section taken along the line A-A' parallel to the length of the PCB receiving portion 122, the blade BLD may reduce the thickness of the transparent plate 128. The transparent plate 128 may have a thickness T4 at one point on the part that is cut by a torque applied from the blade BLD. The transparent plate 128 may have a thickness T2 at one point on the area where the blade BLD is not applied. T4 may be smaller than T2.

Figure 13:
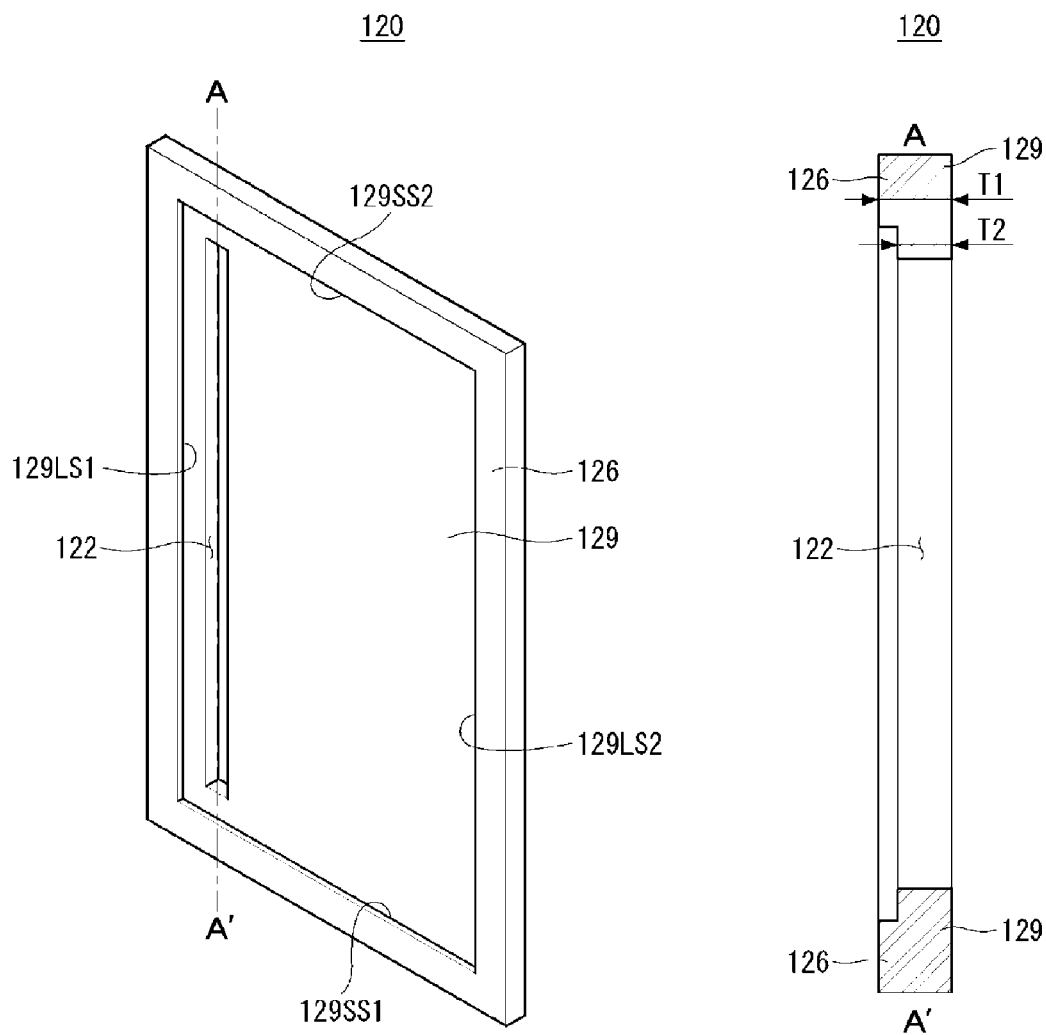

Referring to the embodiment shown in FIG. 13, the PCB receiving portion 122 may be disposed at the front of the transparent body 120. Alternatively, the PCB receiving portion 122 may be disposed at the front of the transparent board 129. The PCB receiving portion 122 may be a hole formed at a surface of the transparent board 129.

The PCB receiving portion 122 may be formed adjacent to the first long side 129LS1 of the transparent board 129. The PCB receiving portion 122 may be formed in a direction from the first short side 129SS1 of the transparent board 129 towards the second short side 129SS2. The PCB receiving portion 122 may be formed by physical processing. For example, the PCB receiving portion 122 may be formed by a grinder. The PCB receiving portion 122 may be formed by chemical processing. For example, the PCB receiving portion 122 may be formed by applying an etching solution to the transparent board 129. The PCB receiving portion 122 may also be formed at the time the transparent board 129 is created, for example in injection molding or extrusion processes, the creation of the board may include a design for the PCB receiving portion.

Referring to a cross-section taken along the line A-A' parallel to the length of the PCB receiving portion 122, the part where the PCB receiving portion 122 is formed may serve as a path through which the front and back of the transparent board 129 communicate with each other.

Figure 14:
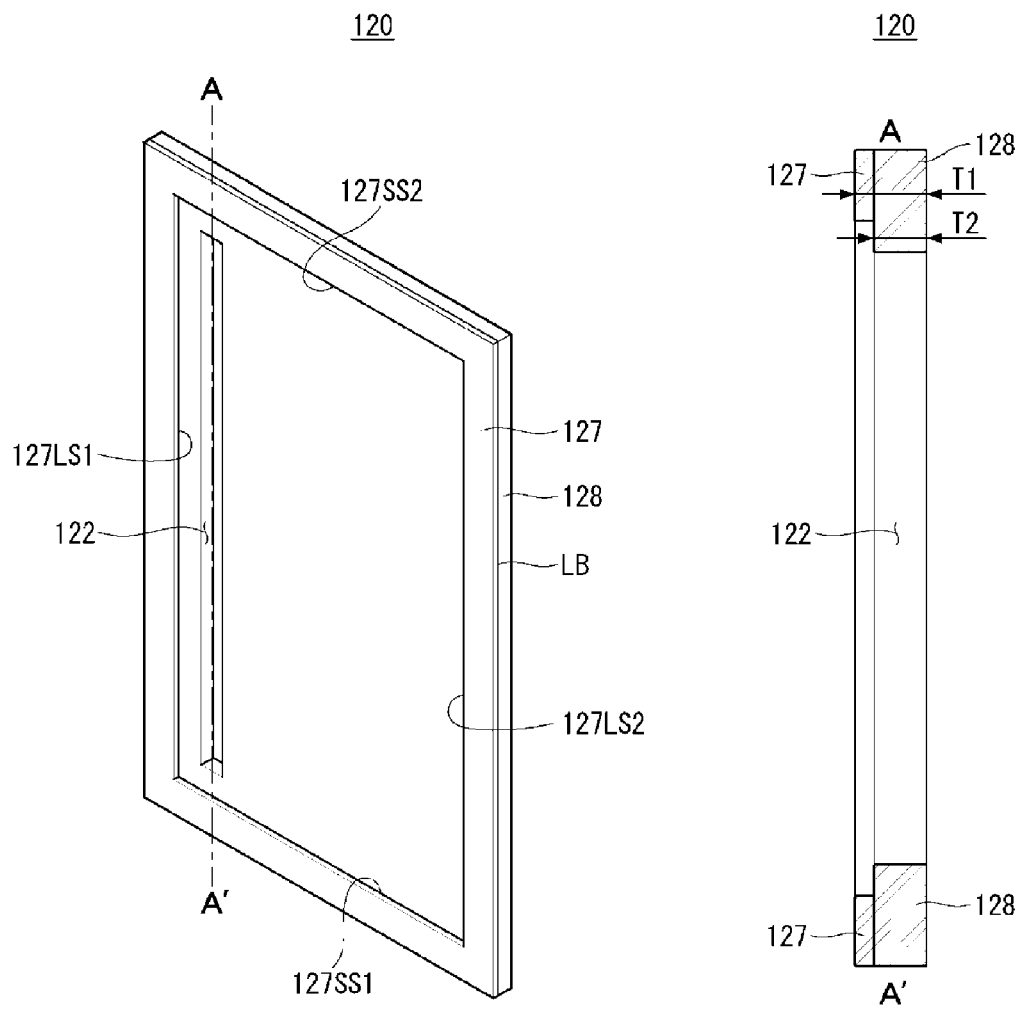

Referring to the embodiment shown in FIG. 14, the PCB receiving portion 122 may be disposed at the front of the transparent plate 128. The PCB receiving portion 122 may be a hole formed on a surface of the transparent plate 128.

The PCB receiving portion 122 may be formed adjacent to the first long side 127LS1 of the interior of the transparent frame 127. The PCB receiving portion 122 may be formed in a direction from the first short side 127SS1 of the interior of the transparent frame 127 towards the second short side 127SS2. The PCB receiving portion 122 may be formed by physical processing. For example, the PCB receiving portion 122 may be formed by NC processing (or numerical control work). The PCB receiving portion 122 may be formed by chemical processing. For example, the PCB receiving portion 122 may be formed by applying an etching solution or plasma to the transparent plate 128.

Referring to a cross-section taken along the line A-A' that is parallel to the length of the PCB receiving portion 122 and passes through the PCB receiving portion 122 of FIG. 14, in one embodiment the PCB receiving portion 122 may extend all the way through the transparent plate 128 to define an opening.

Figure 15:
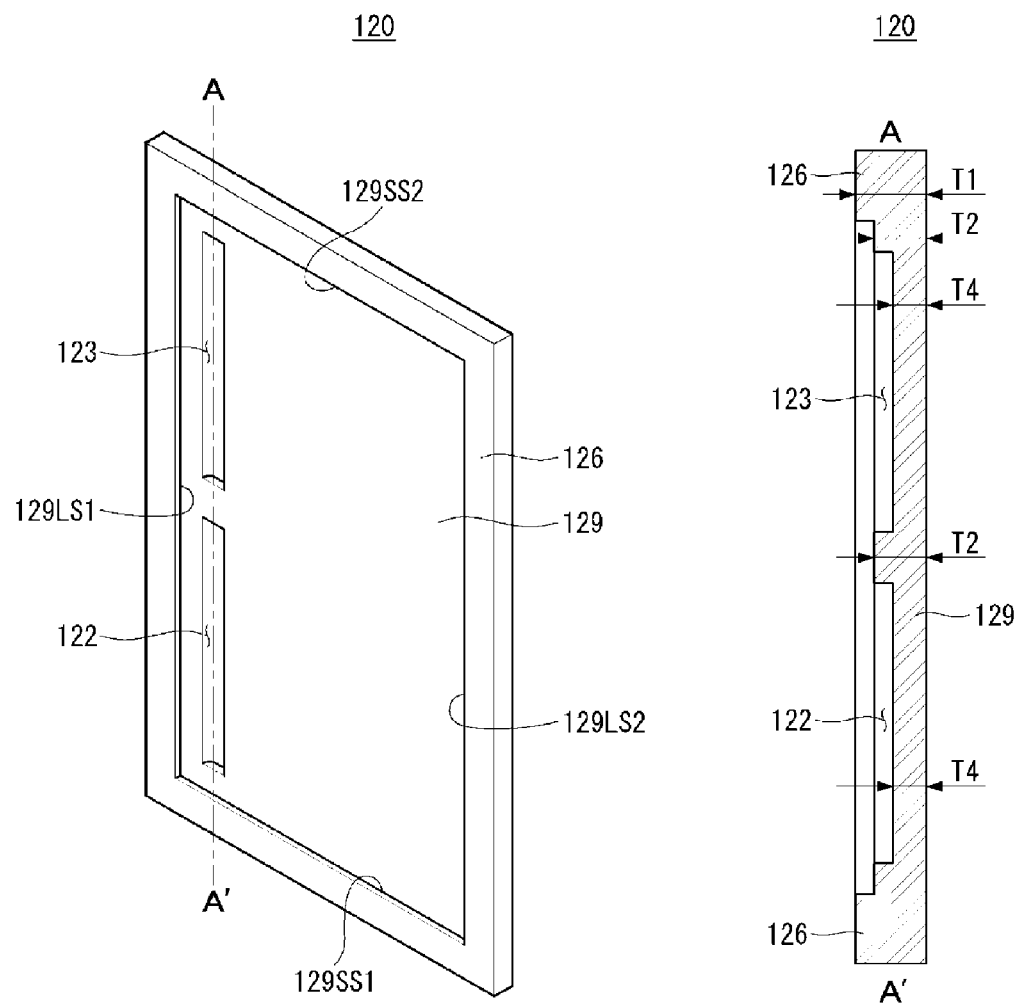

Referring to another embodiment shown in FIG. 15, the PCB receiving portion may comprise two receiving portions 122 and 123 which are disposed at the front of the transparent board 129. The PCB receiving portion 122 and 123 may be shaped like a groove formed on the transparent board 129. The PCB receiving portion 122 and 123 may be provided in multiple units. For example, the PCB receiving portion 122 and 123 may comprise a first PCB receiving portion 122 and a second PCB receiving portion 123.

The first PCB receiving portion 122 and the second PCB receiving portion 123 may be arranged in series. The first PCB receiving portion 122 and the second PCB receiving portion 123 may be aligned and arranged lengthwise in a single row. The first PCB receiving portion 122 and the second PCB receiving portion 123 may be formed adjacent to the first long side 129LS1 of the transparent board 129. The first PCB receiving portion 122 and the second PCB receiving portion 123 may be sequentially arranged in a direction from the first short side 129SS1 of the transparent board 129 towards the second short side 129SS2.

Referring to a cross-section taken along the line A-A' that passes through the PCB receiving portion 122 and 123 along the length of the PCB receiving portion 122 and 123 of FIG. 15, the transparent board 129 may have a thickness T4 at one point on the part where the PCB receiving portion 122 or 123 is formed. The thickness of the transparent board 129 at one point on the part where the first PCB receiving portion 122 is formed may be the same as or different from the thickness of the transparent board 129 at one point on the part where the second PCB receiving portion 123 is formed.

The PCB receiving portion 122 and 123 may be formed on a surface of the transparent board 129 by a physical method or/and a chemical method. For example, the PCB receiving portion 122 and 123 may be formed by a laser, or other methods as discussed above with respect to other embodiments.

Figure 16:
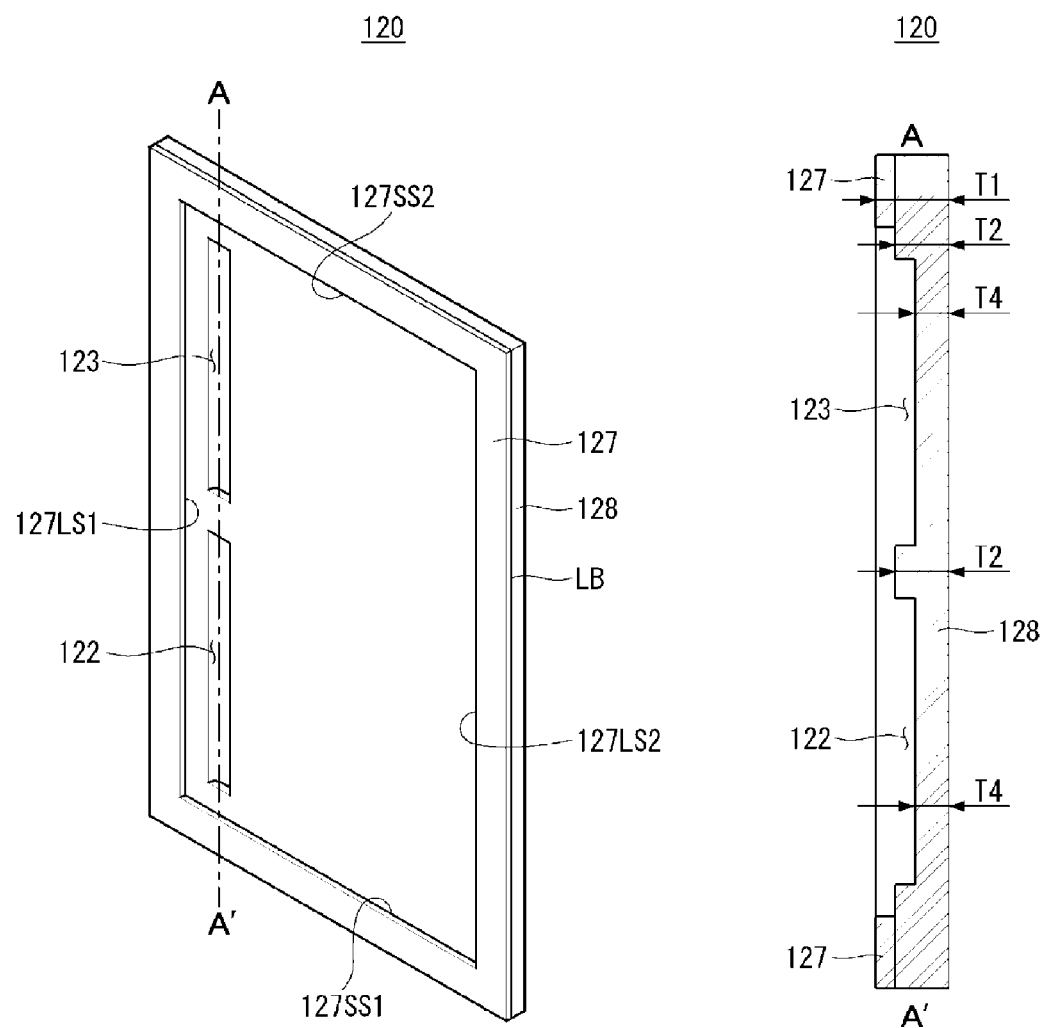

Referring to another embodiment shown in FIG. 16, the PCB receiving portion 122 and 123 may comprise two receiving portions disposed at the front of the transparent plate 128. The PCB receiving portion 122 and 123 may be shaped like a groove formed on the transparent plate 128. The PCB receiving portion 122 and 123 may be provided in multiple units. For example, the PCB receiving portion 122 and 123 may comprise a first PCB receiving portion 122 and a second PCB receiving portion 123.

The first PCB receiving portion 122 and the second PCB receiving portion 123 may be arranged parallel to each other. The length of the first PCB receiving portion 122 may be parallel to the length of the second PCB receiving portion 123. The first PCB receiving portion 122 and the second PCB receiving portion 123 may be formed adjacent to the first long side 127LS1 of the interior of the transparent frame 127. The first PCB receiving portion 122 and the second PCB receiving portion 123 may be aligned and arranged parallel to a direction from the first short side 127SS1 of the interior of the transparent frame 127 towards the second short side 127SS2.

Referring to a cross-section taken along the line A-A' that is parallel to the length of the PCB receiving portion 122 and 123 and passes through the PCB receiving portion 122 and 123 of FIG. 16, the transparent plate 128 may have a thickness T4 at one point on the part where the PCB receiving portion 122 or 123 is formed. The thickness of the transparent plate 128 at one point on the part where the first PCB receiving portion 122 is formed may be the same as or different from the thickness of the transparent plate 128 at one point on the part where the second PCB receiving portion 123 is formed.

The PCB receiving portion 122 and 123 may be formed on a surface of the transparent plate 128 by a physical method or/and a chemical method. For example, the PCB receiving portion 122 and 123 may be formed by a laser, or other methods as discussed above with respect to other embodiments.

Figure 17:
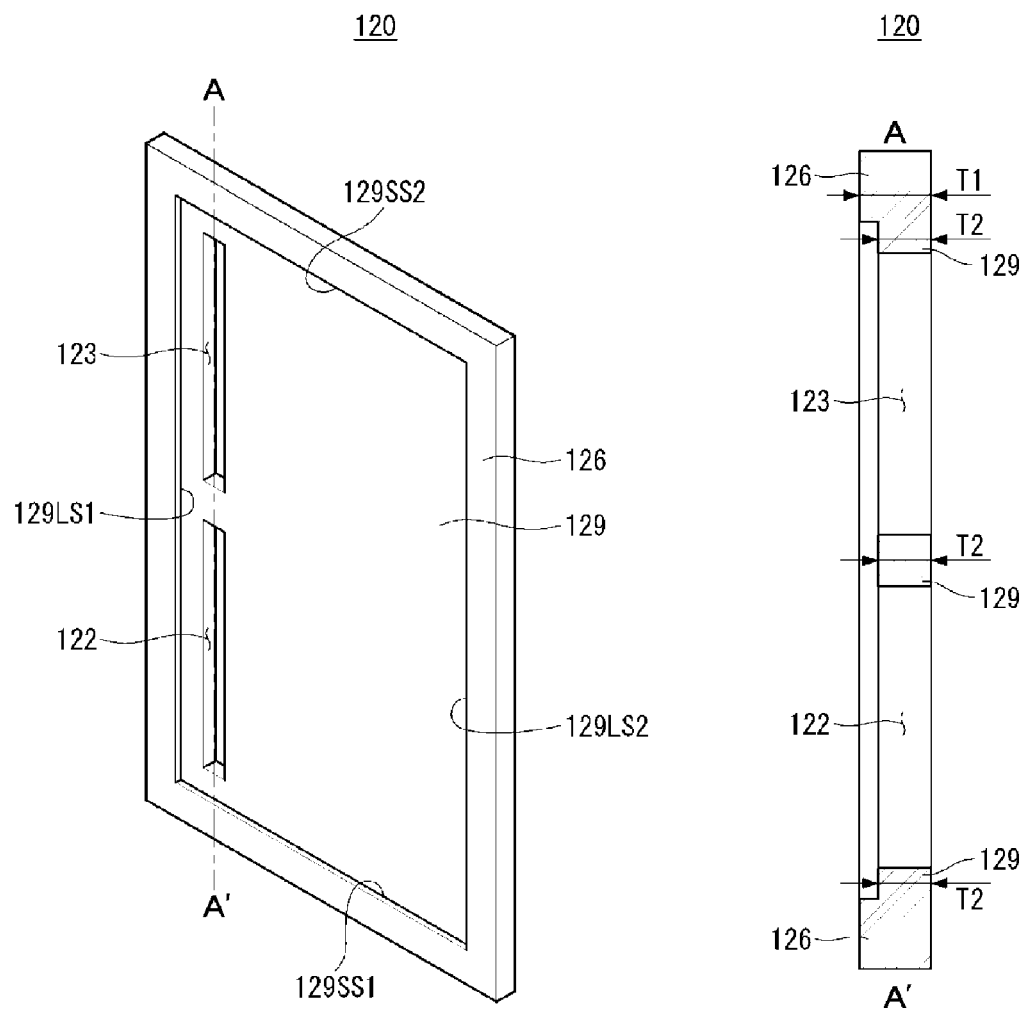

Referring to another embodiment shown in FIG. 17, the PCB receiving portion may comprise two receiving portions 122 and 123 disposed at the front of the transparent board 129. The PCB receiving portion 122 and 123 may be shaped like a groove formed on the transparent board 129. The PCB receiving portion 122 and 123 may be provided in multiple units. For example, the PCB receiving portion 122 and 123 may comprise a first PCB receiving portion 122 and a second PCB receiving portion 123.

The first PCB receiving portion 122 and the second PCB receiving portion 123 may be arranged parallel to each other. The length of the first PCB receiving portion 122 may be parallel to the length of the second PCB receiving portion 123. The first PCB receiving portion 122 and the second PCB receiving portion 123 may be formed adjacent to the first long side 129LS1 of the transparent board 129. The first PCB receiving portion 122 and the second PCB receiving portion 123 may be aligned and arranged parallel to a direction from the first short side 129SS1 of the transparent board 129 towards the second short side 129SS2.

Referring to a cross-section taken along the line A-A' that is parallel to the length of the PCB receiving portion 122 and 123 and passes through the PCB receiving portion 122 and 123 of FIG. 17, the one or more of the PCB receiving portions 122 and 123 may extend all the way through the transparent board 129 to define one or more corresponding openings.

The PCB receiving portion 122 and 123 may be formed on a surface of the transparent board 129 by an optical method. For example, the PCB receiving portion 122 and 123 may be formed by a carbon dioxide laser, or other methods as discussed above with respect to other embodiments.

Figure 18:
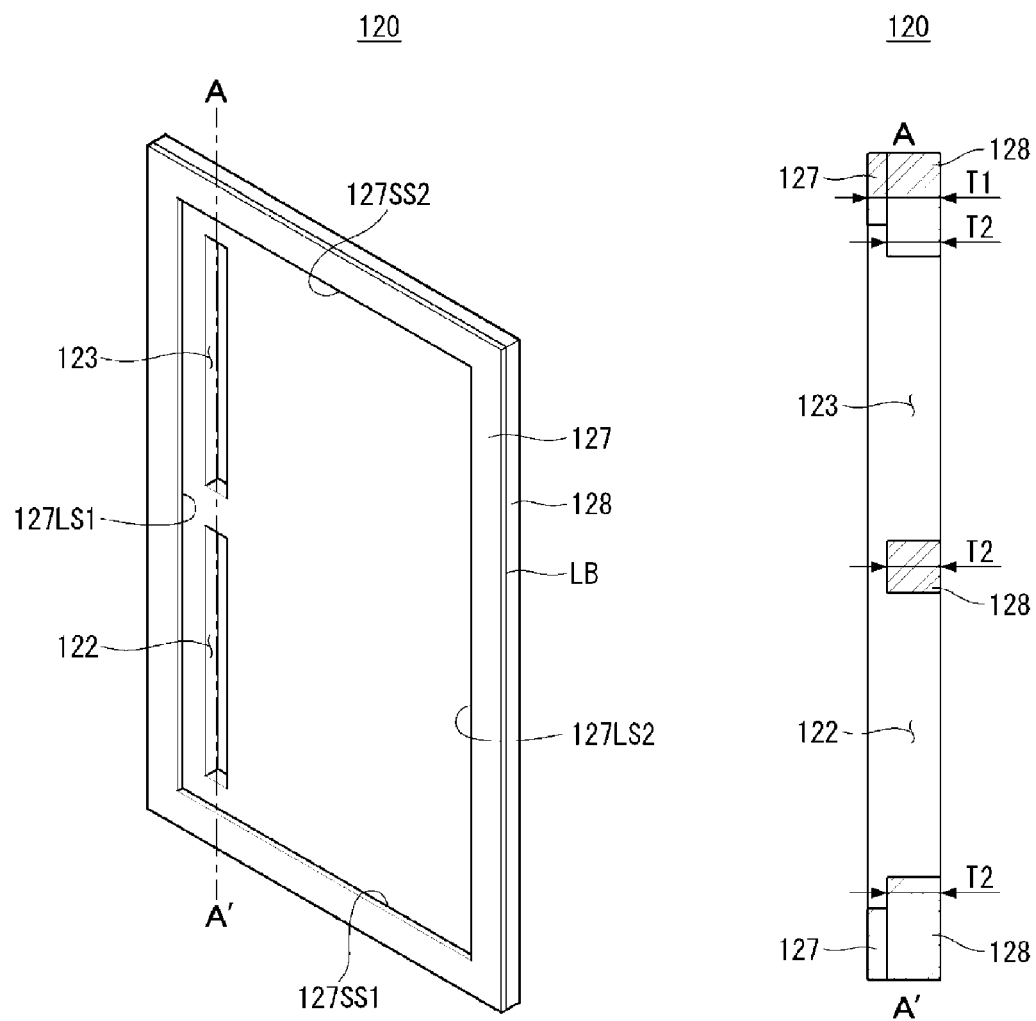

Referring to another embodiment shown in FIG. 18, the PCB receiving portion may comprise two receiving portions 122 and 123 disposed at the front of the transparent plate 128. The PCB receiving portion 122 and 123 may be shaped like a groove formed on the transparent plate 128. The PCB receiving portion 122 and 123 may be provided in multiple units. For example, the PCB receiving portion 122 and 123 may comprise a first PCB receiving portion 122 and a second PCB receiving portion 123.

The first PCB receiving portion 122 and the second PCB receiving portion 123 may be arranged parallel to each other. The length of the first PCB receiving portion 122 may be parallel to the length of the second PCB receiving portion 123. The first PCB receiving portion 122 and the second PCB receiving portion 123 may be formed adjacent to the first long side 127LS1 of the interior of the transparent frame 127. The first PCB receiving portion 122 and the second PCB receiving portion 123 may be aligned and arranged parallel to a direction from the first short side 127SS1 of the interior of the transparent frame 127 towards the second short side 127SS2.

Referring to a cross-section taken along the line A-A' that is parallel to the length of the PCB receiving portion 122 and 123 and passes through the PCB receiving portion 122 and 123 of FIG. 18, one or more of the PCB receiving portions 122 and 123 may extend all the way through the transparent frame 127 to define one or more corresponding openings.

The PCB receiving portion 122 and 123 may be formed on a surface of the transparent plate 128 by an optical method. For example, the PCB receiving portion 122 and 123 may be formed by a carbon dioxide laser, or other methods as discussed above with respect to other embodiments.

Figure 19:
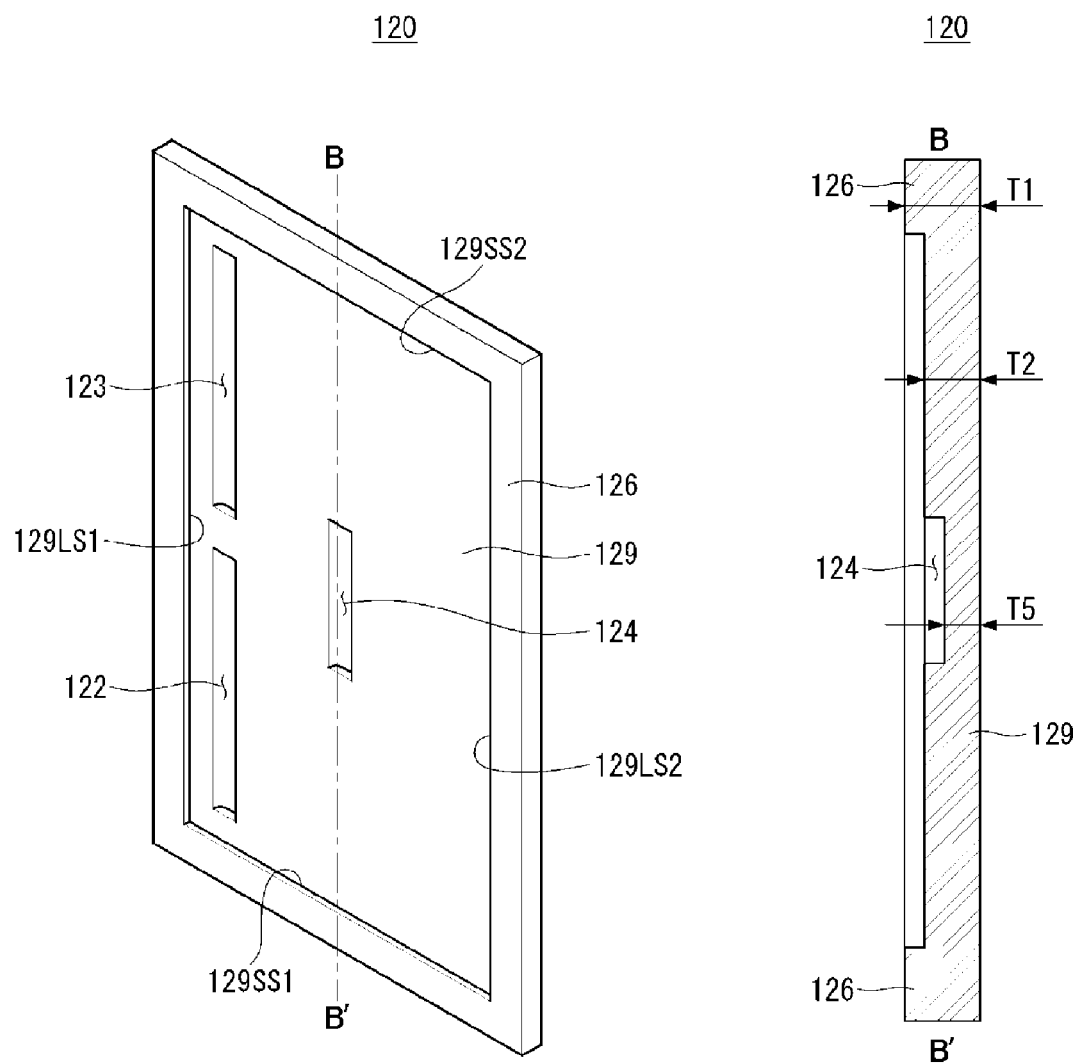

Referring to another embodiment shown in FIG. 19, a cable receiving portion 124 may be disposed at the front of the transparent board 129. The cable receiving portion 124 may be shaped like a groove formed on a surface of the transparent board 129. The cable receiving portion 124 may receive at least a part of a cable connected to a PCB. The cable receiving portion 124 may be positioned at a center region of the transparent board 129. The cable receiving portion 124 may be spaced apart from the PCB receiving portion 122 and 123.

The PCB receiving portion 122 and 123 may be positioned between the cable receiving portion 124 and a side of the transparent board 129. For example, the PCB receiving portion 122 and 123 may be positioned between the cable receiving portion 124 and the first long side 129LS1 of the transparent board 129.

Referring to a cross-section taken along the line B-B' that passes through the cable receiving portion 124 of FIG. 19, the transparent board 129 may have a thickness T5 at one point on the part where the cable receiving portion 124 is formed. The transparent board 129 may be stepped at the boundary of the cable receiving portion 124.

Figure 20:
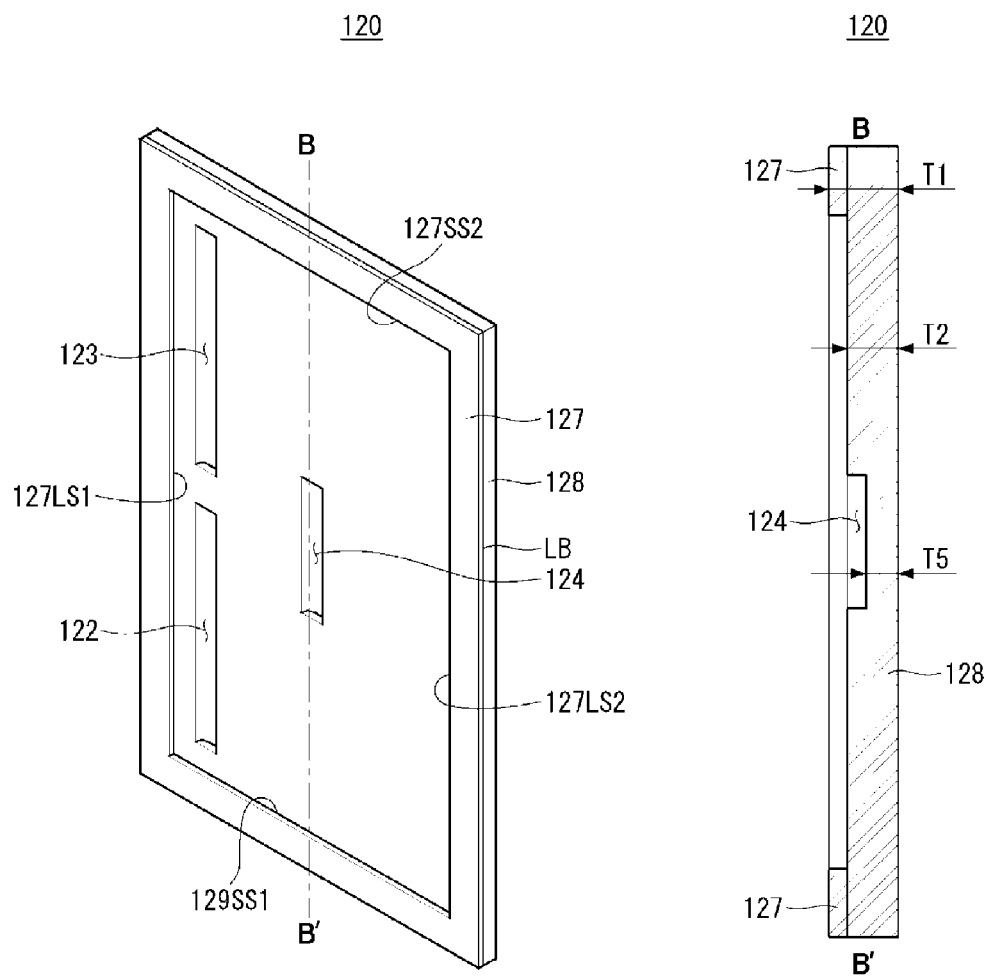

Referring to the embodiment shown in FIG. 20, the cable receiving portion 124 may be disposed at the front of the transparent plate 128. The cable receiving portion 124 may be shaped like a groove formed on a surface of the transparent plate 128. The cable receiving portion 124 may receive at least a part of a cable connected to a PCB. The cable receiving portion 124 may be positioned at a center region of the transparent plate 128. The cable receiving portion 124 may be spaced apart from the PCB receiving portion 122 and 123.

The PCB receiving portion 122 and 123 may be positioned between the cable receiving portion 124 and a side of the interior of the transparent frame 127. For example, the PCB receiving portion 122 and 123 may be positioned between the cable receiving portion 124 and the first long side 127LS1 of the interior of the transparent frame 127.

Referring to a cross-section taken along the line B-B' that passes through the cable receiving portion 124 of FIG. 20, the transparent plate 128 may have a thickness T5 at one point on the part where the cable receiving portion 124 is formed. The transparent plate 128 may be stepped at the boundary of the cable receiving portion 124.

Figure 21:
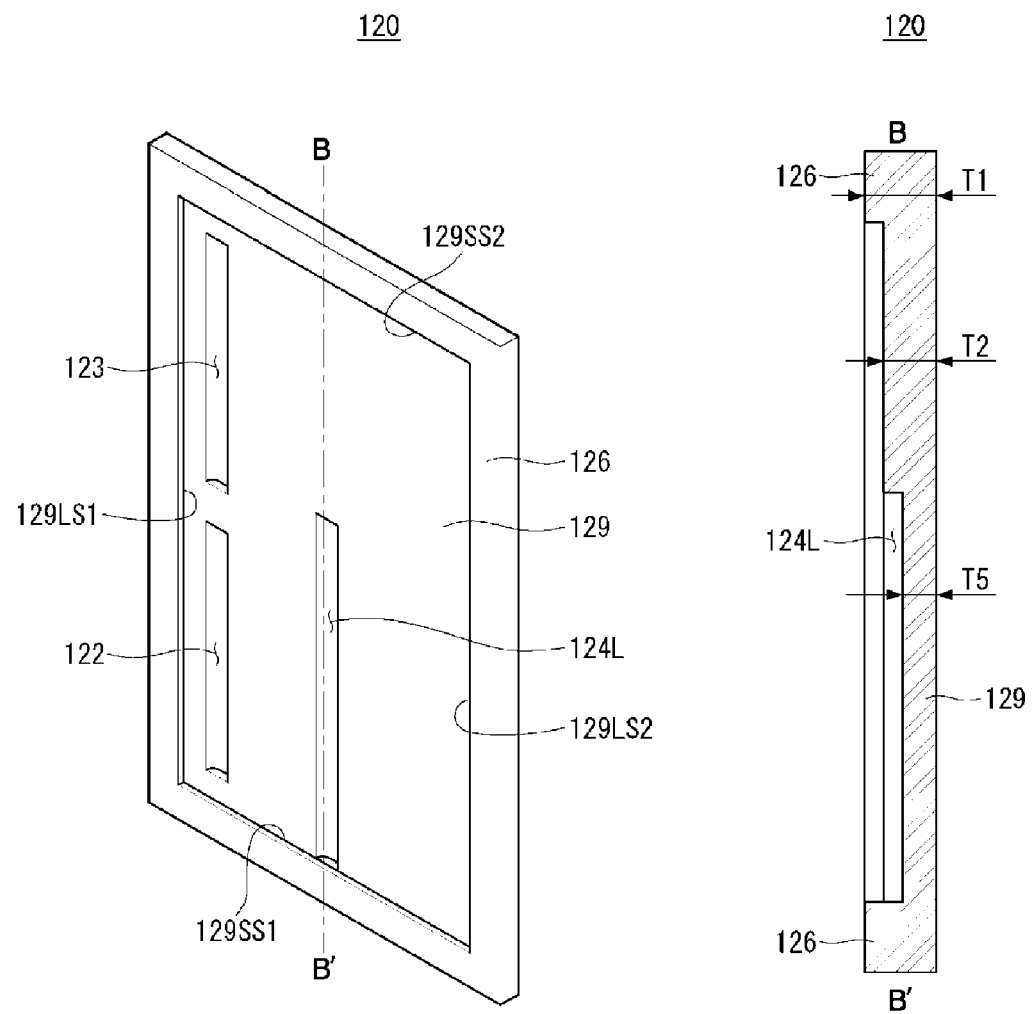

Referring to the embodiment shown in FIG. 21, the cable receiving portion 124L may be disposed at the front of the transparent board 129. The cable receiving portion 124L may receive at least a part of a cable connected to a PCB. The cable receiving portion 124L may be formed at a center region of the transparent board 129, and extend to a side of the transparent board 129.

A side of the transparent board 129 in communication with the cable receiving portion 124L may be adjacent to another side of the transparent board 129 which is adjacent to the PCB receiving portion 122 and 123. For example, the first short side 129SS1 of the transparent board 129 may be in communication with the cable receiving portion 124L. The first short side 129SS1 may also be in communication with the first long side 129LS1 of the transparent board 129 which is adjacent to the PCB receiving portion 122 and 123.

The cable receiving portion 124L may be formed to have an elongated shape. The lengthwise axies of the cable receiving portion 124L may be parallel to the lengthwise axis of the first long side 129LS1 of the transparent board 129 adjacent to the PCB receiving portion 122 and 123. The lengthwise axis of the cable receiving portion 124L may be parallel to a direction from the first short side 129SS1 of the transparent board 129 towards the second short side 129SS2.

Referring to a cross-section taken along the line B-B' that is parallel to the length of the cable receiving portion 124L and passes through the cable receiving portion 124L of FIG. 21, the cable receiving portion 124L may extend to an interior side of the transparent flange 126. The transparent board 129 may be stepped at the boundary of the cable receiving portion 124L.

Figure 22:
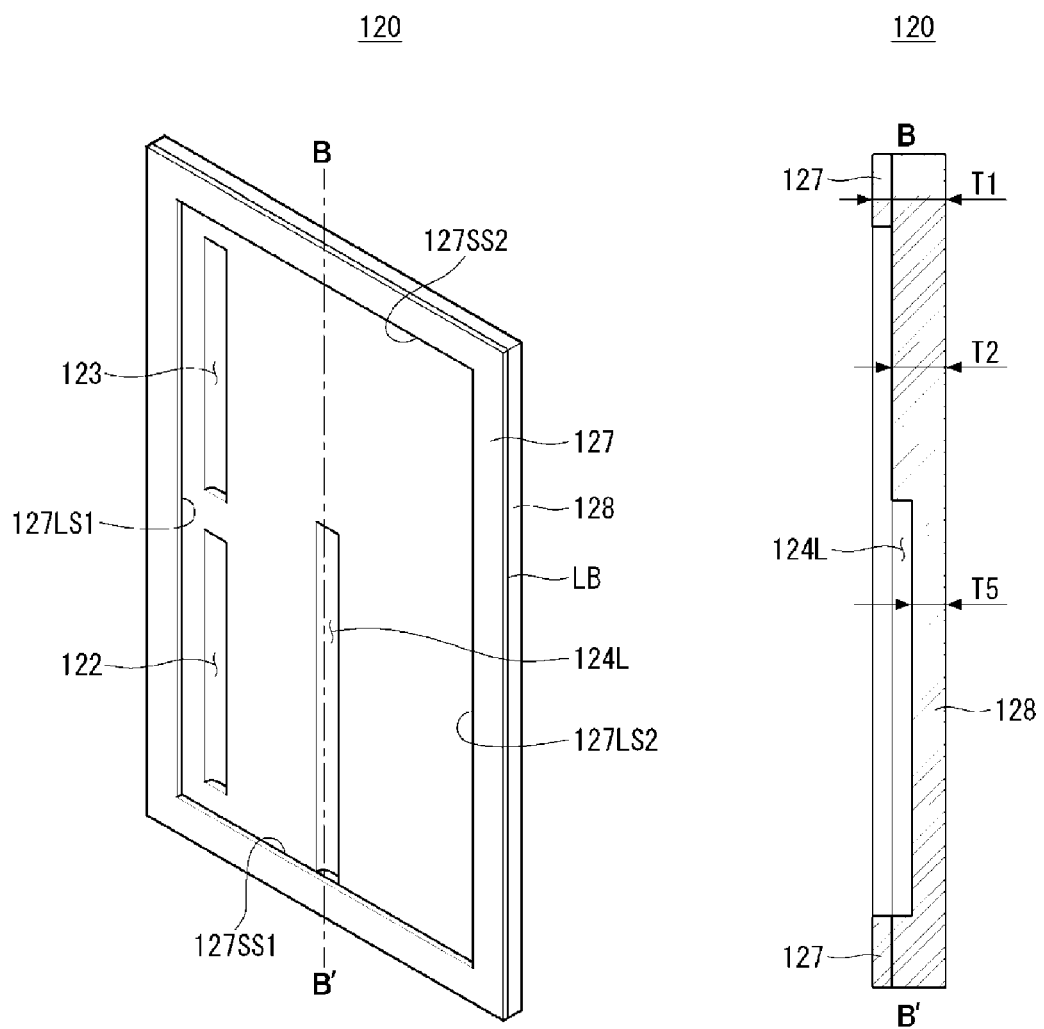

Referring to the embodiment shown in FIG. 22, the cable receiving portion 124L may be disposed at the front of the transparent plate 128. The cable receiving portion 124L may receive at least a part of a cable connected to a PCB. The cable receiving portion 124L may be formed at a center region of the transparent plate 128, and extend to a side of the interior of the transparent frame 127.

A side of the interior of the transparent frame 127 in communication with the cable receiving portion 124L may be adjacent to another side of the interior of the transparent frame 127 which is adjacent to the PCB receiving portion 122 and 123. For example, the first short side 127SS1 of the interior of the transparent frame 127 may be in communication with the cable receiving portion 124L. The first short side 127SS1 may also be in communication with the first long side 127LS1 which is adjacent to the PCB receiving portion 122 and 123.

The cable receiving portion 124L may be formed to have an elongated shape. The lengthwise axis of the cable receiving portion 124L may be parallel to the lengthwise axis of the first long side 127LS1 of the interior of the transparent frame 127 adjacent to the PCB receiving portion 122 and 123. The lengthwise axis of the cable receiving portion 124L may be parallel to a direction from the first short side 127SS1 of the interior of the transparent frame 127 towards the second short side 127SS2.

Referring to a cross-section taken along the line B-B' that is parallel to the length of the cable receiving portion 124L and passes through the cable receiving portion 124L of FIG. 22, the cable receiving portion 124L may extend to an interior side of the transparent frame 127. The transparent plate 128 may be stepped at the boundary of the cable receiving portion 124L.

Figure 23:
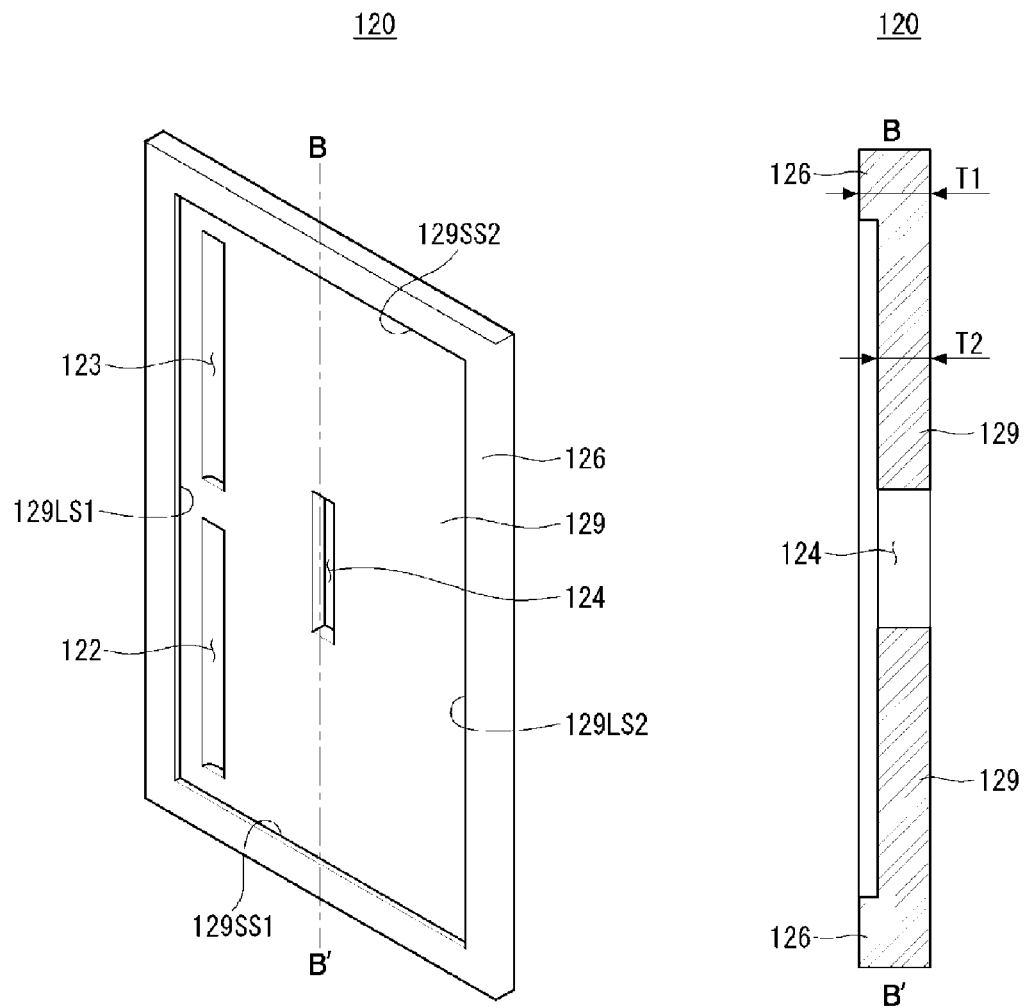

Referring to the embodiment shown in FIG. 23, the cable receiving portion 124 may be disposed at the front of the transparent board 129. The cable receiving portion 124 may be an opening formed at a surface of the transparent board 129 and extending to the opposite side of the transparent board 129. The cable receiving portion 124 may receive at least a part of a cable connected to a PCB. The cable receiving portion 124 may be positioned adjacent to a center region of the transparent board 129. The cable receiving portion 124 may be spaced apart from the PCB receiving portion 122 and 123.

The PCB receiving portion 122 and 123 may be positioned between the cable receiving portion 124 and a side of the transparent board 129. For example, the PCB receiving portion 122 and 123 may be positioned between the cable receiving portion 124 and the first long side 129LS1 of the transparent board 129.

Referring to a cross-section taken along the line B-B' that passes through the cable receiving portion 124 of FIG. 23, the cable receiving portion may extend all the way through the transparent board 129 defining an opening.

Figure 24:
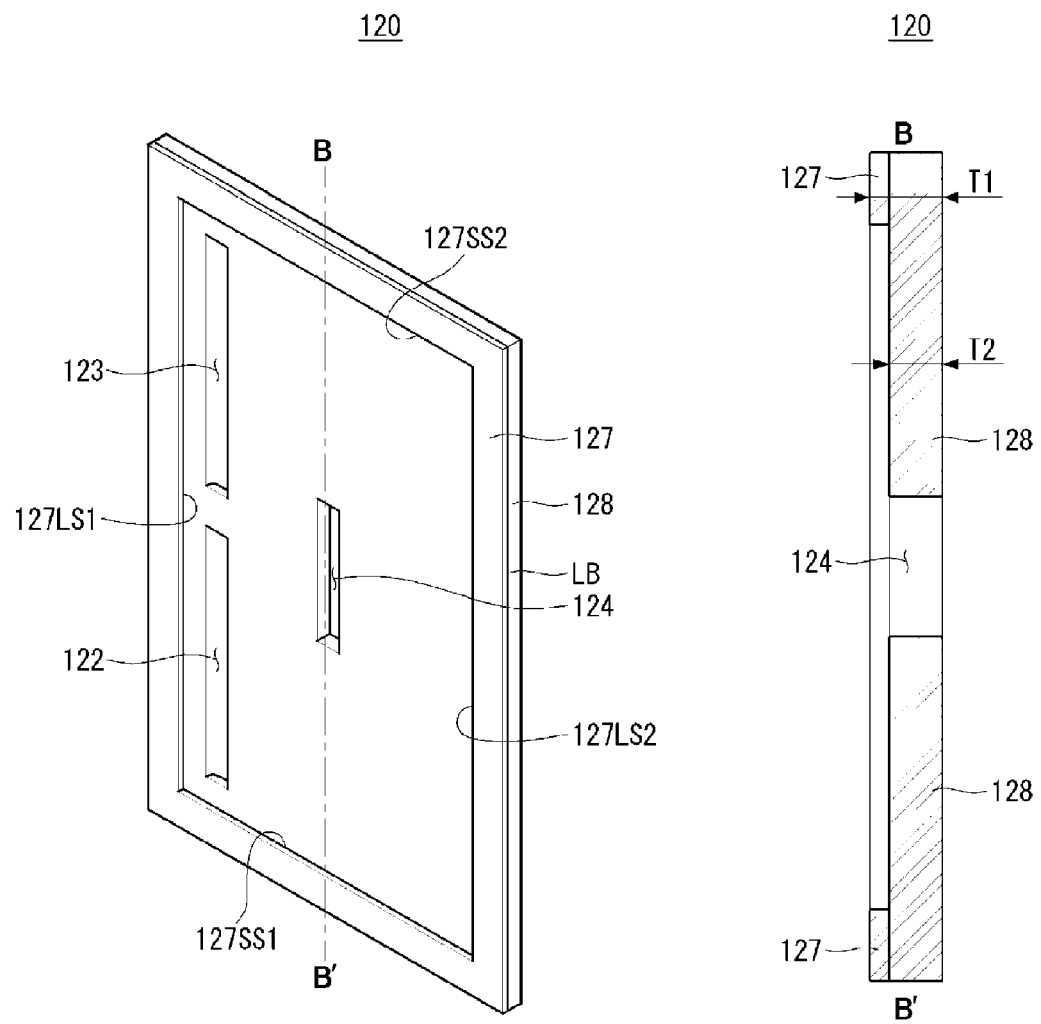

Referring to the embodiment shown in FIG. 24, the cable receiving portion 124 may be disposed at the front of the transparent plate 128. The cable receiving portion 124 may be an opening formed at a surface of the transparent plate 128 and extending to the opposite side of the transparent plate 128. The cable receiving portion 124 may receive at least a part of a cable connected to a PCB. The cable receiving portion 124 may be positioned at a center region of the transparent plate 128. The cable receiving portion 124 may be spaced apart from the PCB receiving portion 122 and 123.

The PCB receiving portion 122 and 123 may be positioned between the cable receiving portion 124 and a side of the interior of the transparent frame 127. For example, the PCB receiving portion 122 and 123 may be positioned between the cable receiving portion 124 and the first long side 127LS1 of the interior of the transparent frame 127.

Referring to a cross-section taken along the line B-B' that passes through the cable receiving portion 124 of FIG. 24, the cable receiving portion may extend all the way through the transparent plate 128 defining an opening.

Figure 25:
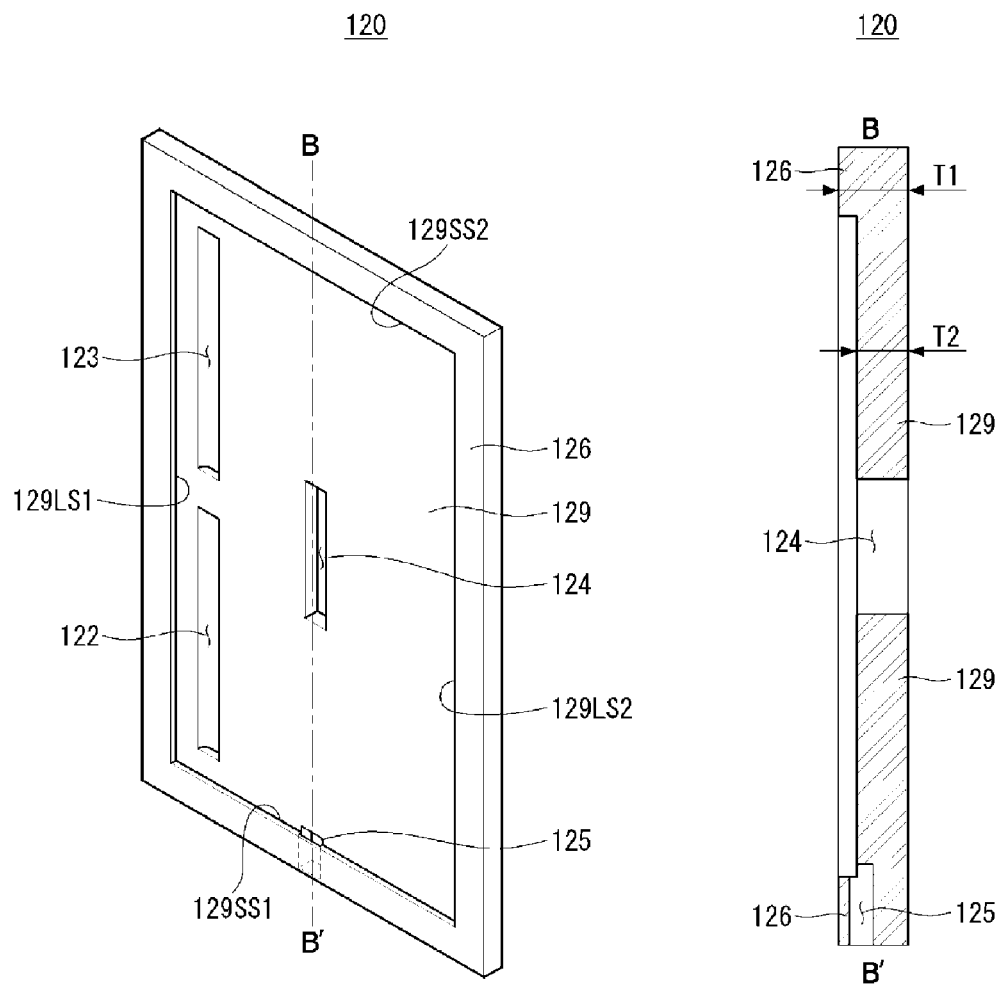

Referring to the embodiment shown in FIG. 25, a slot 125 may be disposed at least a part of the front of the transparent board 129. The slot 125 may be an opening or a hole. The slot 125 may be formed on the transparent body 120, at one point on a side of the transparent board 129. For example, the slot 125 may be formed at one point on the first short side 129SS1 of the transparent board 129. The slot 125 may provide a space through which a cable passes.

A side of the transparent board 129 where the slot 125 is formed may be connected to another side adjacent to the PCB receiving portion 122 and 123. For example, the first short side 129SS1 may be connected to the first long side 129LS1.

The slot 125 may be formed by removing part of the transparent flange 126. Alternatively, the slot 125 may be formed by removing part of the transparent board 129. Alternatively, the slot 125 may be formed by removing part of the transparent flange 126 and part of the transparent board 129.

The slot 125 may open or be accessible from two directions. For example, one end of the slot 125 may open towards or be accessible from a side toward the cable receiving portion 124. The other end of the slot 125 may open towards or be accessible from a direction corresponding to a sidewall SW of the transparent body 120. The sidewall SW may be the sidewall SW adjacent to the first short side 129SS1 where the slot 125 is positioned.

The opening or access directions of the slot 125 may correspond to the shape of the slot 125. A cable path through the slot 125 may correspond to the opening or access directions of the slot 125. For example, if one end of the slot 125 opens towards or is accessible from a side toward the cable receiving portion 124 and the other end of the slot 125 opens towards or is accessible from a direction corresponding to the sidewall SW adjacent to the first short side 129SS1, the cable may be extended from the cable receiving portion 124, enter one end of the slot 125, and pass through the other end of the slot 125 and make its way out from the opening at the sidewall SW.

Figure 26:
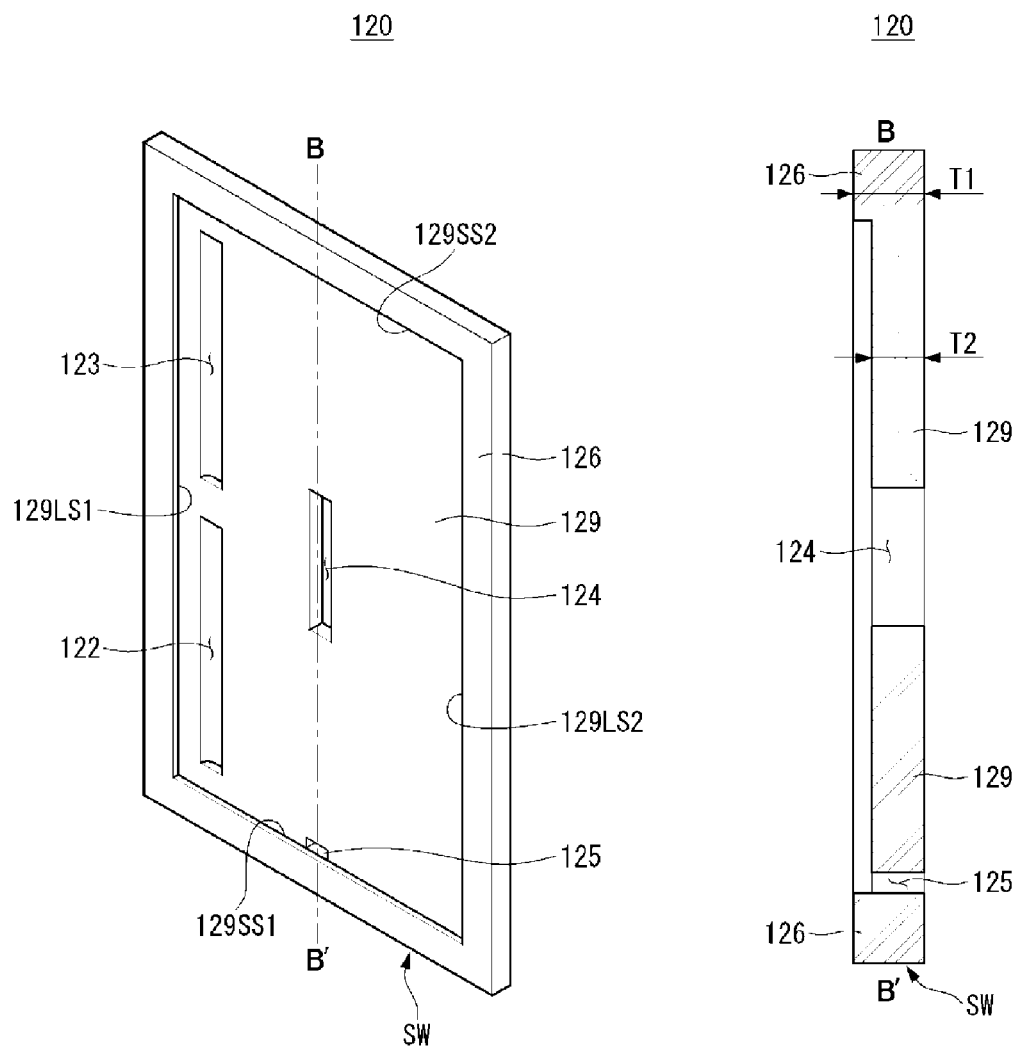

Referring to the embodiment shown in FIG. 26, the slot 125 may be disposed at least a part of the front of the transparent board 129. The slot 125 may be an opening or a hole, and be formed at one point on the first short side 129SS1 of the transparent board 129. The slot 125 may allow a cable to pass through.

The slot 125 may open or be accessible from two directions. For example, one end of the slot 125 may open towards or be accessible from a side toward the cable receiving portion 124 or/and towards the front of the transparent board 129. The other end of the slot 125 may open towards or be accessible from a direction corresponding to the back of the transparent body 120.

The opening or access directions of the slot 125 may correspond to the shape of the slot 125. A cable path through the slot 125 may correspond to the opening or access directions of the slot 125. For example, if one end of the slot 125 opens towards or is accessible from a side toward the cable receiving portion 124 or/and towards the front of the transparent board 129 and the other end of the slot 125 opens towards or is accessible from a direction corresponding to the back of the transparent body 120, the cable may be extended from the cable receiving portion 124, enter one end of the slot 125, and pass through the other end of the slot 125 towards the back of the transparent body 120.

Figure 27:
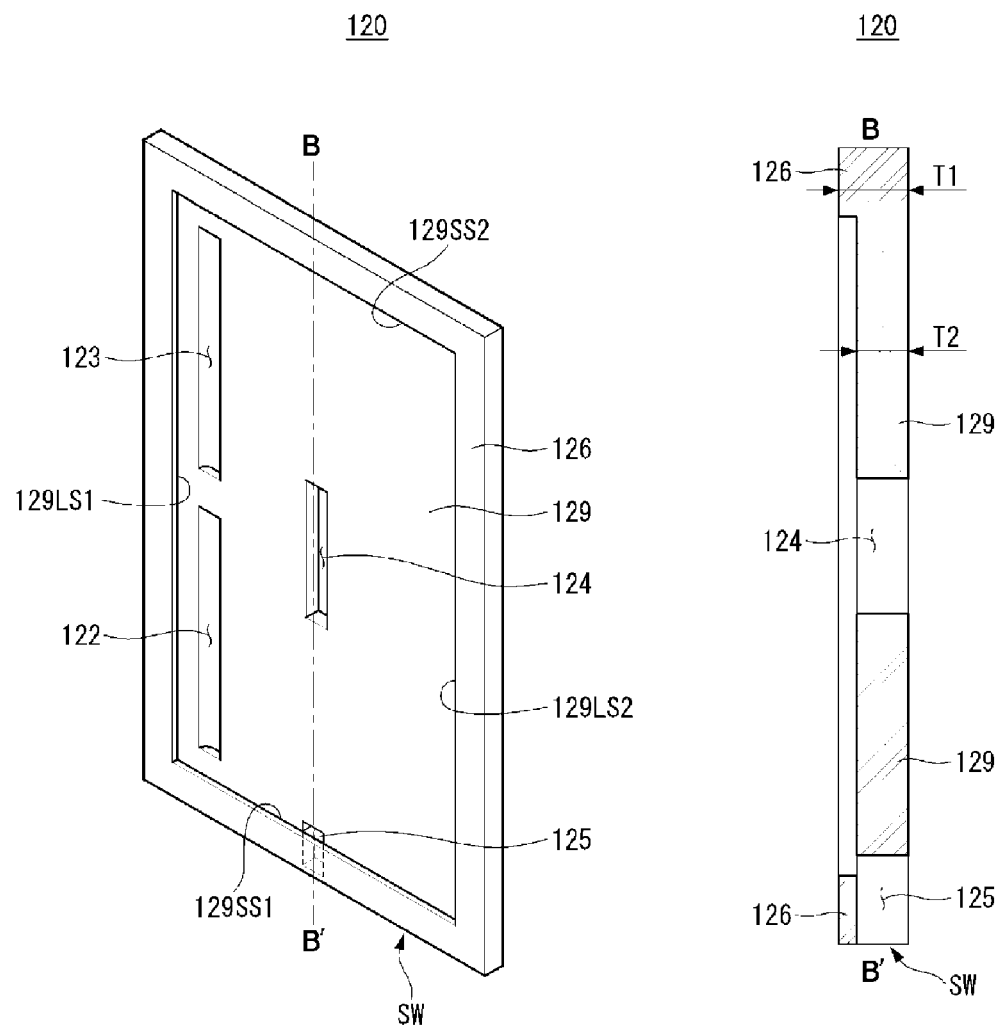

Referring to the embodiment shown in FIG. 27, the slot 125 may be disposed at at least a part of the front of the transparent board 129. The slot 125 may be an opening or a hole, and be formed at one point on the first short side 129SS1 of the transparent board 129. The slot 125 may allow a cable to pass through.

The slot 125 may open or be accessible from two directions. For example, one end of the slot 125 may open towards or be accessible from a side toward the cable receiving portion 124 or/and towards the front of the transparent board 129. The other end of the slot 125 may open towards or be accessible from a direction corresponding to the back and sidewall SW of the transparent body 120. If the other end of the slot 125 opens towards the back and sidewall SW of the transparent body 120, this makes it easy to form the slot 125.

The opening or access directions of the slot 125 may correspond to the shape of the slot 125. A cable path through the slot 125 may correspond to the opening or access directions of the slot 125. For example, if one end of the slot 125 opens towards or is accessible from a side toward the cable receiving portion 124 or/and towards the front of the transparent board 129 and the other end of the slot 125 opens towards or is accessible from a direction corresponding to the back and sidewall SW of the transparent body 120, the cable may be extended from the cable receiving portion 124, enter one end of the slot 125, and pass through the other end of the slot 125 and make its way towards the back of the transparent body 120 and the outside of the sidewall SW.

Figure 28:
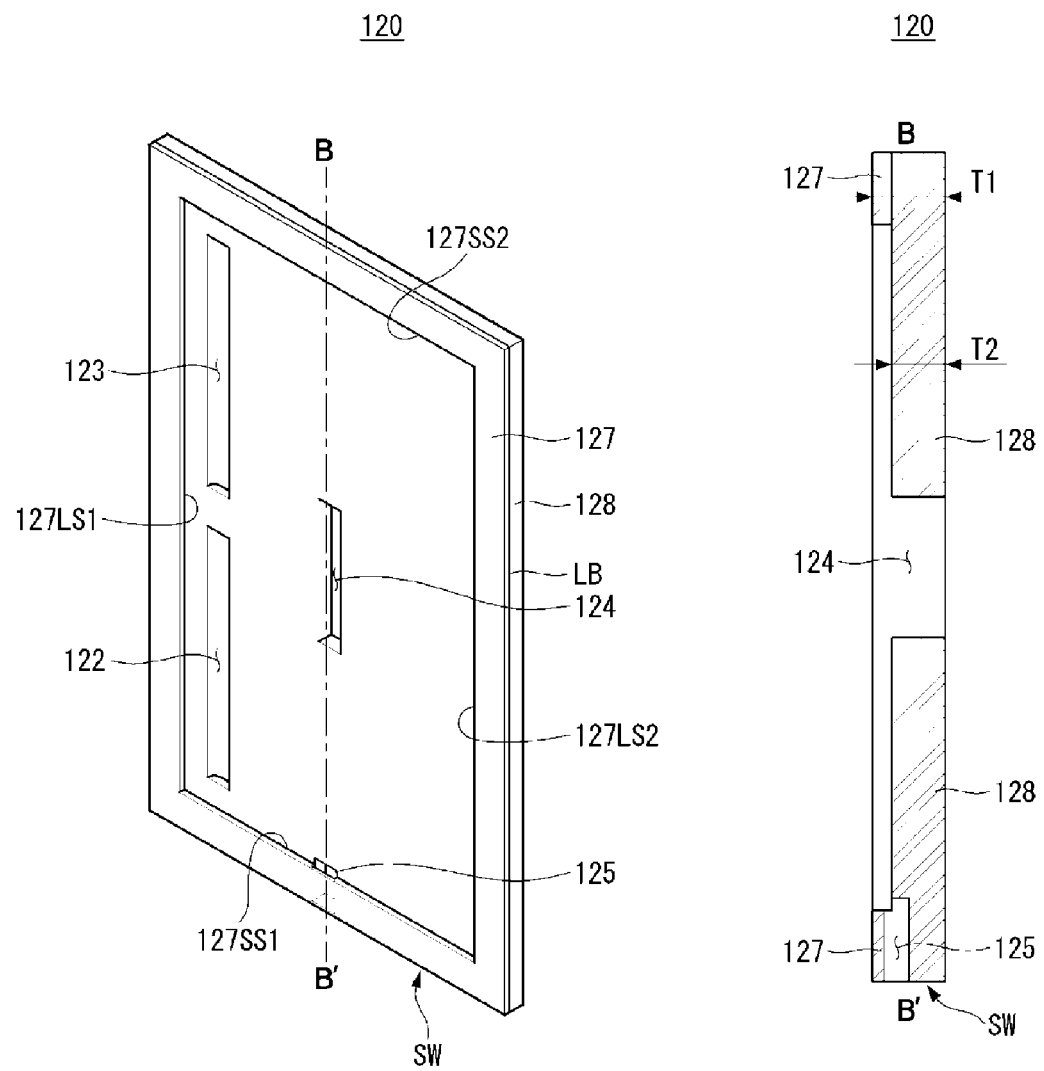

Referring to the embodiment shown in FIG. 28, the slot 125 may be disposed at least a part of the front of the transparent plate 128. The slot 125 may be an opening or a hole. The slot 125 may be formed on the transparent body 120, at one point on a side of the interior of the transparent frame 127. For example, the slot 125 may be formed at one point on the first short side 127SS1 of the interior of the transparent frame 127. The slot 125 may provide a space through which a cable passes.

A side of the interior of the transparent frame 127 where the slot 125 is formed may be connected to another side adjacent to the PCB receiving portion 122 and 123. For example, the first short side 127SS1 may be connected to the first long side 127LS1.

The slot 125 may be formed by removing part of the transparent plate 128. Alternatively, the slot 125 may be formed by removing part of the transparent frame 127. Alternatively, the slot 125 may be formed by removing part of the transparent frame 127 and part of the transparent plate 128.

The slot 125 may be formed by bonding the transparent frame 127 to a transparent plate 128 with a groove or hole in it. Alternatively, the slot 125 may be formed by bonding the transparent plate 128 to a transparent frame 127 with a groove in it. Alternatively, the slot 125 may be formed by bonding the transparent frame 127 to a transparent plate 128 on which a bay-shaped bend is located. Here, the bend may be recessed towards the sidewall SW of the transparent body 120. For example, the slot 125 may be formed by bonding together the transparent plate 128 with a groove in it and the transparent frame 127 with a groove in it. Here, the groove in the transparent plate 128 or/and the groove in the transparent frame 127 may be adjacent to one point on the first short side 127SS1.

The slot 125 may open or accessible from two directions. For example, one end of the slot 125 may open towards or be accessible from a side toward the cable receiving portion 124. The other end of the slot 125 may open towards or be accessible from a direction corresponding to a sidewall SW of the transparent body 120. The sidewall SW may be the sidewall SW adjacent to the first short side 127SS1 where the slot 125 is positioned.

The opening or access directions of the slot 125 may correspond to the shape of the slot 125. A cable path through the slot 125 may correspond to the opening or access directions of the slot 125. For example, if one end of the slot 125 opens towards or is accessible from a side toward the cable receiving portion 124 and the other end of the slot 125 opens towards or is accessible from a direction corresponding to the sidewall SW adjacent to the first short side 127SS1, the cable may be extended from the cable receiving portion 124, enter one end of the slot 125, and pass through the other end of the slot 125 and make its way out from the opening at the sidewall SW.

Figure 29:
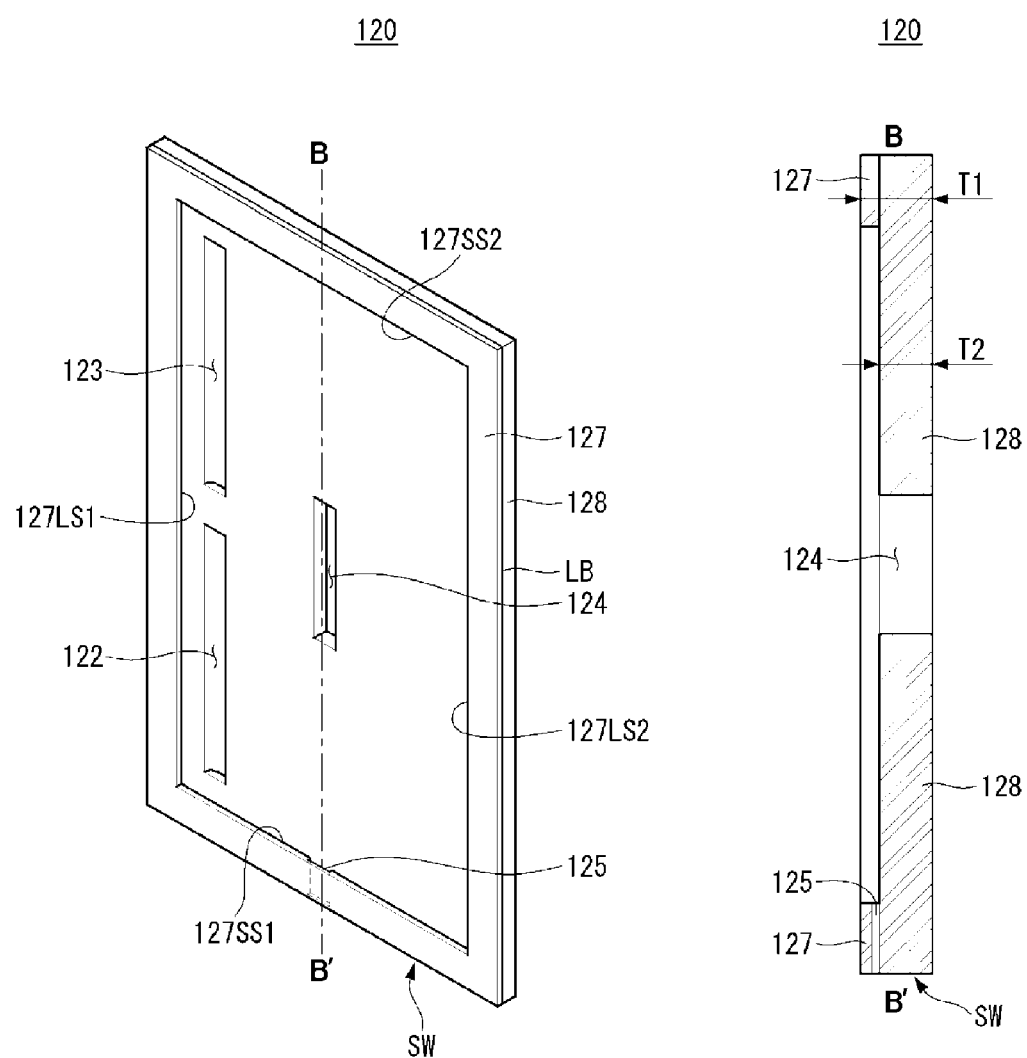

Referring to the embodiment shown in FIG. 29, the slot 125 may be disposed at least a part of the front of the transparent plate 128. The slot 125 may be formed at one point on the first short side 127SS1 of the interior of the transparent frame 127. The slot 125 may provide a space through which a cable passes. The first short side 127SS1 of the interior of the transparent frame 127 with the slot 125 in it may be connected to the first long side 127LS1.

The slot 125 may be formed by removing part of the transparent plate 128. Alternatively, the slot 125 may be formed by removing part of the transparent frame 127. Alternatively, the slot 125 may be formed by removing part of the transparent frame 127 and part of the transparent plate 128.

The slot 125 may be formed by bonding the transparent frame 127 to a transparent plate 128 with a groove or hole in it. Alternatively, the slot 125 may be formed by bonding the transparent plate 128 to a transparent frame 127 with a groove in it. Alternatively, the slot 125 may be formed by bonding the transparent frame 127 to a transparent plate 128 on which a bay-shaped bend is located. For example, the slot 125 may be formed by bonding the transparent plate 128 to a transparent frame 127 with a groove in it. Here, the groove in the transparent plate 128 or/and the groove in the transparent frame 127 may be adjacent to one point on the first short side 127SS1.

The slot 125 may open or be accessible from two directions. For example, one end of the slot 125 may open towards or be accessible from a side toward the cable receiving portion 124. The other end of the slot 125 may open towards or be accessible from a direction corresponding to a sidewall SW of the transparent body 120. The sidewall SW may be the sidewall SW adjacent to the first short side 127SS1 where the slot 125 is positioned.

The opening or access directions of the slot 125 may correspond to the shape of the slot 125. A cable path through the slot 125 may correspond to the opening or access directions of the slot 125. For example, if one end of the slot 125 opens towards or is accessible from a side toward the cable receiving portion 124 and the other end of the slot 125 opens towards or is accessible from a direction corresponding to the sidewall SW adjacent to the first short side 127SS1, the cable may be extended from the cable receiving portion 124, enter one end of the slot 125, and pass through the other end of the slot 125 and make its way out from the opening at the sidewall SW.

Figure 30:
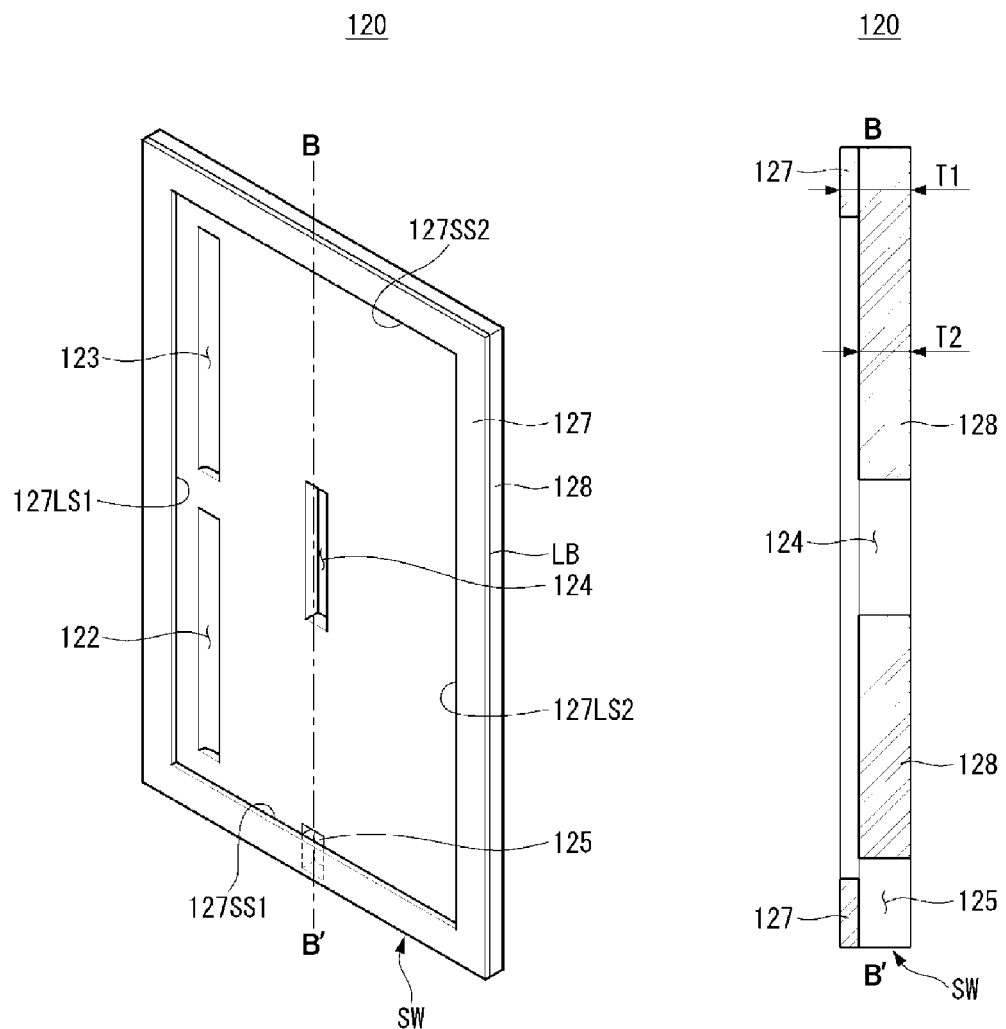

Referring to the embodiment shown in FIG. 30, the slot 125 may be disposed at least a part of the front of the transparent plate 128. The slot 125 may be formed at one point on the first short side 127SS1 of the interior of the transparent frame 127. The slot 125 may provide a space through which a cable passes. The first short side 127SS1 of the interior of the transparent frame 127 with the slot 125 in it may be connected to the first long side 127LS1.

The slot 125 may be formed by removing part of the transparent plate 128. Alternatively, the slot 125 may be formed by removing part of the transparent frame 127. Alternatively, the slot 125 may be formed by removing part of the transparent frame 127 and part of the transparent plate 128.

The slot 125 may be formed by bonding the transparent frame 127 to a transparent plate 128 with a groove or hole in it. Alternatively, the slot 125 may be formed by bonding the transparent plate 128 to a transparent frame 127 with a groove in it. Alternatively, the slot 125 may be formed by bonding the transparent frame 127 to a transparent plate 128 on which a bay-shaped bend is located. For example, the slot 125 may be formed by bonding the transparent frame 127 to a transparent plate 128 on which a bay-shaped bend is located. Here, the groove in the transparent plate 128 or/and the groove or/and bend in the transparent frame 127 may be adjacent to one point on the first short side 127SS1.

The slot 125 may open or be accessible from two directions. For example, one end of the slot 125 may open towards or be accessible from a side toward the cable receiving portion 124. The other end of the slot 125 may open towards or be accessible from a side corresponding to the sidewall SW and back of the transparent body 120. The sidewall SW may be the sidewall SW adjacent to the first short side 127SS1 where the slot 125 is positioned.

The opening or access directions of the slot 125 may correspond to the shape of the slot 125. A cable path through the slot 125 may correspond to the opening or access directions of the slot 125. For example, if one end of the slot 125 opens towards or is accessible from a side toward the cable receiving portion 124 and the other end of the slot 125 opens towards or is accessible from a direction corresponding to the sidewall SW adjacent to the first short side 127SS1 and the back, the cable may be extended from the cable receiving portion 124, enter one end of the slot 125, and pass through the other end of the slot 125 and make its way out of the sidewall SW and the back.

Figure 31:
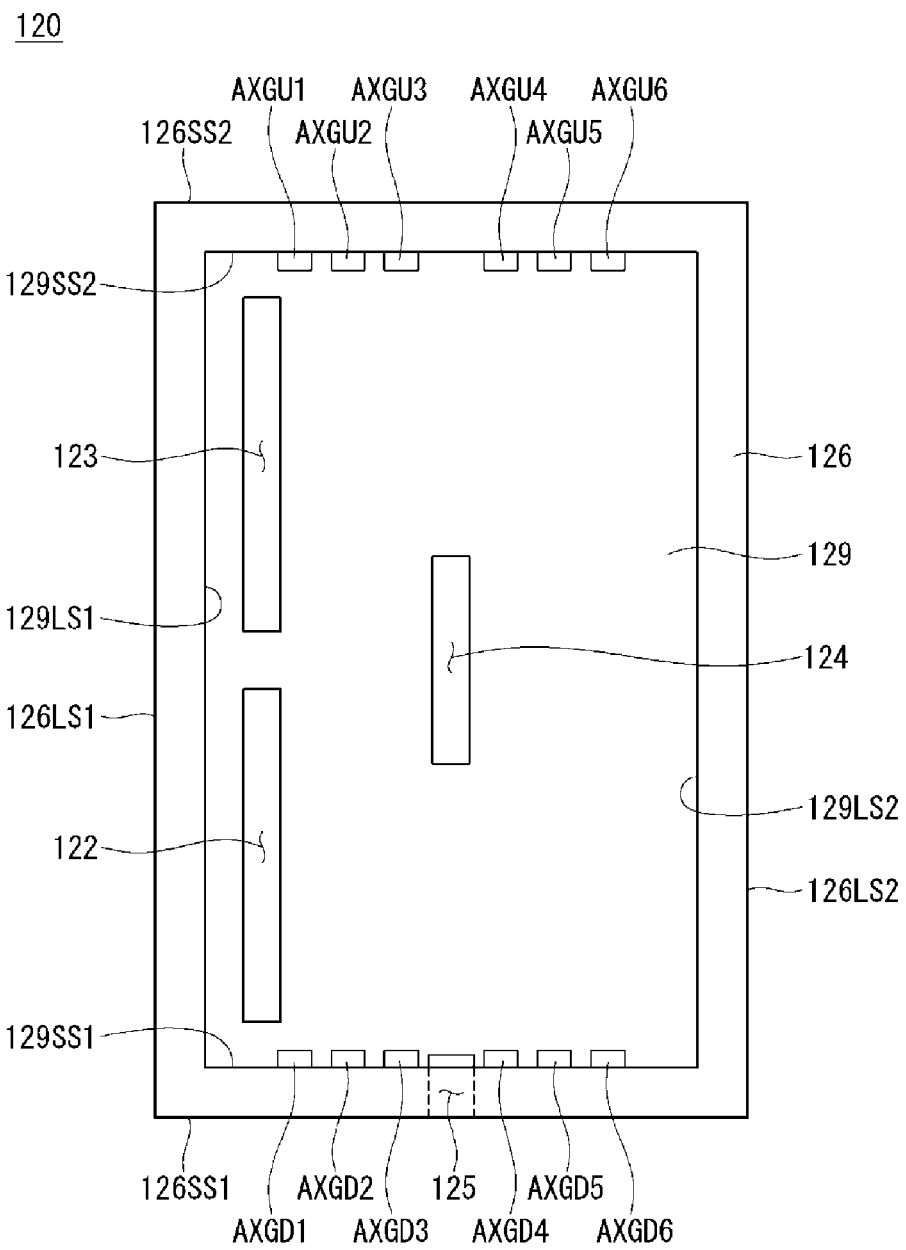

Referring to the embodiment shown in FIG. 31, a plurality of auxiliary grooves, for example AXGU1, AXGU2, AXGU3, AXGU4, AXGU5, AXGU6, AXGD1, AXGD2, AXGD3, AXGD4, AXGD5, and AXGD6 may be disposed at at least a part of the front of the transparent body 120. The auxiliary grooves AXGU1, AXGU2, AXGU3, AXGU4, AXGU5, AXGU6, AXGD1, AXGD2, AXGD3, AXGD4, AXGD5, and AXGD6 may be provided in multiple units. The auxiliary grooves AXGU1, AXGU2, AXGU3, AXGU4, AXGU5, AXGU6, AXGD1, AXGD2, AXGD3, AXGD4, AXGD5, and AXGD6 may comprise one or more upper auxiliary grooves, for example AXGU1, AXGU2, AXGU3, AXGU4, AXGU5, and AXGU6 and one or more lower auxiliary grooves, for example AXGD1, AXGD2, AXGD3, AXGD4, AXGD5, and AXGD6.

The cable receiving portion 124 may be positioned between two groups of auxiliary grooves AXGU1, AXGU2, AXGU3, AXGU4, AXGU5, AXGU6, AXGD1, AXGD2, AXGD3, AXGD4, AXGD5, and AXGD6. At least a part of the auxiliary grooves AXGU1, AXGU2, AXGU3, AXGU4, AXGU5, AXGU6, AXGD1, AXGD2, AXGD3, AXGD4, AXGD5, and AXGD6 may be formed adjacent to a side connected to a side which is adjacent to the PCB receiving portion 122 and 123. For example, the upper auxiliary grooves AXGU1, AXGU2, AXGU3, AXGU4, AXGU5, and AXGU6 may be formed adjacent to the second short side 129SS2 connected to the first long side 129LS1 adjacent to the PCB receiving portion 122 and 123. For example, the lower auxiliary grooves AXGD1, AXGD2, AXGD3, AXGD4, AXGD5, and AXGD6 may be formed adjacent to the first short side 129SS1 connected to the first long side 129LS1 which is adjacent to the PCB receiving portion 122 and 123.

The auxiliary grooves AXGU1, AXGU2, AXGU3, AXGU4, AXGU5, AXGU6, AXGD1, AXGD2, AXGD3, AXGD4, AXGD5, and AXGD6 may provide space where at least some of the parts extending from the display panel is seated. Here, the parts extending from the display panel may be chips mounted on a film.

FIGS. 32 to 35 are views illustrating examples of a display panel according to an exemplary embodiment of the present invention.

Figure 32:
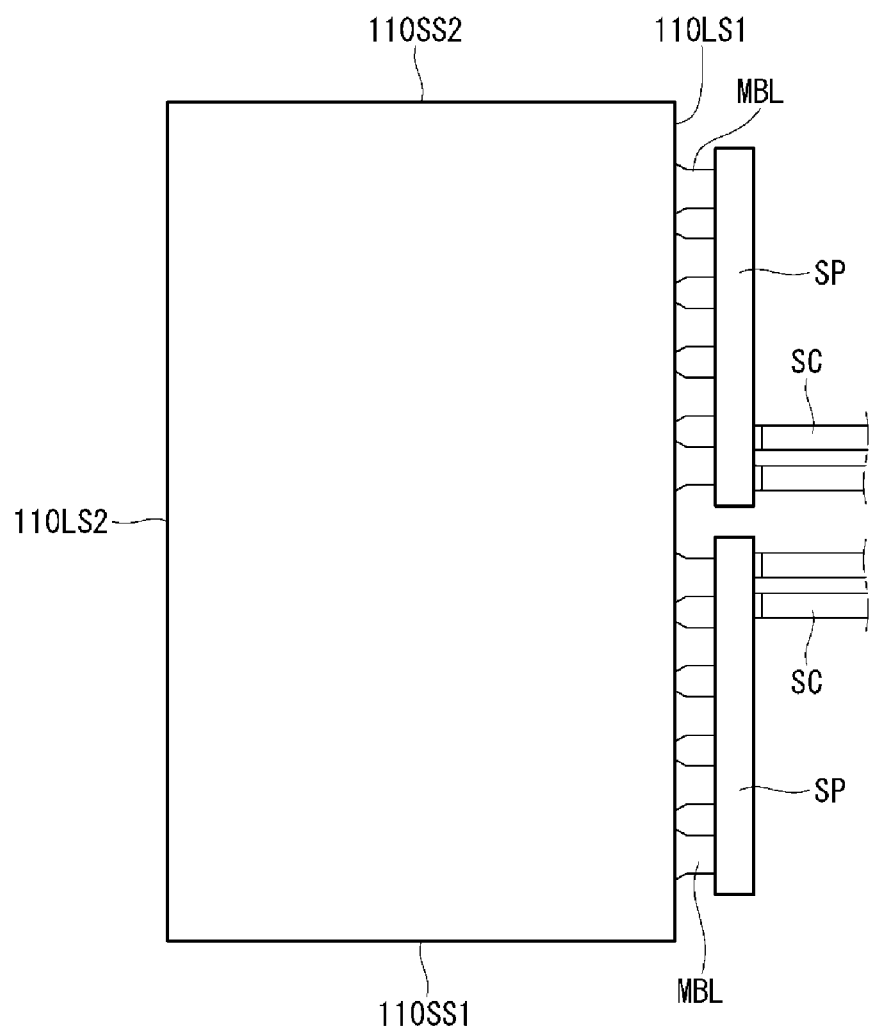
FIGS. 32, 33, 34, and 35 are views illustrating examples of a display panel according to an exemplary embodiment of the present invention.

Referring to the embodiment shown in FIG. 32, the display panel 110 may provide an image on a surface. The display panel 110 may break an image down into a plurality of pixels and output the image in accordance with the color, brightness, and saturation of each individual pixel. The display panel 110 may produce light of a color comprising at least one among red, green, and blue, in response to a control signal.

A member layer MBL may be connected to a side of the display panel 110. For example, the member layer MBL may extend from the first long side 110LS1 of the display panel 110. The member layer MBL may comprise one or more of COF (chip-on-film), COG (chip-on-glass), FPCB (flexible printed circuit board), or TCP (tape carrier package). The member layer MBL may be flexible. The member layer MBL may be provided in multiple units. The member layer MBL may be electrically connected to the display panel 110. The member layer MBL may supply electric power to the display panel 110. The pixels of the display panel 110 may be controlled by an electrical current delivered to the display panel 110 via the member layer MBL.

A cable SC may be electrically connected to the display panel 110. The cable SC may carry an electric current to the display panel 110. The cable SC may send the display panel 110 an electrical signal for controlling the pixels of the display panel 110. The cable SC may be electrically connected to the member layer MBL.

A PCB (indicated by SP in FIG. 32) may be electrically connected to the member layer MBL. The PCB SP may be electrically connected to the cable SC. The PCB SP may be relatively larger than the member layer MBL and/or the cable SC. The PCB SP may take up a certain amount of volume at a side of the display panel 110. The thickness of the PCB SP may vary depending on the type, arrangement, or/and shape of electronic devices mounted on the PCB SP. The PCB SP may be a source PCB.

Figure 33:
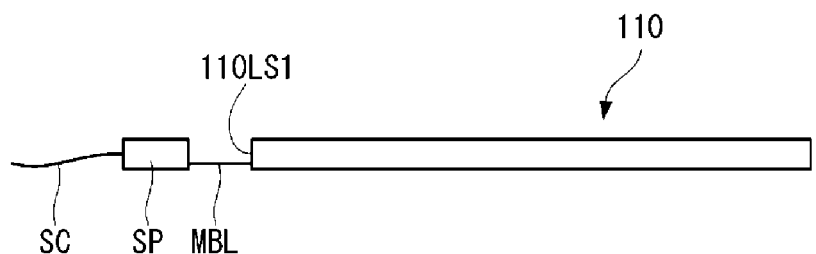

Referring to an example of FIG. 33, a cross-section of the display panel 110, a cross-section of the member layer MBL, a cross-section of the PCB SP, and a cross-section of the cable SC are depicted.

The display panel 110 may be connected to the member layer MBL. The member layer MBL may connect the PCB SP and the display panel 110. The PCB SP may be thicker than the display panel 110. The cable SC may be connected to the PCB SP.

The cable SC may be electrically connected to the PCB SP. The PCB SP may be electrically connected to the member layer MBL. The member layer MBL may be electrically connected to the display panel 110. Electrical connection of two different devices may mean that an electrical signal and/or current may be sent and received between two different devices.

Figure 34:
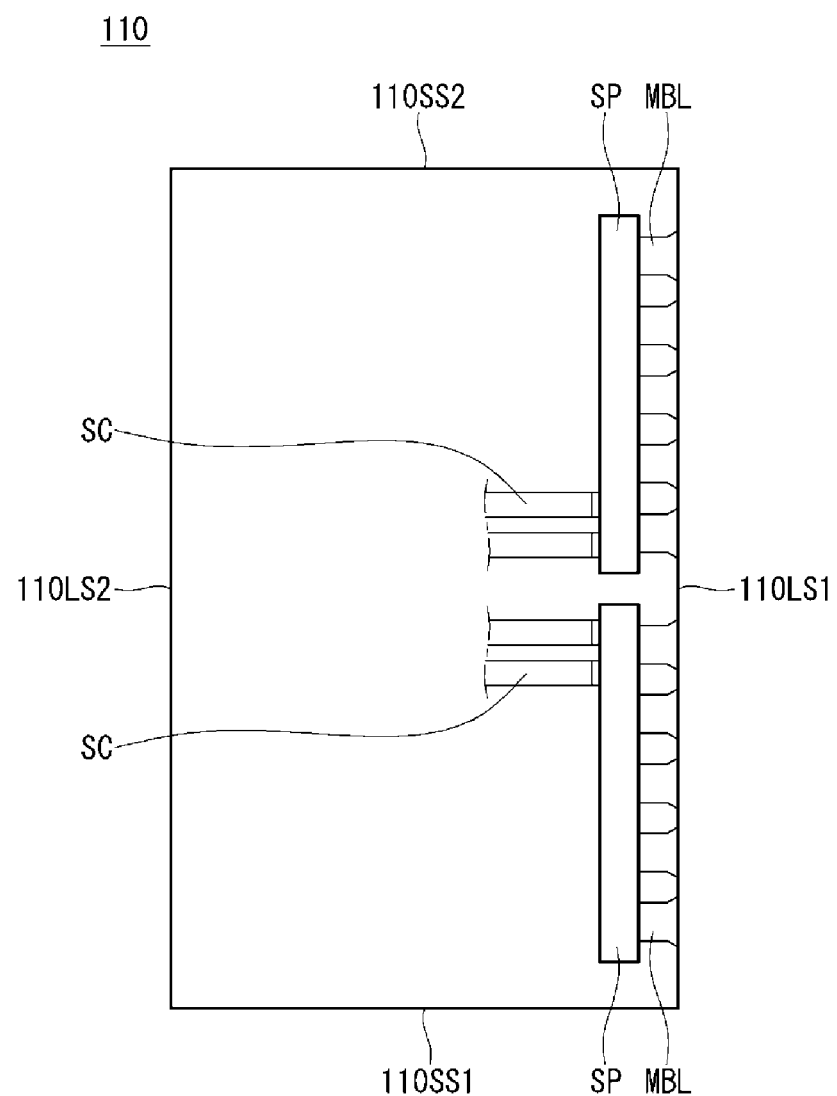

Referring to the embodiment shown in FIG. 34, the member layer MBL may be flexible and allow for bending. The member layer MBL may overlap the display panel 110 since it is flexible. Thus in some embodiments, at least a part of the member layer MBL may overlap the display panel 110. At least a part of the member layer MBL may be positioned on the back of the display panel 110

In configurations in which there is overlap, member layer MBL may extend from a first side of the display panel 110 towards another second side of the display panel 110 which is opposite to the first side of the display panel 110. For example, the member layer MBL may extend from the first long side 110LS1 of the display panel 110 towards the second long side 110LS2.

The PCB SP connected to the member layer MBL may be adjacent to the first side of the display panel 110 that is connected to the member layer MBL. For example, the PCB SP may be positioned adjacent to the first long side 110LS1 of the display panel 110. Alternatively, the PCB SP may be positioned between the first long side 110LS1 and second long side 110LS2 of the display panel 110. The cable SC connected to the PCB SP may be extended in a direction from the member layer MBL to the PCB SP.

Figure 35:
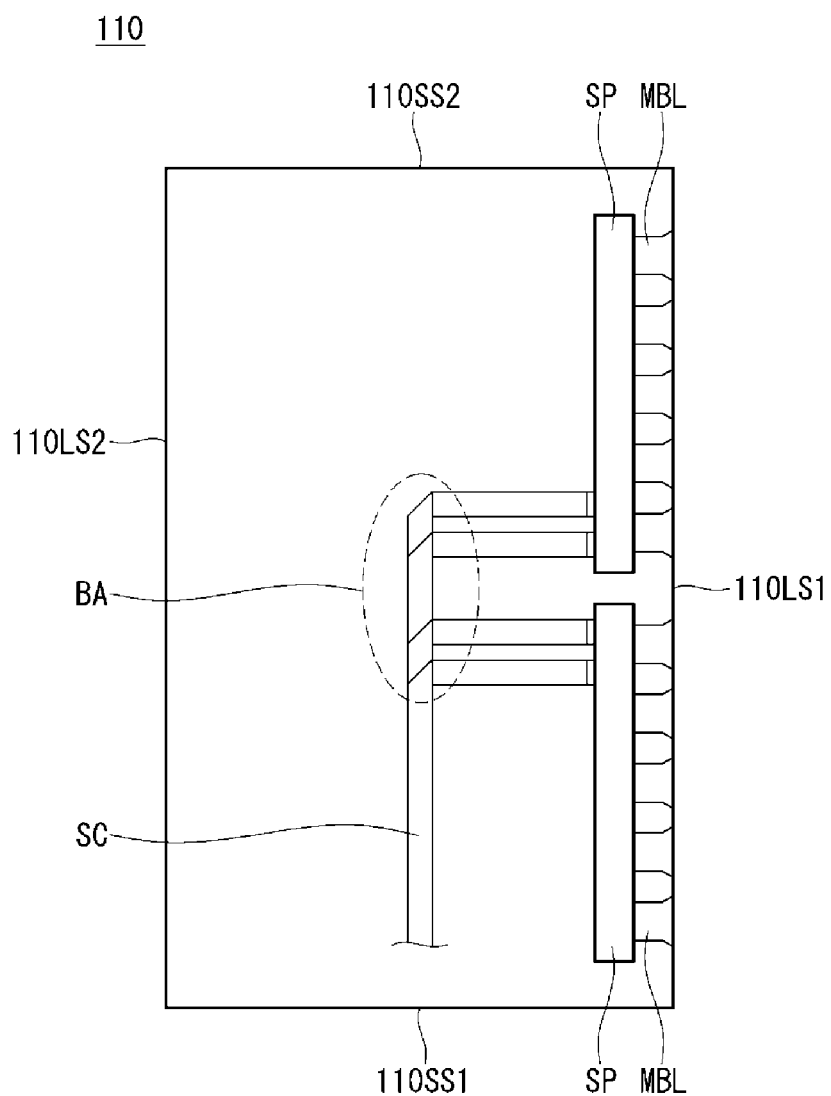

Referring to the embodiment shown in FIG. 35, the cable SC extended from the PCB SP may be flexible and allow bending. An example of the arrangement of the member layer MBL, PCB SP, and cable SC will be discussed. The member layer MBL may extend from a first side of the display panel 110 towards another second side which is opposite to the first side of the display panel 110. For example, the member layer MBL may extend from the first long side 110LS1 of the display panel 110 towards the second long side 110LS2.

The PCB SP may be connected to the member layer MBL, and be positioned closer to the second side of the display panel 110 than the member layer MBL is. For example, the PCB SP may be closer to the second long side 110LS2 than the member layer MBL is.

The cable SC may make its way from the PCB SP towards the second side of the display panel 110, and be bent towards a side adjacent to the first side from which the member layer MBL extends. For example, the cable SC may make its way towards the second long side 110LS2 of the display panel 110, and be bent towards the first short side 110SS1 connected to the first long side 110LS1 as shown in FIG. 35. An area where the cable SC is bent may be formed. For example, the cable SC may have a bending area BA where the cable SC is bent. In the bending area BA, a plurality of cables SC may be bent and stacked. The stacked cables SC may be thickest in the bending area BA.

Although not shown, the cable SC that is bent and extended may be connected to a controller that does not overlap the display panel 110. Since the cable SC is bent, the display panel 110 may be placed in various positions.

The arrangement of the member layer MBL, PCB SP, and cable SC relative to a side of the display panel 110 connected to the member layer MBL and the second side will be discussed. For example, the member layer MBL, PCB SP, and cable SC may be sequentially connected in a direction from the first long side 110LS1, connected to the member layer MBL, towards the second long side 110LS2.

FIGS. 36 to 41 are views illustrating examples of how the components of a display device are attached according to exemplary embodiments of the present invention.

Figure 36:
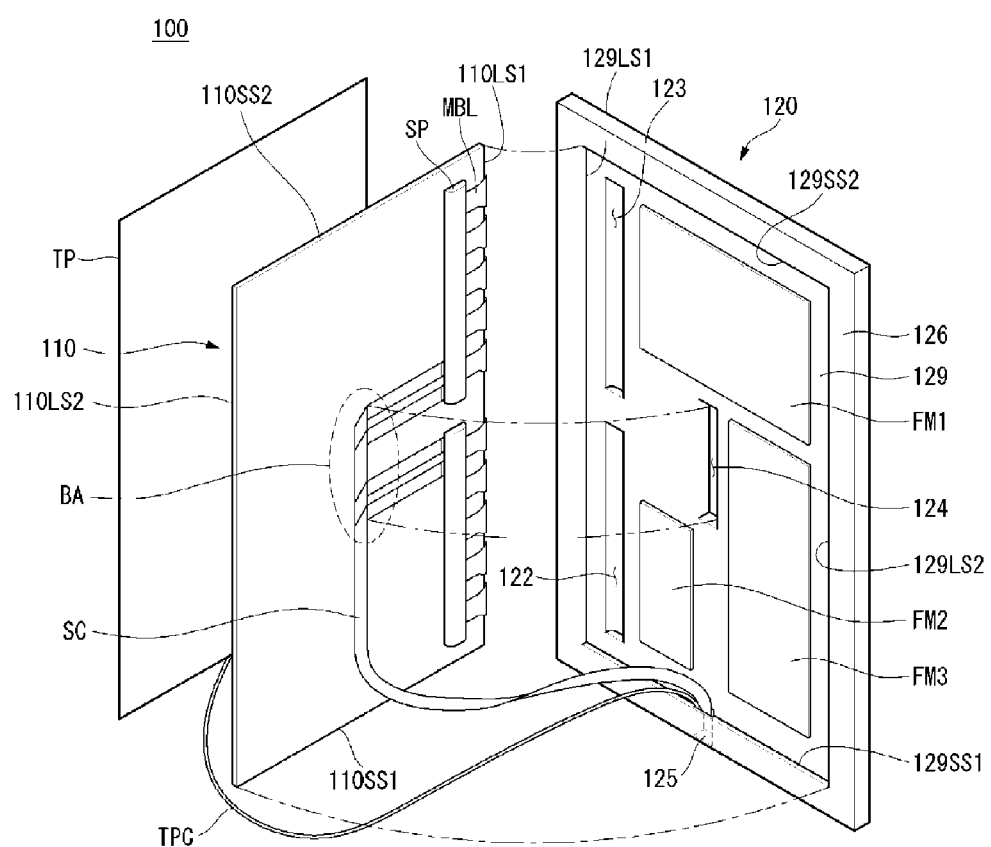
FIGS. 36, 37, 38, 39, 40, and 41 are views illustrating examples of how the components of a display device according to an exemplary embodiment of the present invention are attached to one another.

Referring to FIG. 36, the back side of the display panel 110 may be positioned to face the front side of the transparent body 120. For example, the first long side 110LS1, first short side 110SS1, second long side 110LS2, and second long side 110SS2 of the display panel 110 may face the first long side 129LS1, first short side 129SS1, second long side 129LS2, and second long side 129SS2 of the transparent board 129.

The back side of a touch panel TP may be positioned at the front side of the display panel 110. The touch panel TP may receive and detect touch input. The touch panel TP may be transparent. The touch panel TP may allow at least a part of an image displayed on the display panel 110 to pass through and be visible. The touch panel TP may correspond to the shape of the display panel 110.

A touch panel cable TPC may extend from a side of the touch panel TP. The touch panel cable TPC may be passed through the slot 125. The touch panel cable TCP may run along a side of the display panel 110, between a side of the touch panel TP and the slot 125. For example, the touch panel cable TPC may run along the first short side 110SS1 of the display panel 110. Although not shown, the touch panel cable TPC passed through the slot 125 may be electrically connected to a controller.

With the display panel 110 attached to the transparent body 120, the first long side 129LS1, first short side 129SS1, second long side 129LS2, and second long side 129SS2 of the transparent board 129 may correspond to the first long side 110LS1, first short side 110SS1, second long side 110LS2, and second long side 110SS2 of the display panel 110. For example, the PCB receiving portion 122 and 123 may be formed along the length of the first long side 110LS1 of the display panel 110. For example, the slot 125 may be formed adjacent to the first short side 110SS1 connected to the first long side 110LS1 of the display panel 110.

At least a part of the member layer MBL, PCB SP, and cable SC may be positioned on the back side of the display panel 110. When the display panel 110 and the transparent body 120 are coupled together, at least a part of the member layer MBL, PCB SP, and cable SC may be positioned between the display panel 110 and the transparent board 129. The cable SC may be passed through the slot 125.

An attachment members FM1, FM2, and FM3 may be positioned at the front of the transparent board 129. The attachment members FM1, FM2, and FM3 may have a certain thickness. For example, the thickness of the attachment members FM1, FM2, and FM3 may be greater than the thickness of the cable SC. The attachment members FM1, FM2, and FM3 may be adhesive tape or a magnet. The attachment members FM1, FM2, and FM3 may form a layer. For example, the attachment members FM1, FM2, and FM3 may be formed by stacking adhesive tape and a magnet. The attachment members FM1, FM2, and FM3 may be provided in multiple units. For example, the attachment members FM1, FM2, and FM3 may comprise a first attachment member FM1, a second attachment member FM2, and a third attachment member FM3.

The PCB receiving portion 122 and 123 positioned on the front side of the transparent board 129 may receive at least a part of the PCB SP. Since the PCB SP is received in the PCB receiving portion 122 and 123, the cable SC may be bent to extend between the PCB receiving portion 122 and 123 and the slot 125. The PCB receiving portion 122 and 123 may be shaped like a groove or a hole.

The cable receiving portion 124 positioned at the front side of the transparent board 129 may receive at least a part of the cable SC. For example, the cable receiving portion 124 may receive a bending area BA of cable SC which has a greater thickness than the rest of cable SC. The cable receiving portion 124 may be shaped like a groove or a hole.

Figure 37:
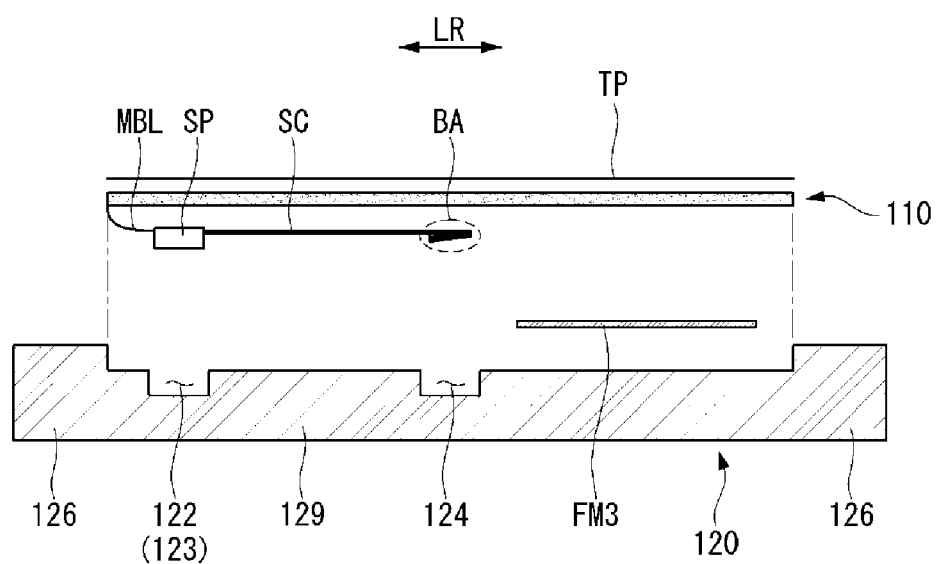

Referring to FIG. 37, a cross-sectional view of an example of how the display panel 110 and the transparent body 120 are coupled together is depicted. The member layer MBL, PCB SP, and cable SC may be positioned at the back side of the display panel 110. The touch panel TP may be positioned in front of the display panel 110.

The PCB SP may be positioned in such a way so as to be received in the PCB receiving portion 122 and 123. The bending area BA of the cable may be received in the cable receiving portion 124. The attachment member FM3 may attach or couple the display panel 110 and the transparent board 129 together.

Figure 38:
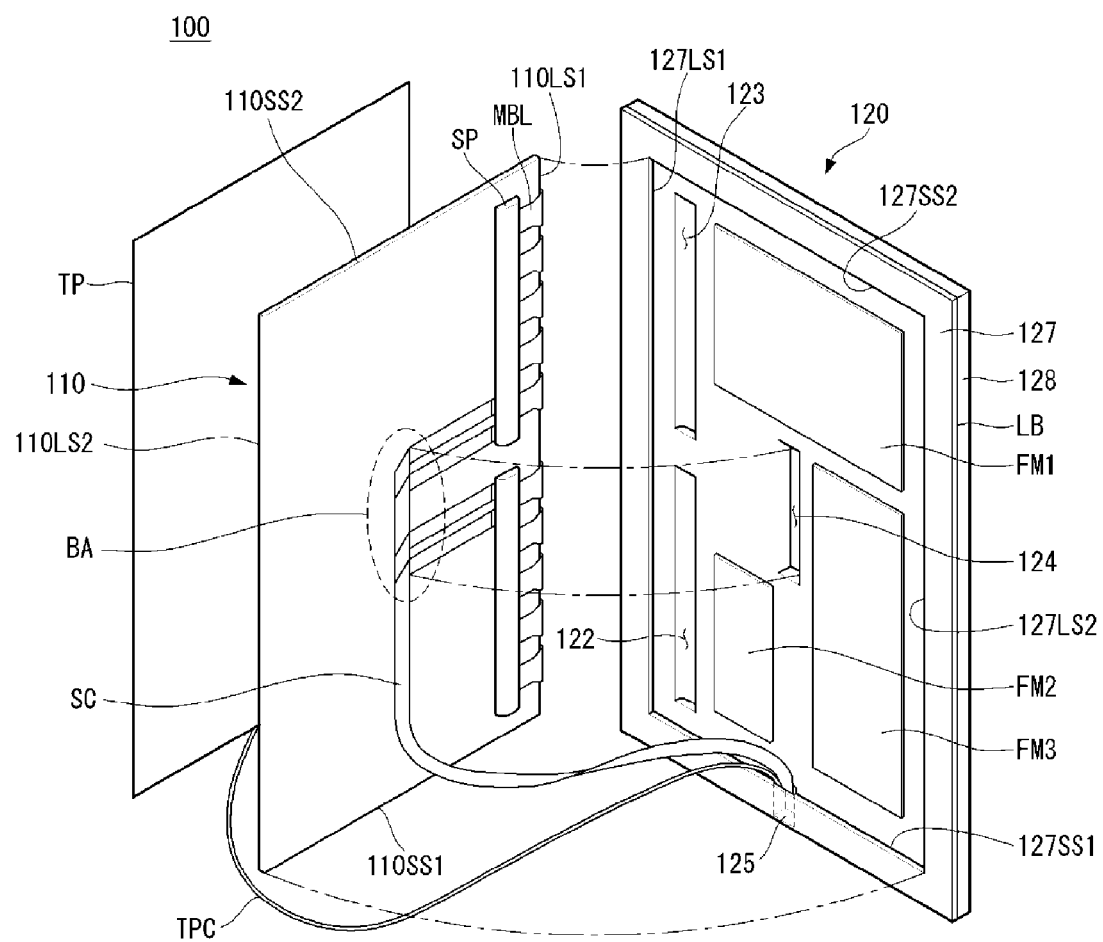

Referring to FIG. 38, the back side of the display panel 110 may be positioned to face the front side of the transparent body 120. For example, the first long side 110LS1, first short side 110SS1, second long side 110LS2, and second long side 110SS2 of the display panel 110 may face the first long side 127LS1, first short side 127SS1, second long side 127LS2, and second long side 127SS2 of the interior of the transparent frame 127.

The back side of a touch panel TP may be positioned at the front side of the display panel 110. The touch panel TP may receive and detect touch input. The touch panel TP may be transparent. The touch panel TP may allow at least a part of an image displayed on the display panel 110 to pass through and be visible. The touch panel TP may correspond to the shape of the display panel 110.

A touch panel cable TPC may extend from a side of the touch panel TP. The touch panel cable TPC may be passed through the slot 125. The touch panel cable TCP may run along a side of the display panel 110, between a side of the touch panel TP and the slot 125. For example, the touch panel cable TPC may run along the first short side SS1 of the display panel 110. Although not shown, the touch panel cable TPC passed through the slot 125 may be electrically connected to a controller.

With the display panel 110 attached to the transparent body 120, the first long side 127LS1, first short side 127SS1, second long side 127LS2, and second long side 127SS2 of the interior of the transparent frame 127 may correspond to the first long side 110LS1, first short side 110SS1, second long side 110LS2, and second long side 110SS2 of the display panel 110. For example, the PCB receiving portion 122 and 123 may be formed along the length of the first long side 110LS1 of the display panel 110. For example, the slot 125 may be formed adjacent to the first short side 110SS1 connected to the first long side 110LS1 of the display panel 110.

At least a part of the member layer MBL, PCB SP, and cable SC may be positioned on the back side of the display panel 110. When the display panel 110 and the transparent body 120 are coupled together, at least a part of the member layer MBL, PCB SP, and cable SC may be positioned between the display panel 110 and the transparent plate 128. The cable SC may be passed through the slot 125.

Attachment members FM1, FM2, and FM3 may be positioned at the front of the transparent plate 128. The attachment members FM1, FM2, and FM3 may have a certain thickness. For example, the thickness of the attachment members FM1, FM2, and FM3 may be greater than the thickness of the cable SC. The attachment members FM1, FM2, and FM3 may be adhesive tape or a magnet. The attachment members FM1, FM2, and FM3 may form a layer. For example, the attachment members FM1, FM2, and FM3 may be formed by stacking adhesive tape and a magnet. The attachment members FM1, FM2, and FM3 may be provided in multiple units. For example, the attachment members FM1, FM2, and FM3 may comprise a first attachment member FM1, a second attachment member FM2, and a third attachment member FM3.

The PCB receiving portion 122 and 123 positioned on the front side of the transparent plate 128 may receive at least a part of the PCB SP. Since the PCB SP is received in the PCB receiving portion 122 and 123, the cable SC may be bent to extend between the PCB receiving portion 122 and 123 and the slot 125. The PCB receiving portion 122 and 123 may be shaped like a groove or a hole.

The cable receiving portion 124 positioned at the front side of the transparent plate 128 may receive at least a part of the cable SC. For example, the cable receiving portion 124 may receive a bending area BA of cable SC which has a greater thickness than the rest of cable SC. The cable receiving portion 124 may be shaped like a groove or a hole.

Figure 39:
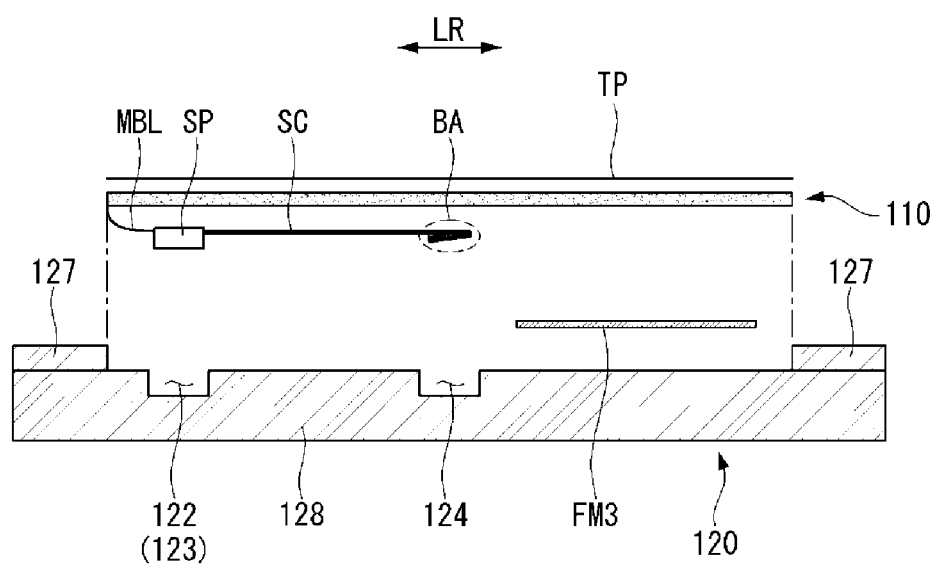

Referring to FIG. 39, a cross-sectional view of an example of how the display panel 110 and the transparent body 120 are coupled together is depicted. The member layer MBL, PCB SP, and cable SC may be positioned at the back side of the display panel 110. The touch panel TP may be positioned in front of the display panel 110.

The PCB SP may be positioned in such a way so as to be received in the PCB receiving portion 122 and 123. The bending area BA of the cable may be received in the cable receiving portion 124. The attachment member FM3 may attach or couple the display panel 110 and the transparent plate 128 together.

Figure 40:
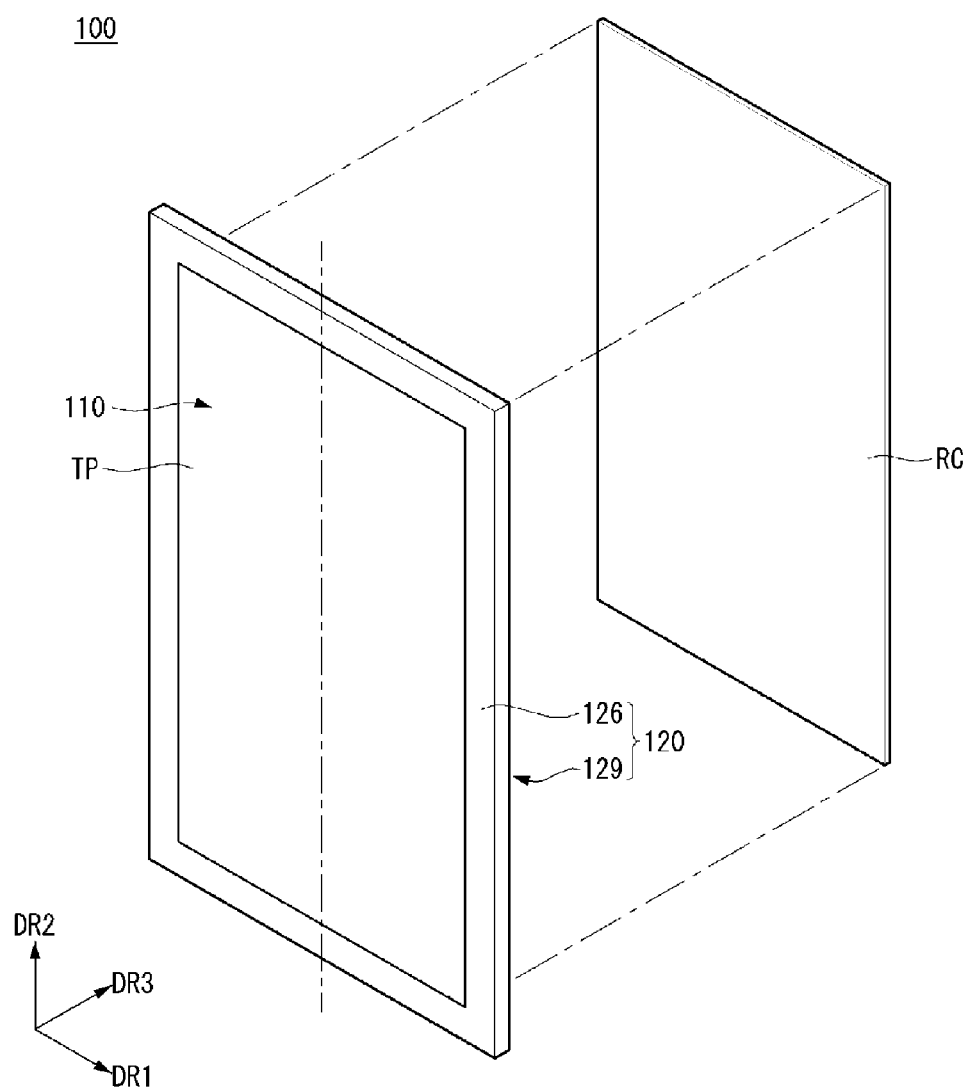

Referring to FIG. 40, a rear cover RC may be positioned at the back side of the transparent body 120. The rear cover RC may be positioned to face the back side of the transparent board 129. The rear cover RC may be fitted to the transparent flange 126. The transparent body 120 may provide space on the back side of the transparent body 120 where the rear cover RC is seated.

When the rear cover RC is coupled to the back side of the transparent board 129, opposite sides of the transparent flange 126 may face the side of the display panel 110 and the side of the rear cover RC. The rear cover RC may be thinner than the transparent flange 126. The width of the rear cover RC may correspond to the width of the transparent board 129.

The rear cover RC may have a certain amount of rigidity. The rear cover RC may enhance the rigidity of the transparent body 120 by being attached or coupled to the transparent board 129. The rear cover RC may consist of at least one material including but not limited to metal, reinforcement fiber, reinforced glass, reinforced plastic, reinforced ceramic, or carbon fiber.

Figure 41:
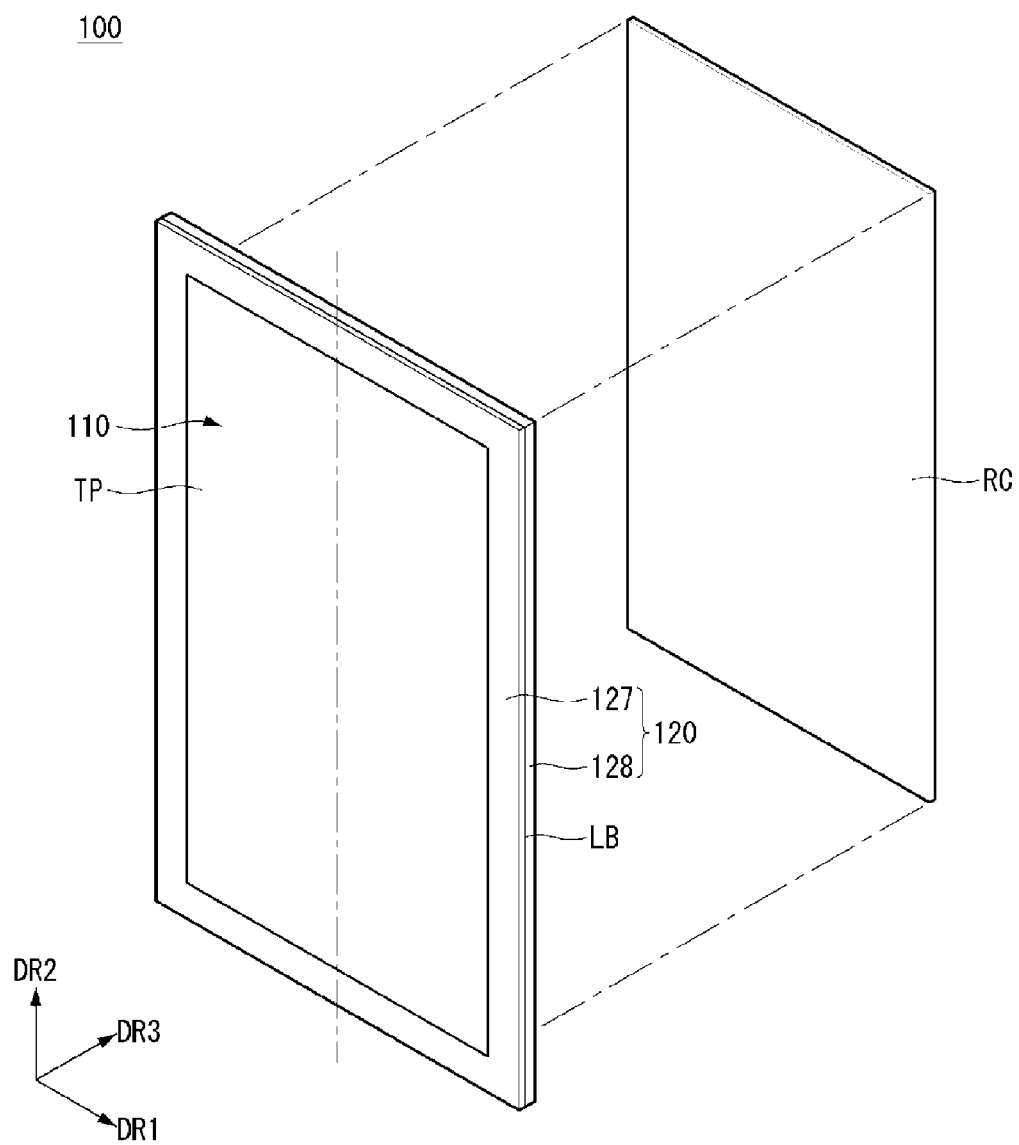

Referring to FIG. 41, a rear cover RC may be positioned at the back side of the transparent body 120. The rear cover RC may be attached or coupled to the back side of the transparent plate 128. The rear cover RC may be received at the back side of the transparent plate 128. The transparent plate 128 may provide space for receiving the rear cover RC at the back side. In this case, a stepped portion may be formed on the back side of the transparent plate 128 to correspond to the rear cover RC.

When the rear cover RC is attached or coupled to the back side of the transparent plate 128, the transparent plate 128 may face the side of the rear cover RC. The width of the rear cover RC may correspond to the width of the display panel 110. The rear cover RC may be thinner than the transparent plate 128. The rear cover RC may enhance the rigidity of the transparent body 120 by being attached or coupled to the transparent plate 128.

FIGS. 42 to 48 are views illustrating various examples of a cross-section of a display device according to exemplary embodiments of the present invention.

Figure 42:
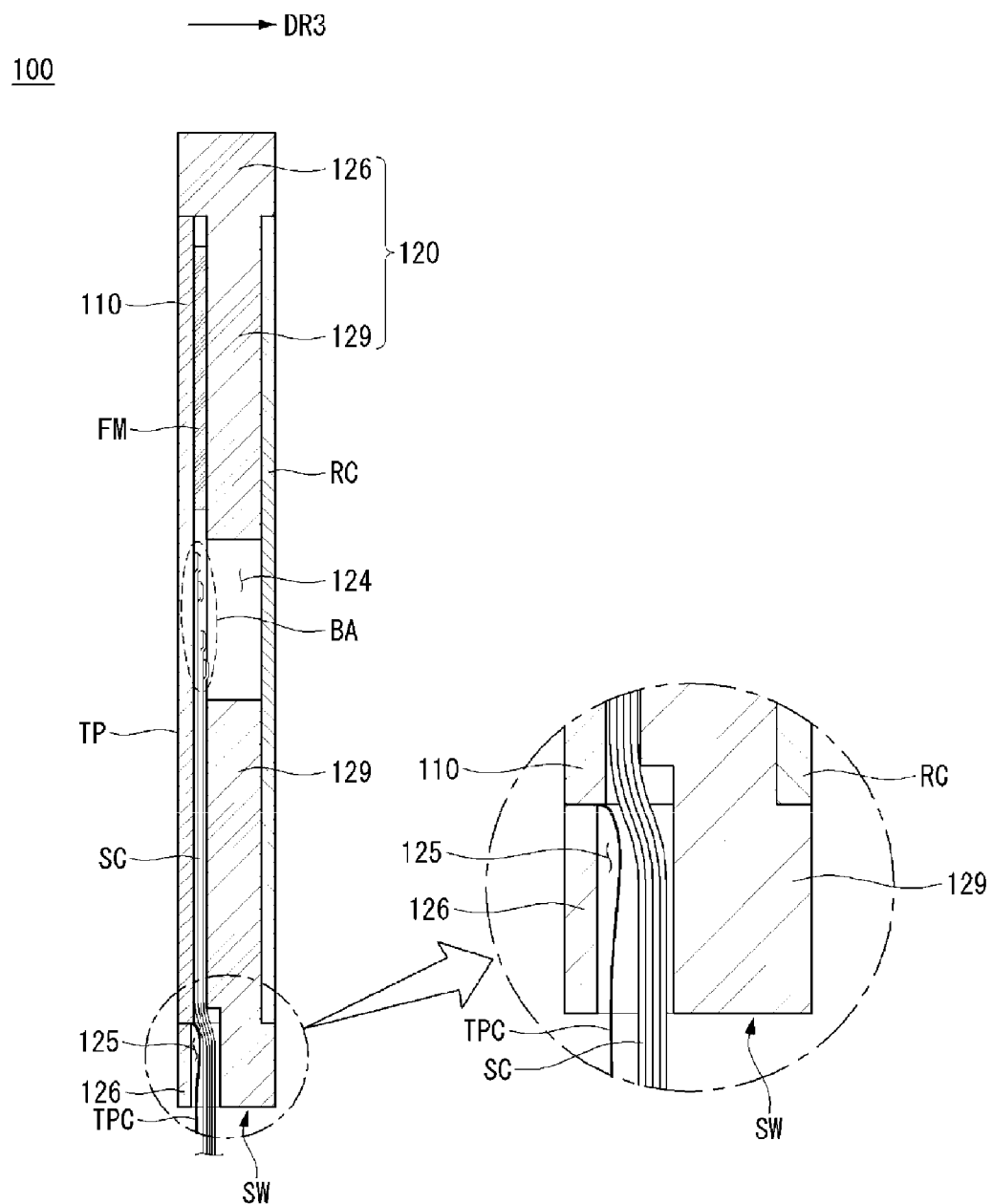
FIGS. 42, 43, 44, 45, 46, 47, and 48 are views illustrating various examples of a cross-section of a display device according to an exemplary embodiment of the present invention.

Referring to FIG. 42, the display panel 110 may be attached to the transparent board 129 by an attachment member FM. The display panel 110 may be fitted to the transparent flange 126. The rear cover RC may be attached to the back side of the transparent body 120. The transparent body 120 may have a stepped portion on the back side to receive the rear cover RC. The touch panel TP may be positioned in front of the display panel 110.

A cable SC extended from a side of the display panel 110 may have a bending area BA on the back side of the display panel 110 where the cable SC is bent. The cable SC may be thickest in the bending area BA, and the cable SC in the bending area BA may be received in the cable receiving portion 124 formed on a side of the transparent board 129. The thickness of the cable SC positioned between the display panel 110 and the transparent board 129 may correspond to the thickness of the attachment member FM.

The cable SC may be bent at a region corresponding to the cable receiving portion 124. That is, the cable SC may be extended from a side of the display panel 110 to the cable receiving portion 124, bent at a region corresponding to the cable receiving portion 124, and inserted into the slot 125. The slot 125 may open towards the outside of the sidewall SW of the transparent body 120.

The cable SC may be bent as it enters the slot 125. The part that is bent as the cable SC enters the slot 125 may be short in length. In the area from the cable receiving portion 124 to the slot 125, the cable SC may be subjected to pressure since it is positioned between the display panel 110 and the transparent board 129. The pressure on the cable SC from the transparent board 129 may decrease or disappear as it enters the slot 125. Due to this, the cable SC may be bent towards the back of the transparent board 129 as it enters the slot 125.

The cable SC may pass through the slot 125 and make its way out of the sidewall SW of the transparent body 120. For example, the cable SC may pass through the slot 125 and come out of the bottom of the transparent body 120. The cable SC making its way out of the sidewall SW of the transparent body 120 may be electrically connected to a controller (not shown).

The touch panel cable TPC may be extended from a side of the touch panel TP and pass through the slot 125. The touch panel cable TPC may make its way out of the sidewall SW of the transparent body 120 once it has passed through the slot 125. The touch panel cable TPC making its way out of the sidewall SW of the transparent body 120 may be electrically connected to a controller (not shown).

Figure 43:
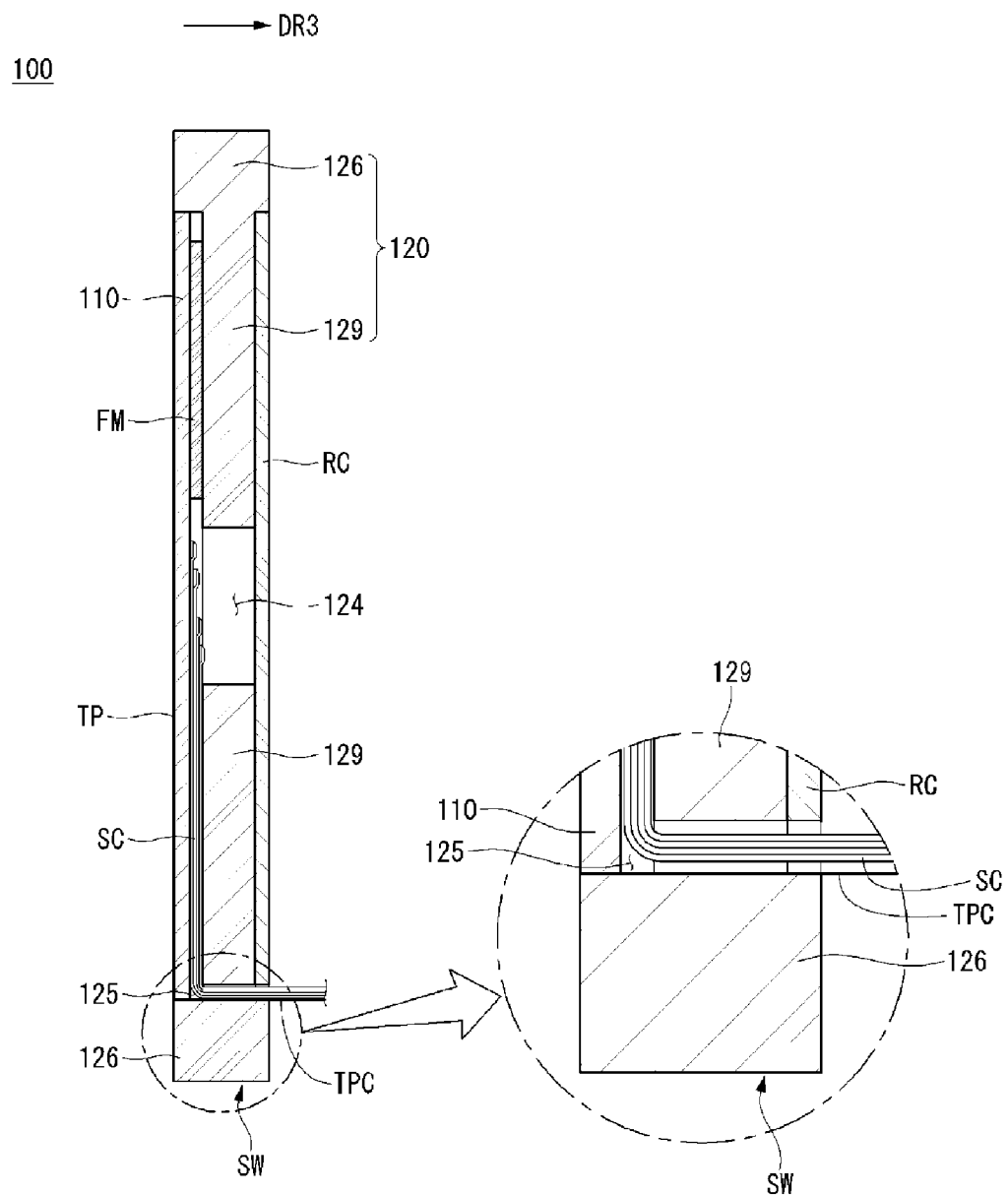

Referring to FIG. 43, the display panel 110 may be attached to the transparent board 129 by an attachment member FM. The display panel 110 may be fitted to the transparent flange 126. The touch panel TP may be positioned in front of the display panel 110.

A cable SC extended from a side of the display panel 110 may have a bending area BA on the back side of the display panel 110 where the cable SC is bent. The cable SC may be bent at a region corresponding to the cable receiving portion 124. That is, the cable SC may be extended from a side of the display panel 110 to the cable receiving portion 124, bent at a region corresponding to the cable receiving portion 124, and inserted into the slot 125.

The slot 125 may open towards the back of the transparent body 120. The cable SC may pass through the slot 125 and make its way towards the back of the transparent body 120. The cable SC making its way out of the sidewall SW of the transparent body 120 may be electrically connected to a controller (not shown).

The touch panel cable TPC may be extended from a side of the touch panel TP and pass through the slot 125. The touch panel cable TPC may make its way towards the back of the transparent body 120 once it has passed through the slot 125. The touch panel cable TPC making its way towards the back of the transparent body 120 may be electrically connected to a controller (not shown).

Figure 44:
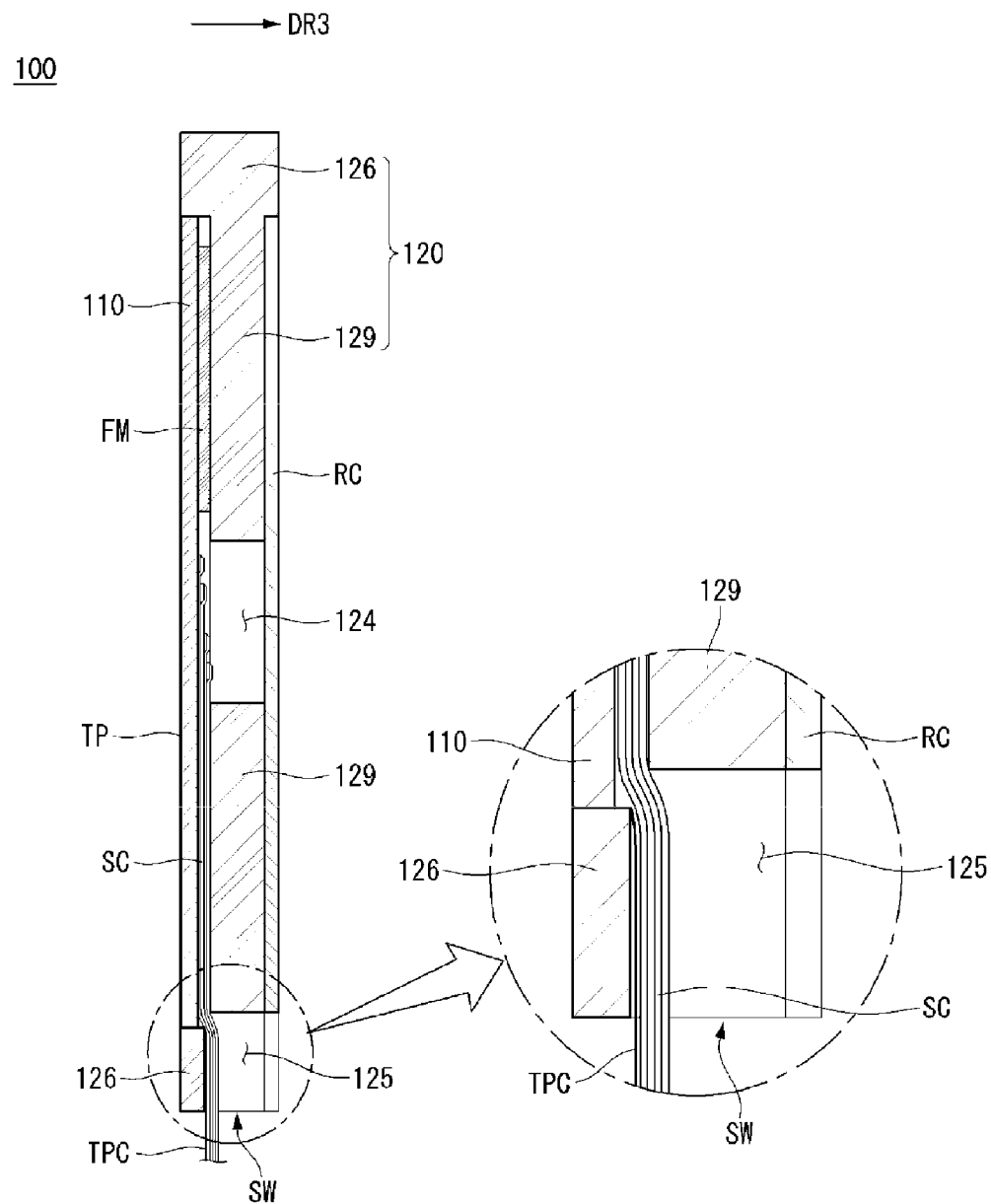

Referring to FIG. 44, the display panel 110 may be attached to the transparent board 129 by an attachment member FM. The display panel 110 may be fitted to the transparent flange 126. The touch panel TP may be positioned in front of the display panel 110.

A cable SC extended from a side of the display panel 110 may have a bending area BA on the back side of the display panel 110 where the cable SC is bent. The cable SC may be bent at the cable receiving portion 124. That is, the cable SC may be extended from a side of the display panel 110 to the cable receiving portion 124, bent at a region corresponding to the cable receiving portion 124, and inserted into the slot 125. The cable SC may be bent towards the back of the transparent board 129 as it enters the slot 125.

The slot 125 may open towards the back of the transparent body 120 and the outside of the sidewall SW. The cable SC may pass through the slot 125 and make its way towards the back of the transparent body 120 and the outside of the sidewall SW. The cable SC making its way towards the back of the transparent body 120 and the outside of the sidewall SW may be electrically connected to a controller (not shown).

The touch panel cable TPC may be extended from a side of the touch panel TP and pass through the slot 125. The touch panel cable TPC may make its way towards the back of the transparent body 120 and to the outside of the sidewall SW once it has passed through the slot 125. The touch panel cable TPC making its way towards the back of the transparent body 120 and the outside of the sidewall SW may be electrically connected to a controller (not shown).

Figure 45:
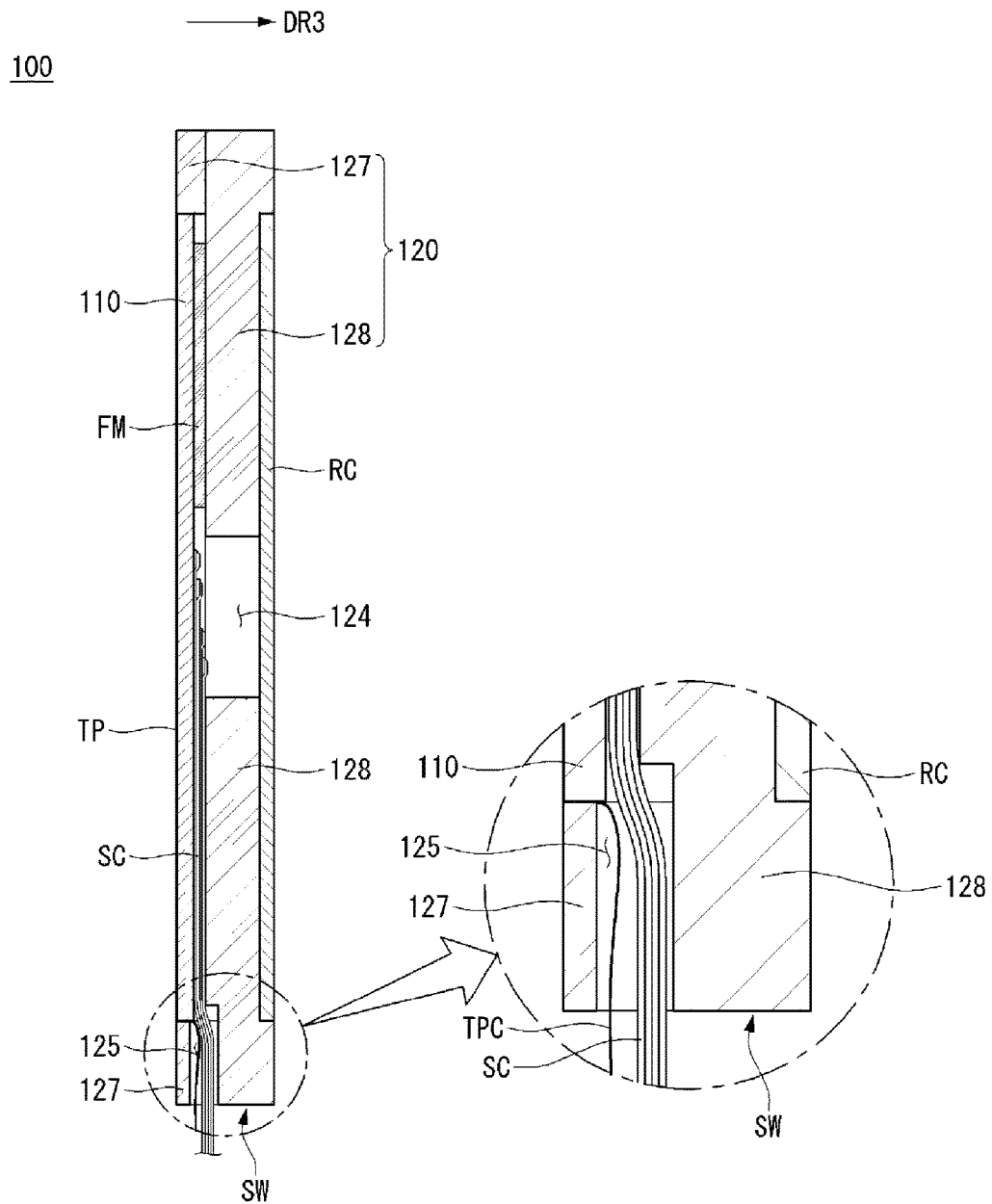

Referring to FIG. 45, the display panel 110 may be attached to the transparent plate 128 by an attachment member FM. The display panel 110 may be fitted to the transparent frame 127. The touch panel TP may be positioned in front of the display panel 110. The rear cover RC may be attached to the back side of the transparent plate 128. The transparent plate 128 may have a stepped portion on the back side to receive the rear cover RC.

A cable SC extended from a side of the display panel 110 may have a bending area BA on the back side of the display panel 110 where the cable SC is bent. The cable SC may be thickest in the bending area BA, and the cable SC in the bending area BA may be received in the cable receiving portion 124 formed on a side of the transparent plate 128. The thickness of the cable SC positioned between the display panel 110 and the transparent plate 128 may correspond to the thickness of the attachment member FM.

The cable SC may be bent at a region corresponding to the cable receiving portion 124. That is, the cable SC may be extended from a side of the display panel 110 to the cable receiving portion 124, bent at the cable receiving portion 124, and inserted into the slot 125. The slot 125 may open towards the outside of the sidewall SW of the transparent body 120. The slot 125 may be formed by attaching the transparent frame 127 and the transparent plate 128 after a groove is formed on each of them as previously discussed.

The cable SC may be bent as it enters the slot 125. The part that is bent as the cable SC enters the slot 125 may be short in length. In the area from the cable receiving portion 124 to the slot 125, the cable SC is subjected to pressure since it is positioned between the display panel 110 and the transparent plate 128. The pressure on the cable SC from the transparent plate 128 may decrease or disappear as it enters the slot 125. Due to this, the cable SC may be bent towards the back of the transparent plate 128 as it enters the slot 125.

The cable SC may pass through the slot 125 and make its way out of the sidewall SW of the transparent body 120. For example, the cable SC may pass through the slot 125 and come out of the bottom of the transparent body 120. The cable SC making its way out of the sidewall SW of the transparent body 120 may be electrically connected to a controller (not shown).

The touch panel cable TPC may be extended from a side of the touch panel TP and pass through the slot 125. The touch panel cable TPC may make its way out of the sidewall SW of the transparent body 120 once it has passed through the slot 125. The touch panel cable TPC making its way out of the sidewall SW of the transparent body 120 may be electrically connected to a controller (not shown).

Figure 46:
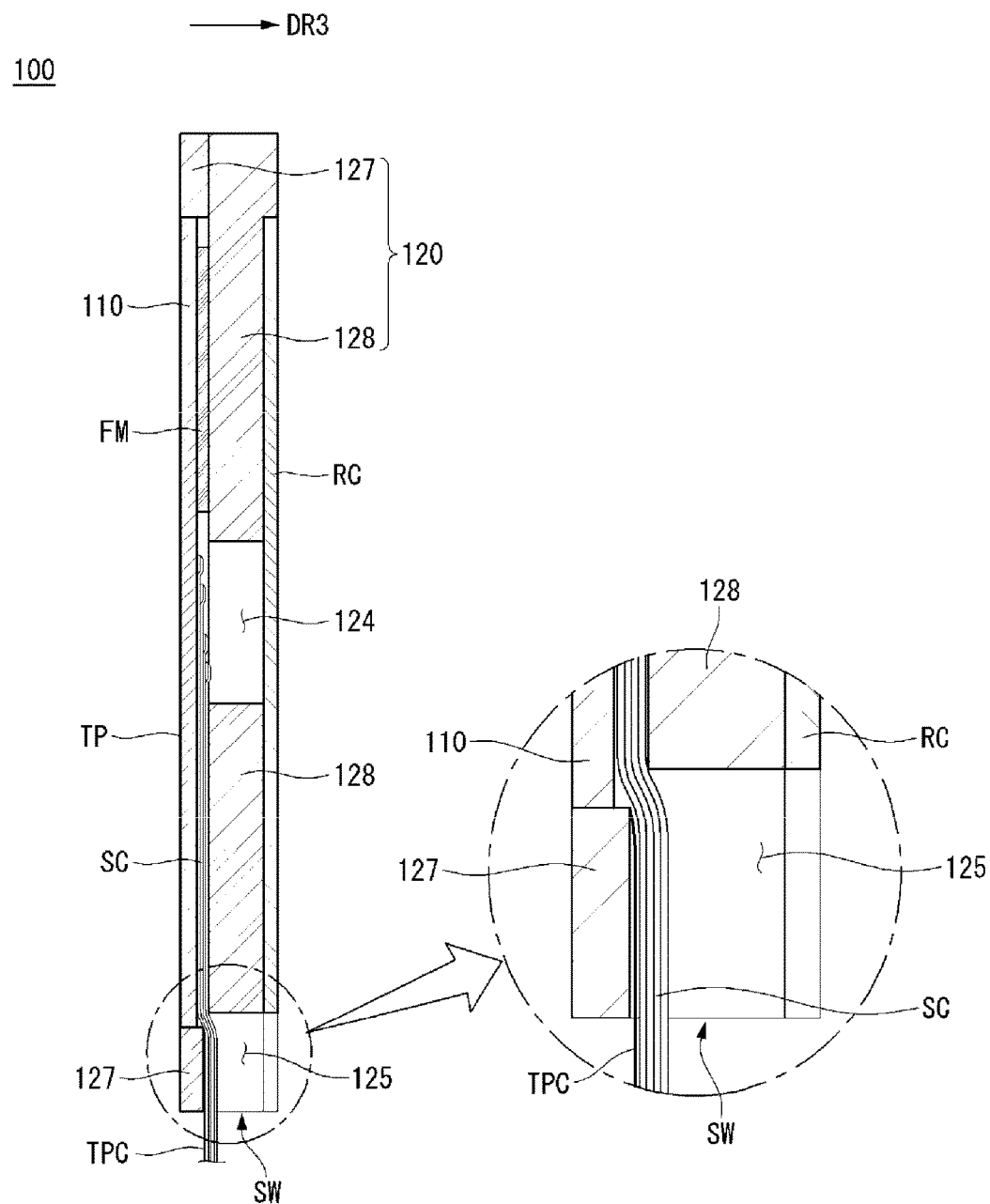

Referring to FIG. 46, the display panel 110 may be attached to the transparent plate 128 by an attachment member FM. The display panel 110 may be fitted to the transparent frame 127. The touch panel TP may be positioned in front of the display panel 110. The rear cover RC may be attached to the back side of the transparent plate 128. The transparent plate 128 may have a stepped portion on the back side to receive the rear cover RC.

A cable SC extended from a side of the display panel 110 may have a bending area BA on the back side of the display panel 110 where the cable SC is bent. The cable SC in the bending area BA may be received in the cable receiving portion 124 formed on a side of the transparent plate 128. The cable SC may be extended from a side of the display panel 110 to the cable receiving portion 124, bent at the cable receiving portion 124, and inserted into the slot 125. The slot 125 may open towards the back of the transparent body 120 and the outside of the sidewall SW. The slot 125 may be formed by bonding the transparent frame 127 to a transparent plate 128 on which a bay-shaped bend is located.

The cable SC may be bent as it enters the slot 125. The part that is bent as the cable SC enters the slot 125 may be short in length. In the area from the cable receiving portion 124 to the slot 125, the cable SC is subjected to pressure since it is positioned between the display panel 110 and the transparent plate 128. The pressure on the cable SC from the transparent board 129 may decrease or disappear as it enters the slot 125. Due to this, the cable SC may be bent towards the back of the transparent plate 128 as it enters the slot 125.

The cable SC may pass through the slot 125 and make its way out of the sidewall SW of the transparent body 120 and/or backwards of the transparent body 120. For example, the cable SC may pass through the slot 125 and come out of the bottom of the transparent body 120. The cable SC making its way out of the transparent body 120 may be electrically connected to a controller (not shown).

The touch panel cable TPC may be extended from a side of the touch panel TP and pass through the slot 125. The touch panel cable TPC may make its way out of the sidewall SW of the transparent body 120 and/or backwards of the transparent body 120 once it has passed through the slot 125. The touch panel cable TPC making its way out of the transparent body 120 may be electrically connected to a controller (not shown).

Figure 47:
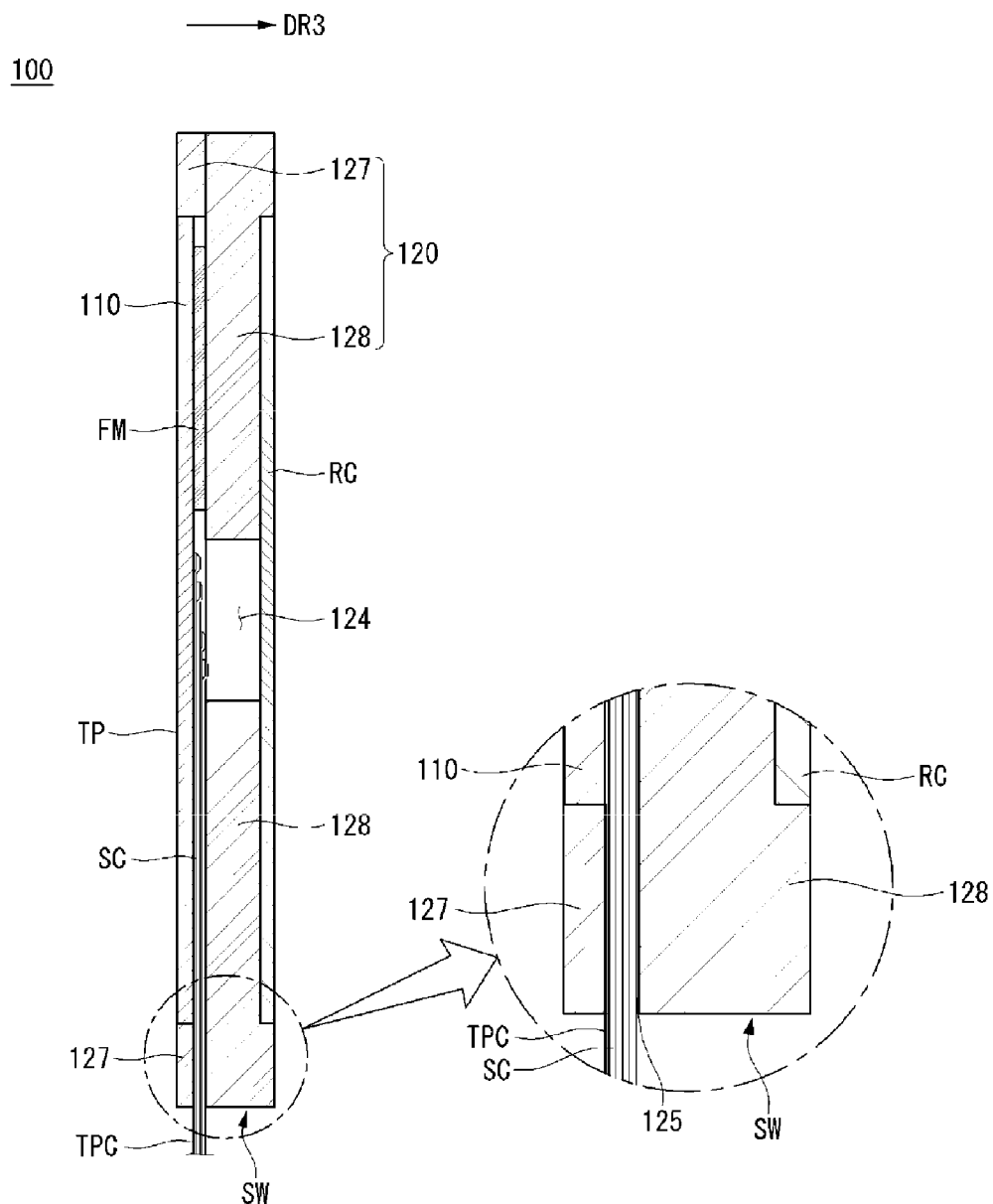

Referring to FIG. 47, the display panel 110 may be attached to the transparent plate 128 by an attachment member FM. The display panel 110 may be fitted to the transparent frame 127. The touch panel TP may be positioned in front of the display panel 110. The rear cover RC may be attached to the back side of the transparent plate 128. The transparent plate 128 may have a stepped portion on the back side to receive the rear cover RC.

The cable SC may be extended from a side of the display panel 110 to the cable receiving portion 124, bent at a region corresponding to the cable receiving portion 124, and inserted into the slot 125. The slot 125 may open towards the outside of the sidewall SW of the transparent body 120. The slot 125 may be formed by bonding the transparent plate 128 to a transparent frame 127 with a groove in it.

The cable SC may pass through the slot 125 and make its way out of the sidewall SW of the transparent body 120. For example, the cable SC may pass through the slot 125 and come out of the bottom of the transparent body 120. The cable SC making its way out of the transparent body 120 may be electrically connected to a controller (not shown).

The touch panel cable TPC may be extended from a side of the touch panel TP and pass through the slot 125. The touch panel cable TPC may make its way out of the sidewall SW of the transparent body 120 once it has passed through the slot 125. The touch panel cable TPC making its way out of the transparent body 120 may be electrically connected to a controller (not shown).

Figure 48:
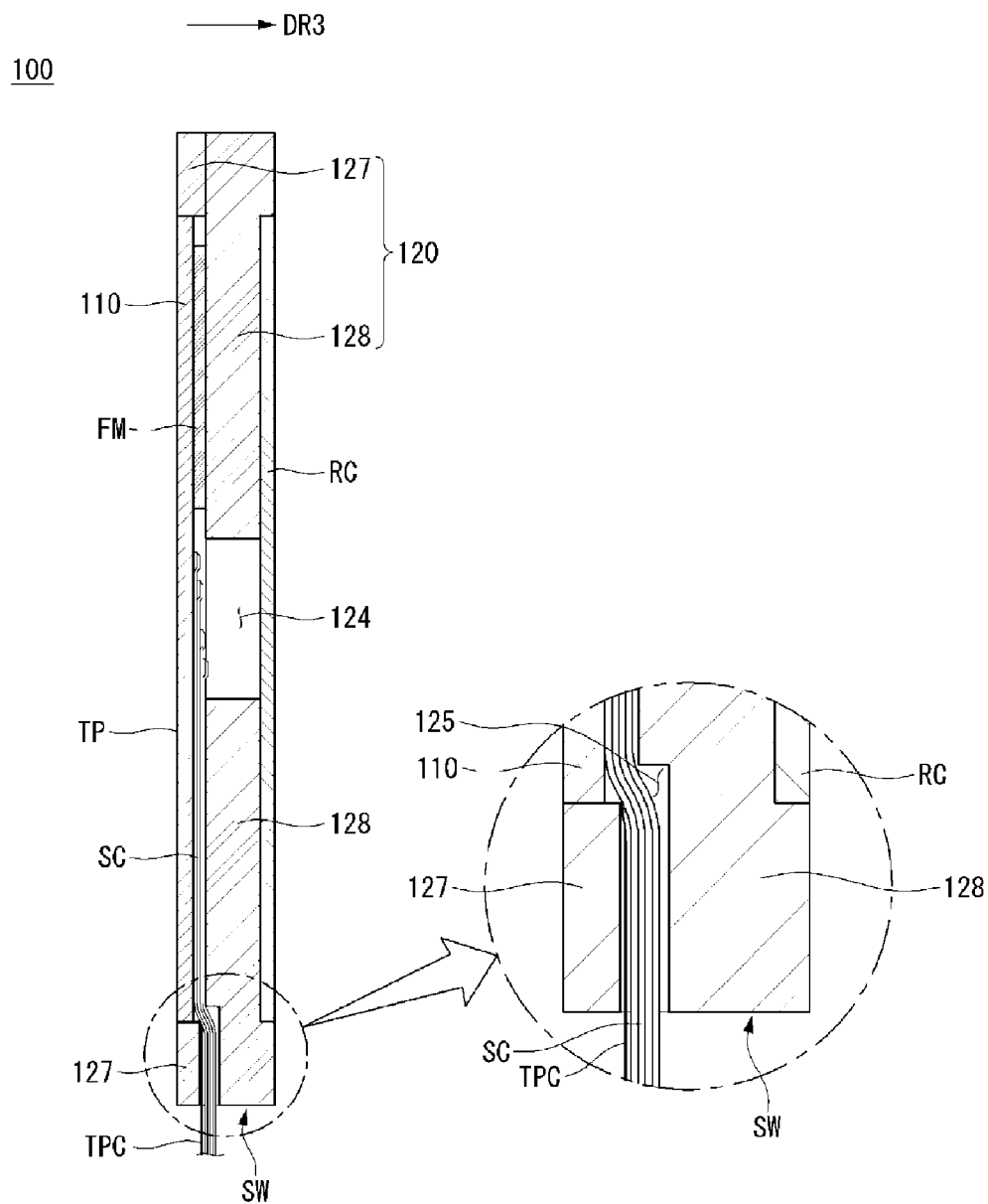

Referring to FIG. 48, the display panel 110 may be attached to the transparent plate 128 by an attachment member FM. The display panel 110 may be fitted to the transparent frame 127. The touch panel TP may be positioned in front of the display panel 110. The rear cover RC may be attached to the back side of the transparent plate 128. The transparent plate 128 may have a stepped portion on the back side to receive the rear cover RC.

The cable SC may be extended from a side of the display panel 110 to the cable receiving portion 124, bent at the cable receiving portion 124, and inserted into the slot 125. The cable SC may be bent as it enters the slot 125. The slot 125 may open towards the outside of the sidewall SW of the transparent body 120. The slot 125 may be formed by bonding the transparent frame 127 to a transparent plate 128 with a groove in it.

The cable SC may pass through the slot 125 and make its way out of the sidewall SW of the transparent body 120. For example, the cable SC may pass through the slot 125 and come out of the bottom of the transparent body 120. The cable SC making its way out of the transparent body 120 may be electrically connected to a controller (not shown).

The touch panel cable TPC may be extended from a side of the touch panel TP and pass through the slot 125. The touch panel cable TPC may make its way out of the sidewall SW of the transparent body 120 once it has passed through the slot 125. The touch panel cable TPC making its way out of the transparent body 120 may be electrically connected to a controller (not shown).

Figure 49:
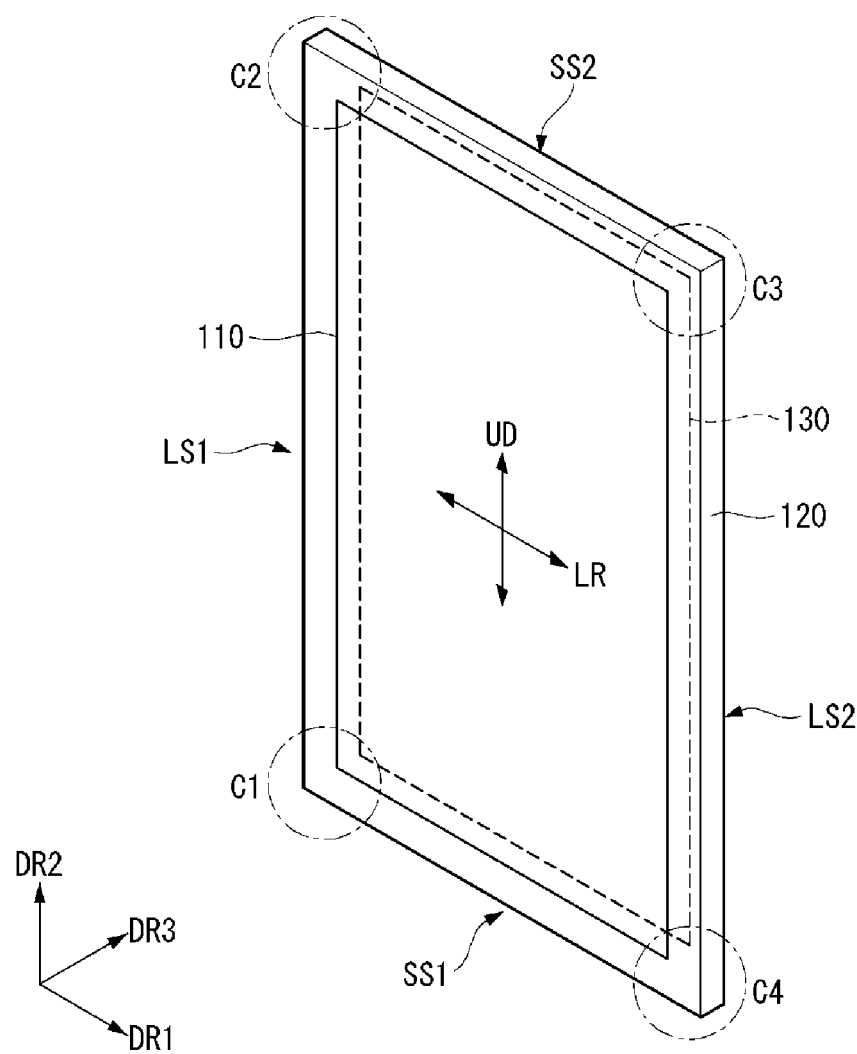
FIGS. 49 and 50 are views illustrating examples of a display device according to an exemplary embodiment of the present invention.
Figure 50:
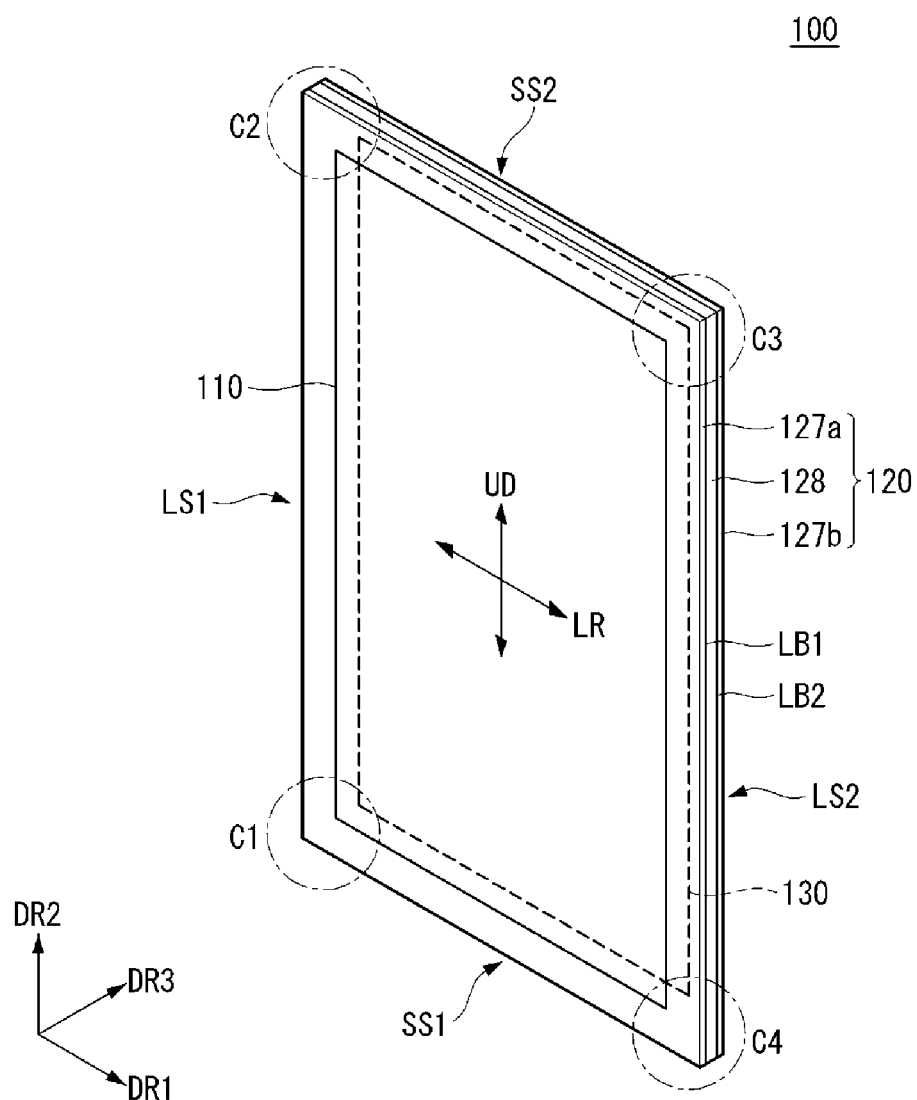

FIGS. 49 and 50 are views illustrating examples of a display device according to an exemplary embodiment of the present invention.

Referring to FIG. 49, a first display panel 110 may be visible on the front of the display device 100. The first display panel 110 may provide an image towards the front of the display device 100. A transparent body 120 may be positioned on the back of the first display panel 110.

A second display panel 130 may be visible on the back of the display device 100. The second display panel 130 may provide an image towards the back of the display device 100. The second display panel 130 may be positioned on the back of the transparent body 120.

The display device 100 may have a plurality of display panels on the front and back sides. The display device 100 may display the same image simultaneously on the two sides. Alternatively, the display device 100 display different images on the front and back sides. The display panel 110 and 130 may refer to at least one of the first and second display panels 110 and 130.

The transparent body 120 may receive the display panel 110 and 130. The transparent body 120 may face the side of the display panel 110 and 130. The transparent body 120 may fix the display panel 110 and 130. The transparent body 120 may be connected or fixed externally. For example, the transparent body 120 may be hung or mounted on a ceiling. For example, the transparent body 120 may be connected or fixed to the upper side of an external structure. For example, the transparent body 120 may be connected or fixed to the side of an external structure. For example, the transparent body 120 may be positioned between external structures.

The part of the transparent body 120 facing the side of the display panel 110 and 130 may extend from the part of the transparent body 120 facing the back side of the display panel 110 and 130. The direction the back side of the first display panel 110 faces may be opposite to the direction the back side of the second display panel 130 faces. That is, the direction the back side of the first display panel 110 may be the direction the front side of the second display panel 130 faces. As used herein, the terms "front" and "back" do not represent absolute directions, and may vary with the type of the display panel 110 and 130. For example, the direction the front side of the first display panel 110 faces may be the direction the front side of the display device 100 faces. For example, the direction the front side of the second display panel 130 faces may be the direction the back side of the display device 100 faces.

The part of the transparent body 120 facing the side of the display panel 110 and 130 and the part of the transparent body 120 facing the back side of the display panel 110 and 130 may be formed integrally, for example, as shown in FIG. 1. The part of the transparent body 120 facing the side of the display panel 110 and 130 and the part of the transparent body 120 facing the back side of the display panel 110 and 130 may be distinguished from each other, for another example, as shown in FIG. 2.

Referring to FIG. 50, a first transparent frame 127a may face the side of the first display panel 110. A transparent plate 128 may be attached to the first transparent frame 127a. The first transparent frame 127a may be in such a shape that it extends from a surface of the transparent plate 128. Here, a surface of the transparent plate 128 may face the back side of the first display panel 110. A first boundary line LB1 may be formed between the first transparent frame 127a and the transparent plate 128.

A second transparent frame 127b may face the side of the second display panel 130. The transparent plate 128 may be attached to the second transparent frame 127b. The second transparent frame 127b may be in such a shape that it extends from another surface of the transparent plate 128. Here, the another surface of the transparent plate 128 may face the back side of the second display panel 130. A second boundary line LB2 may be formed between the second transparent frame 127b and the transparent plate 128.

A boundary line may refer to at least one of the first and second boundary lines LB1 and LB2. A frame 127 may refer to at least one of the first and second transparent frames 127a and 127b.

Figure 51:
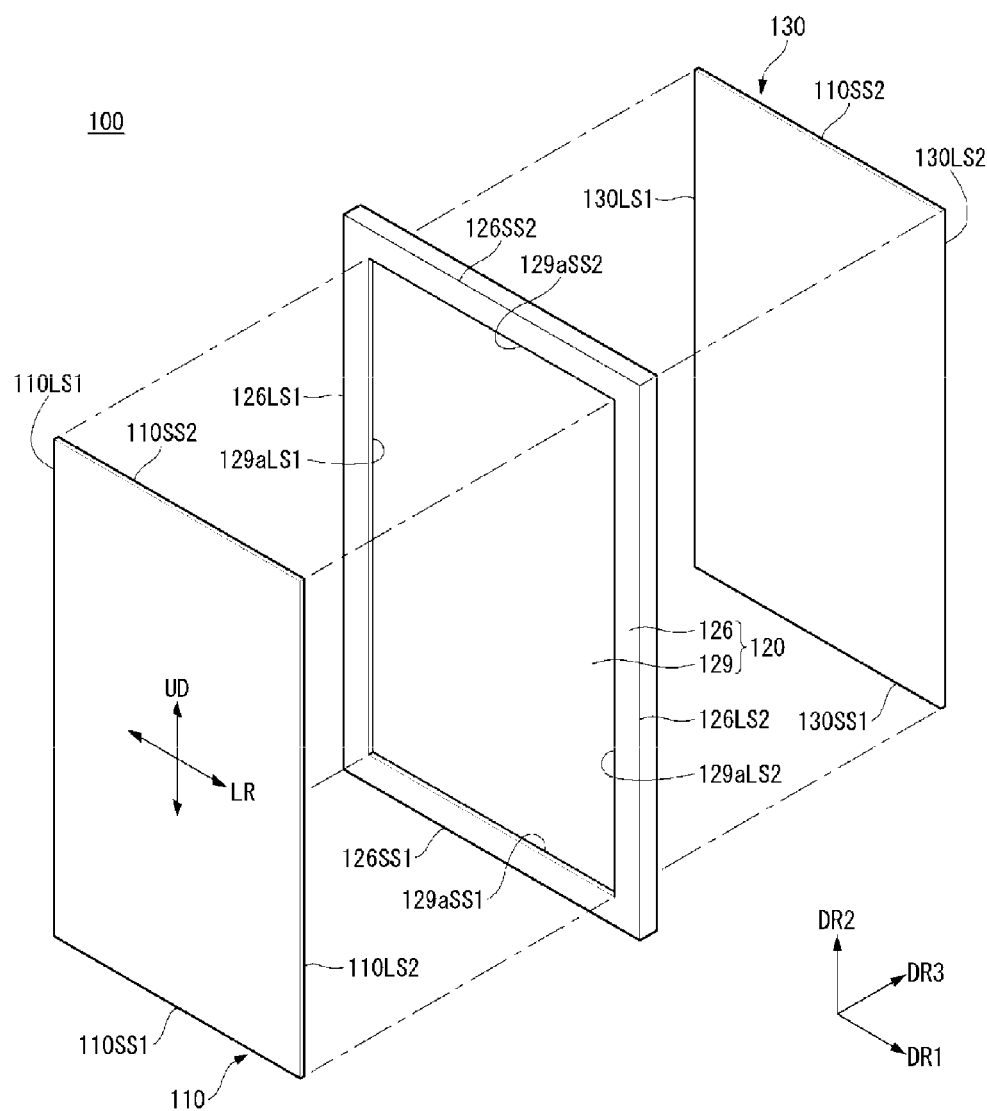
FIGS. 51 and 52 are views illustrating examples of the configuration of a display device according to an exemplary embodiment of the present invention.
Figure 52:
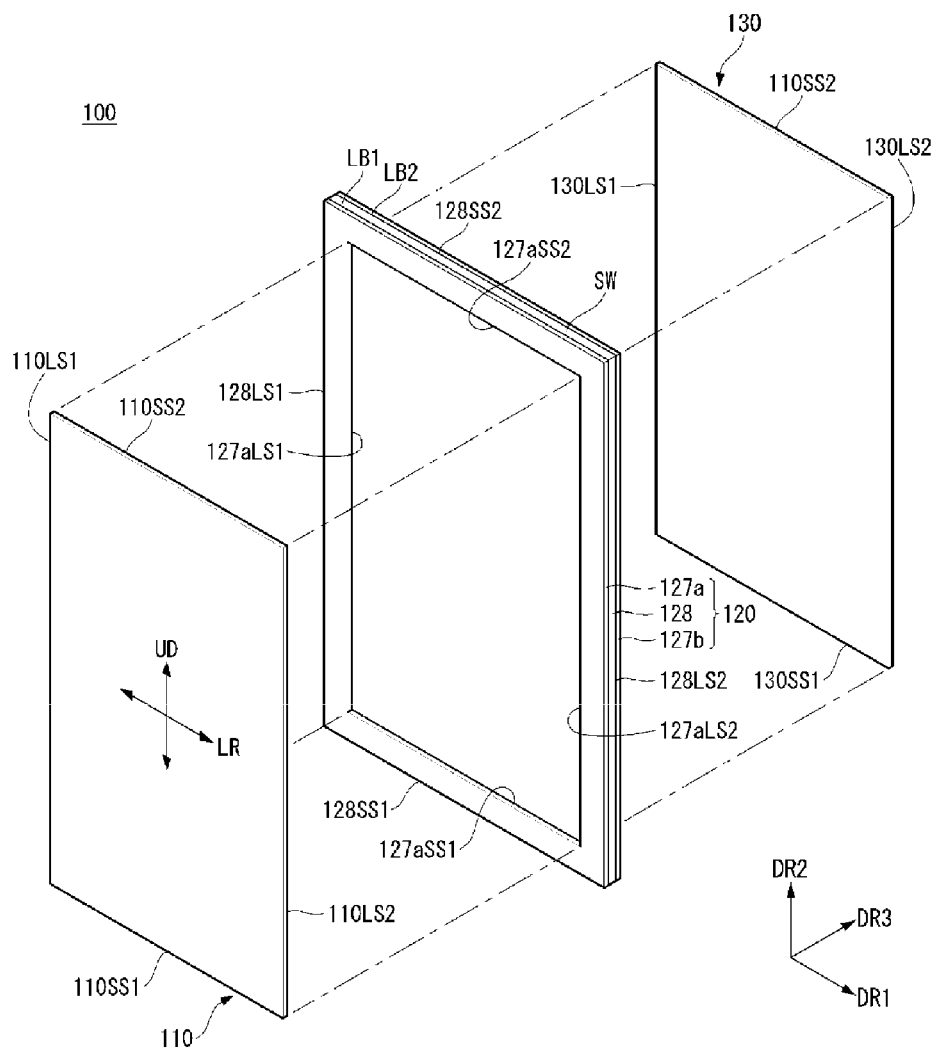

FIGS. 51 and 52 are views illustrating examples of the configuration of a display device according to an exemplary embodiment of the present invention.

Referring to FIG. 51, a surface of the first display panel 110 may be visible on the front of the display device 100. A surface or the front side of the display panel 110 may display an image. A surface of the second display panel 130 may be visible on the back of the display device 100. A surface or the front side of the second display panel 130 may display an image.

The display panel 110 and 130 may be divided into an active area AA where an image is displayed and an inactive area IA where no image is displayed.

The first display panel 110 may be positioned in front of the transparent body 120. The second display panel 130 may be positioned on the back side of the transparent body 130. That is, the transparent body 120 may be positioned between the first display panel 110 and the second display panel 130. The side of the display panel 110 and 130 may be covered by the transparent body 120. The display panel 110 and 130 may be attached to the transparent body 120. The display panel 110 and 130 may be detachable from the transparent body 120. The display panel 110 and 130 may be flexible. The display panel 110 and 130 may obtain a certain amount of rigidity from the transparent body 120.

The first display panel 110 may have a first long side 110LS1, a second long side 110LS2, a first short side 110SS1, and a second short side 110SS2. The second display panel 130 may have a first long side 130LS1, a second long side 130LS2, a first short side 130SS1, and a second short side 130SS2.

The first long side 130LS1, second long side 130LS2, first short side 130SS1, and second short side 130SS2 of the second display panel 130 may be adjacent or parallel to the first long side 110LS1, second long side 110LS2, first short side 110SS1, and second short side 110SS2 of the first display panel 110.

The transparent body 120 may be divided into a transparent flange 126 facing the side of the display panel 110 and 130 and a transparent board 129 facing the back side of the display panel 110 and 130. The transparent flange 126 and the transparent board 129 may be formed integrally. The transparent board 129 may be positioned between the first display panel 110 and the second display panel 130.

The transparent board 129 may face the back side of the display panel 110 and 130. A surface of the transparent board 129 facing the back side of the first display panel 110 may be referred to as the front side of the transparent board 129. Another surface of the transparent board 129 facing the back side of the second display panel 130 may be referred to as the back side of the transparent board 129.

The transparent board 129 may correspond to the shape of the display panel 110 and 130. For example, a first long side 129aLS1, second long side 129aLS2, first short side 129aSS1, and second short side 129aSS2 of the front of the transparent board 129 may correspond to the first long side 110LS1, second long side 110LS2, first short side 110SS1, and second short side 110SS2 of the first display panel 110. For example, the four sides of the back of the transparent board 129 may correspond to the four sides of the second display panel 130, respectively.

The side of the transparent board 129 may be covered by the transparent flange 126. For example, the first long side 129aLS1, second long side 129aLS2, first short side 129aSS1, and second short side 129aSS2 of the front of the transparent board 129 may be positioned on the interior of the transparent body 120.

The transparent flange 126 may be shaped to cover the display panel 110 and 130. The transparent flange 126 may have sides corresponding to the sides of the transparent board 129. For example, a first long side 126LS1, second long side 126LS2, first short side 126SS1, and second short side 126SS2 of the transparent flange 126 may be adjacent or parallel to the first long side 129aLS1, second long side 129aLS2, first short side 129aSS1, and second short side 129aSS2 of the front of the transparent board 129, respectively.

The transparent body 120 may have sidewalls SW. The sidewalls SW may be positioned on the first long side 126LS1, second long side 126LS2, first short side 126SS1, and second short side 126SS2 of the transparent flange 126.

The length of the first long side 110LS1 of the first display panel 110 may be only slightly shorter than the length of the first long side 129aLS1 of the front of the transparent board 129. The length of the first short side 110SS1 of the first display panel 110 may be only slightly shorter than the length of the first short side 129aSS1 of the front of the transparent board 129. The relationship between the length of each side of the second display panel 130 and the length of each side of the back of the transparent board 129 may be the same as the relationship between the length of each side of the first display panel 110 and the length of each side of the front of the transparent board 129.

The display panels and 110 and 130 may be fixed to the transparent board 129. The display panel 110 and 130 may be attached to the transparent board 129 by magnetic force. The display panel 110 and 130 may be fitted to the transparent flange 126.

Referring to FIG. 52, the first transparent frame 127a may be shaped to cover the first display panel 110. The interior of the first transparent frame 127a may have space for receiving portion the first display panel 110. The second transparent frame 127b may be shaped to cover the second display panel 130. The interior of the second transparent frame 127b may have space for receiving portion the second display panel 130. The transparent frame 127a and 127b may refer to at least one of the first and second transparent frames 127a and 127b.

The shape of the interior of the first transparent frame 127a may correspond to the shape of the first display panel 110. For example, a first long side 127a LS1, second long side 127a LS2, first short side 127a SS1, and second short side 127a SS2 of the interior of the first transparent frame 127a may correspond to the first long side 110LS1, second long side 110LS2, first short side 110SS1, and second short side 110SS2 of the first display panel 110. Likewise, the shape of the interior of the second transparent frame 127b may similarly correspond to the shape of the second display panel 130.

The transparent plate 128 may be positioned on the back sides of the display panels 110 and 130. That is, the transparent plate 128 may be positioned between the first display panel 110 and the second display panel 130.

The transparent plate 128 may be positioned on the back side of the transparent frame 127a and 127b. That is, the transparent plate 128 may be positioned between the first transparent frame 127a and the second transparent frame 127b. The transparent plate 128 may be attached to the transparent frame 127a and 127b.

The sides on the exterior of the transparent plate 128 may correspond to the sides on the interior of the transparent frame 127a and 127b. For example, a first long side 128LS1, second long side 128LS2, first short side 128SS1, and second short side 128SS2 of the transparent plate 128 may be formed adjacent to the first long side 127a LS1, second long side 127a LS2, first short side 127a SS1, and second short side 127a SS2 of the interior of the first transparent frame 127a, respectively.

The transparent body 120 may have sidewalls SW. The sidewalls SW may be positioned on the first long side 128LS1, second long side 128LS2, first short side 128SS1, and second short side 128SS2 of the transparent plate 128.

The length of the first long side 110LS1 of the first display panel 110 may be only slightly shorter than the length of the first long side 127a LS1 of the interior of the first transparent frame 127a. The length of the first short side 110SS1 of the first display panel 110 may be only slightly shorter than the length of the first short side 127a SS1 of the interior of the first transparent frame 127a. The relationship between the length of each side of the second display panel 130 and the length of each side of the interior of the second transparent frame 127b may be the same as the relationship between the length of each side of the first display panel 110 and the length of each side of the interior of the first transparent frame 127a.

The display panel 110 and 130 may be fixed to the transparent plate 128. The display panel 110 and 130 may be attached to the transparent plate 128 by magnetic force, adhesive member, attachment members, or the like. The display panel 110 and 130 may be fitted to the transparent frame 127a and 127b.

Figure 53:
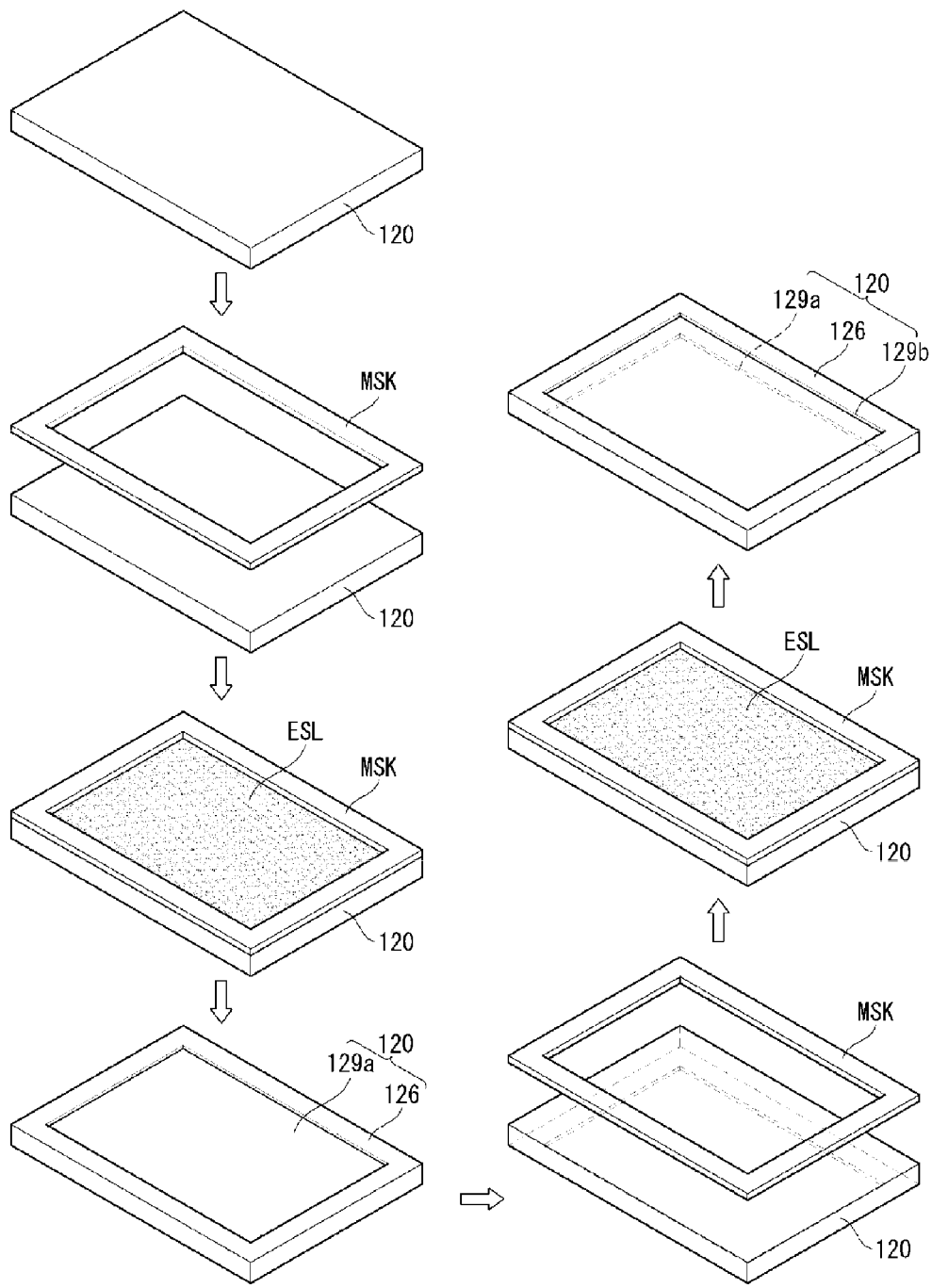
FIGS. 53 and 54 are views illustrating an example of a process for forming a transparent body of a display device according to an exemplary embodiment of the present invention.
Figure 54:
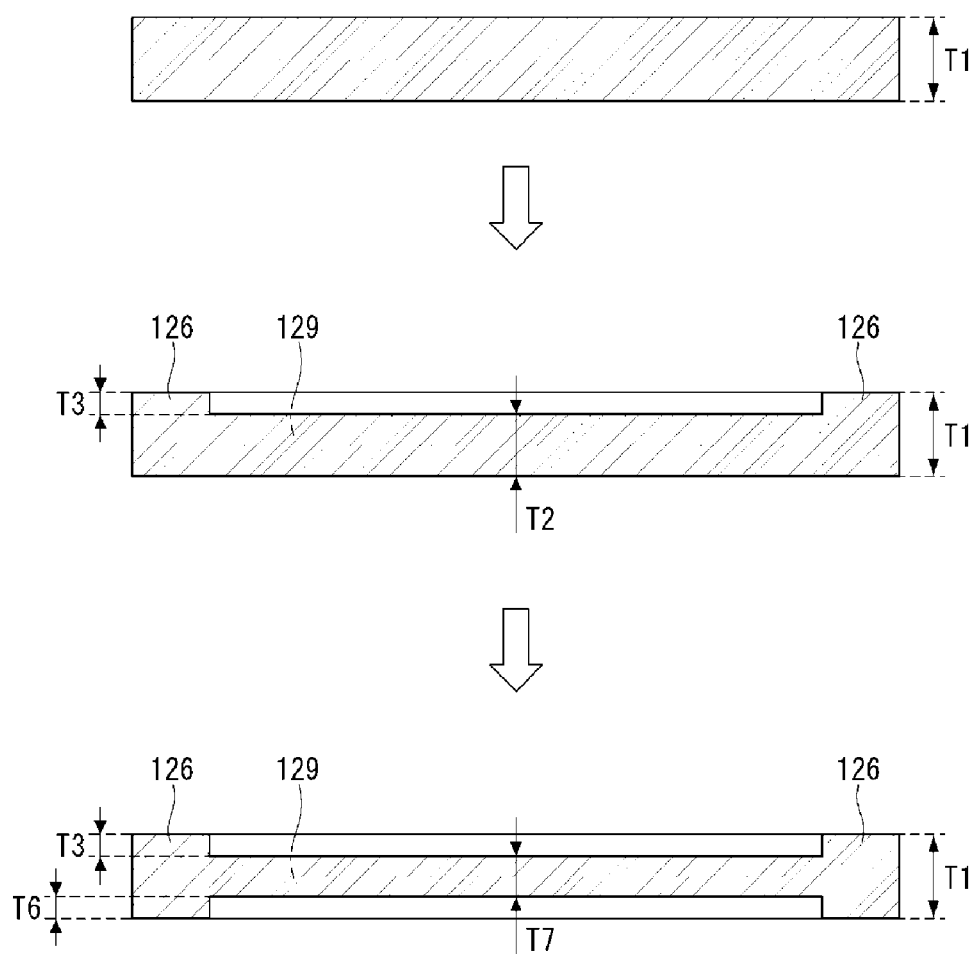

FIGS. 53 and 54 are views illustrating an example of a process for forming a transparent body of a display device according to an exemplary embodiment of the present invention.

Referring to FIG. 53, a slab-like, flat transparent body 120 may be prepared. The transparent body 120 may be made of transparent material. For example, the transparent body 120 may comprise glass. For example, the transparent body 120 may contain silicon dioxide. For example, the transparent body 120 may comprise clear plastic, or other composite material.

The transparent body 120 may be made of semi-transparent material. For example, the transparent body 120 may comprise semi-transparent glass. Or, the transparent body 120 may comprise transparent material and semi-transparent material. For example, the transparent body 120 may be made of a transparent material containing an opaque/semi-transparent material. The transparent body 120 may have both a transparent region and a semi-transparent region, for example.

For instance, the transparent body 120 may allow at least a part of incident light to pass through it or diffract, refract, or reflect it. For instance, the transparent body 120 may have a color.

A mask MSK may be placed on the slab-like transparent body 120. The mask MSK is of a certain height, and may be positioned on a surface of the transparent body 120. The mask MSK may be positioned on the transparent body 120, along the edge of a surface of the transparent body 120. The mask MSK, placed on the transparent body 120, may form a partially open space.

An etching solution ESL may be contained in the space formed by the mask MSK and the transparent body 120. The etching solution ESL may chemically etch the part of the transparent body 120 that is etched with the etching solution ESL. The etching solution ESL may contain hydrofluoric acid, for example. The mask MSK may protect the corresponding portions of the transparent body 120 from the etching solution ESL since it has tolerance to the etching solution ESL.

Although not shown, the transparent body 120 may be etched by plasma etching, for example. When a plasma is applied towards a surface of the transparent body 120 while the mask MSK is mounted on the transparent body 120, the part of the transparent body 120 that is exposed to the plasma may be etched. The mask MSK may protect the transparent body 120 from the plasma since it has tolerance to plasma. The plasma may be atmospheric plasma, for example.

After the etching, the mask MSK may be removed from the transparent body 120. The slab-like transparent body 120 may have a stepped portion after the etching. The part which had been protected from the etching by the mask MSK may be the transparent flange 126. The part that was exposed to and etched with the etching solution ESL may form a surface 129a of the transparent board 129. For example, the surface 129a of the transparent board 129 may be the front side 129a of the transparent board 129. Due to the etching, the transparent flange 126 may be thicker than the transparent board 129.

In other embodiments, the mask MSK may be placed on another surface of the transparent body 120. The another surface of the transparent body 120 may refer to the back side of the transparent body 120. The mask MSK, placed on the transparent body 120, may form a partially open space. An etching solution ESL may be contained in the space formed by the mask MSK and the transparent body 120 and etch part of the back side of the transparent body.

After the etching, the mask MSK may be removed from the transparent body 120. The back side of the transparent body 120 may have a stepped portion after the etching. That is, the back side 129b of the transparent board 129 may be formed.

Referring to FIG. 54, an example of a cross-section of the slab-like, flat transparent body 120 is depicted. The thickness of the slab-like transparent body 120 may be T1. Part of a surface of the slab-like transparent body 120 may be exposed to an etching solution, etc.

The part of the transparent body 120 that is exposed to an etching solution, etc. may be the transparent board 129 with a thickness T2. The part of the transparent body 120 that is protected from the etching may be the transparent flange 126 with the thickness T1. The thickness T2 may be smaller than the thickness T1.

The stepped portion formed between the transparent flange 126 and the transparent board 129 may have a thickness T3. The thickness 3 may correspond to the thickness of the display panel. For example, the thickness T3 may be slightly larger than the thickness of the display panel.

Part of the another surface of the transparent body 120 may be exposed to an etching solution, etc. Part of the another surface of the transparent body 120 may be etched to the depth of a thickness T6. The thickness T6 may be the same as or different from the thickness T3. The transparent board 129 may have a thickness T7.

Figure 55:
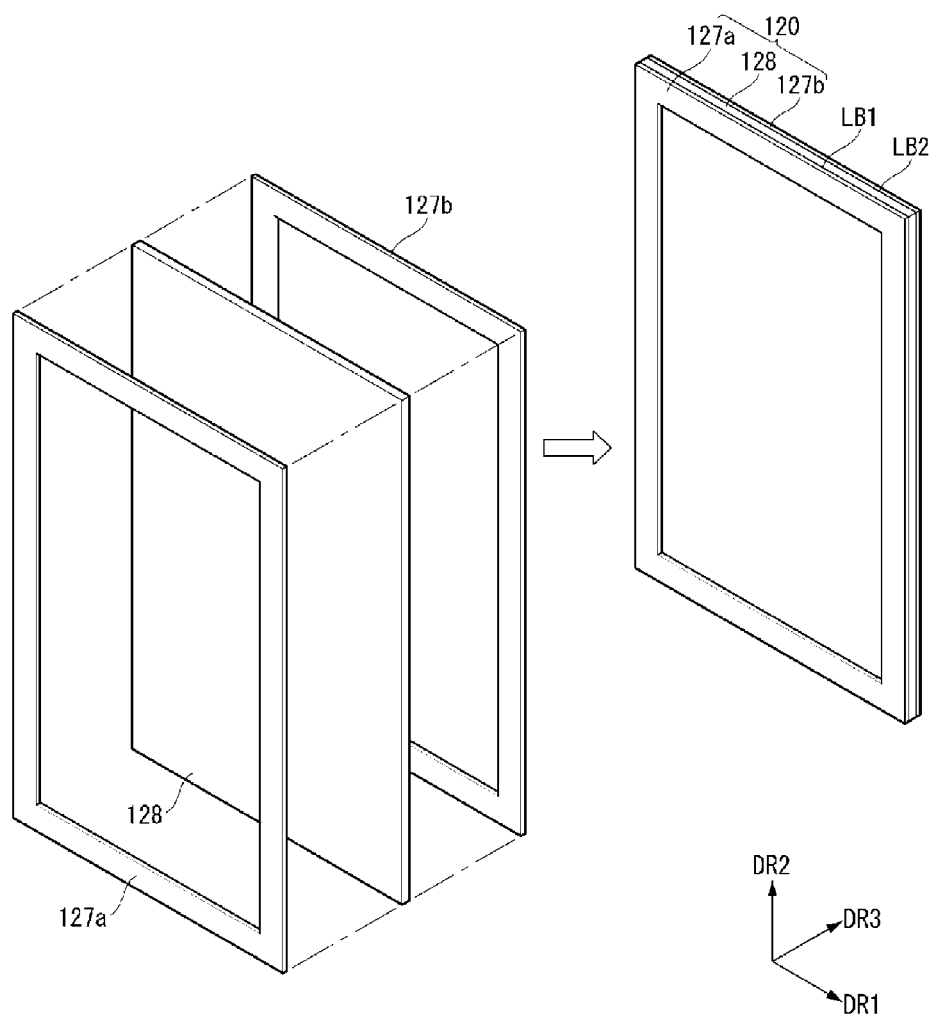
FIGS. 55 and 56 are views illustrating another example of a process for forming a transparent body of a display device according to an exemplary embodiment of the present invention.
Figure 56:
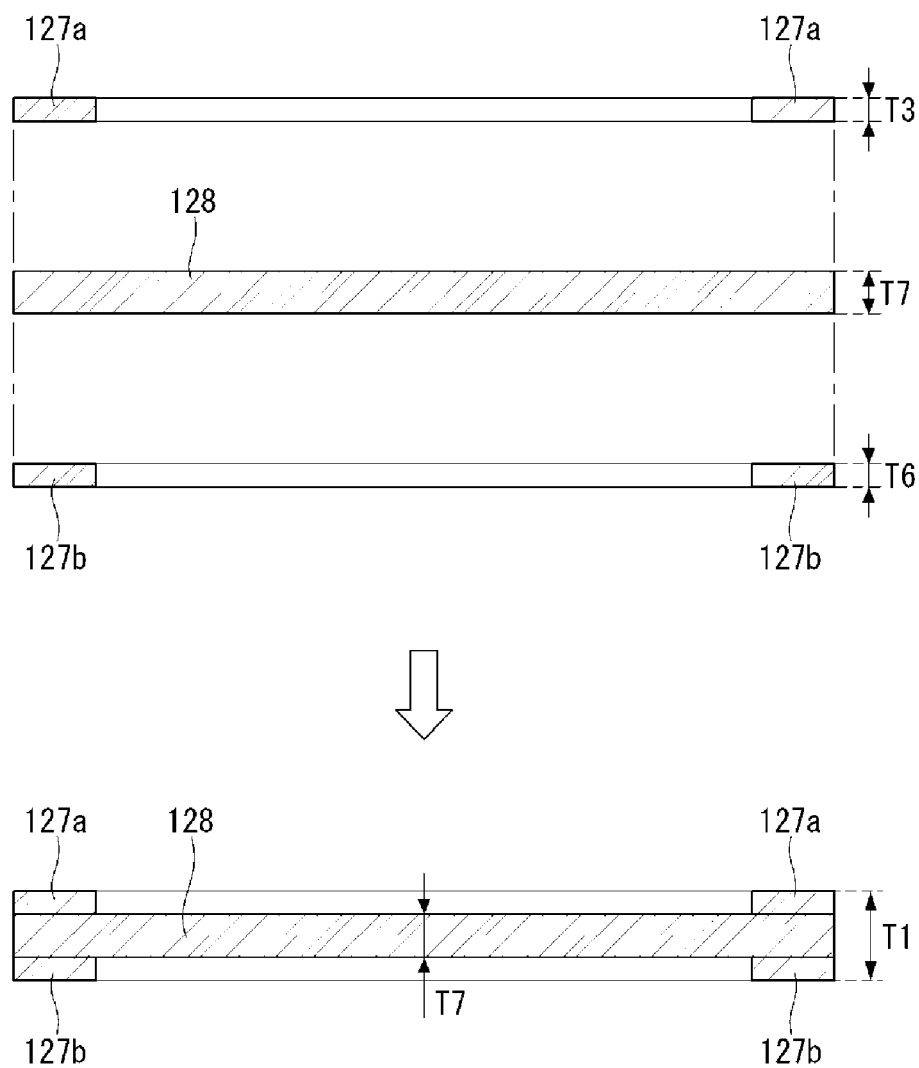

FIGS. 55 and 56 are views illustrating another example of a process for forming a transparent body of a display device according to an exemplary embodiment of the present invention.

Referring to FIG. 55, a slab-like, flat transparent plate 128 may be prepared. The transparent plate 128 may be made of transparent material. For instance, the transparent plate 128 may pass at least a part of incident light through it. For instance, the transparent plate 128 may have a color. For instance, the transparent plate 128 may contain at least one among glass, plastic, crystal, and quartz. The transparent plate 128 may be made of semi-transparent material. For instance, the transparent plate 128 may diffusely reflect light because its outer surface is rough.

The transparent plate 128 may comprise fiber in order to add rigidity. For example, the transparent plate 128 may comprise at least one among glass fiber, carbon fiber, metallic wire, and metallic fiber. The transparent plate 128 may comprise microfiber.

The first transparent frame 127*a* may be affixed to a surface of the transparent plate 128. The second transparent frame 127*b* may be affixed to another surface of the transparent plate 128. The transparent frame 127*a* and 127*b* may be made of transparent material. The transparent frame 127*a* and 127*b* may be made of the same material as the transparent plate 128.

For instance, the transparent frame 127*a* and 127*b* may be made of a different material from the transparent plate 128. For instance, the transparent frame 127*a* and 127*b* and the transparent plate 128 may differ in color, transparency, reflectivity, or refractive index. For instance, the transparent frame 127*a* and 127*b* may have different rigidity than the transparent plate 128. For instance, the transparent frame 127*a* and 127*b* may have a different outline shape from the transparent plate 128.

A boundary line LB may be formed by attaching the transparent frame 127*a* and 127*b* to the transparent plate 128. The boundary line LB may be formed along the outer edge of the transparent body 120. The boundary line LB may indicate the boundary between the transparent plate 128 and the transparent frame 127*a* and 127*b*.

Referring to FIG. 56, a cross-section of the slab-like, flat transparent plate 128 may be depicted. The thickness of the slab-like transparent plate 128 may be T7.

The first transparent frame 127*a* may be affixed to a surface of the transparent plate 128. For instance, the first transparent frame 127*a* may be attached to the transparent plate 128 with an adhesive, magnetic members, attachment members, or the like. For instance, the first transparent frame 127*a* may be attached to the transparent plate 128 by heat. For instance, the first transparent frame 127*a* may be attached to the transparent plate 128 by pressure. For instance, the first transparent frame 127*a* may be attached to the transparent plate 128 by using fritted glass or fritted glaze.

The second transparent frame 127*b* may be affixed to another surface of the transparent plate 128. The second transparent frame 127*b* may be attached to the transparent plate 128 by using at least one of the above-listed methods of attaching the first transparent frame 127*a* to the transparent plate 128.

The first transparent frame 127*a* may have a thickness T3. The first transparent frame 127*a* may be surface-treated so that the transparent frame 127 can be affixed easily to the transparent plate 128. Alternatively, at least a part of a surface of the transparent plate 128 may be surface-treated so that it can be affixed easily to the first transparent frame 127*a*.

The second transparent frame 127*b* may have a thickness T6. At least one between the second transparent frame 127*b* and the transparent plate 128 may be surface-treated so that it can be affixed easily.

Once the first transparent frame 127*a* is attached to the transparent plate 128, a stepped portion may be formed on a surface of the transparent body 120. The stepped portion formed on a surface of the transparent body 120 may have a thickness T3. The thickness T3 may correspond to the thickness of the first display panel. For example, the thickness T3 may be slightly larger than the thickness of the first display panel.

Once the second transparent frame 127*b* is attached to the transparent plate 128, a stepped portion may be formed on another surface of the transparent body 120. The stepped portion formed on the another surface of the transparent body 120 may have a thickness T6. The thickness T6 may correspond to the thickness of the second display panel. For example, the thickness T6 may be slightly larger than the thickness of the second display panel. The transparent body 120 may have a thickness T1 at one point. The thickness T1 may be the largest one among the thicknesses at different points on the transparent body 120.

FIGS. 57 to 70 are views illustrating examples of a transparent body according to an exemplary embodiment of the present invention. In what follows, the term "PCB receiving portion" may refer to at least one between "front PCB receiving portion" and "rear PCB receiving portion". In what follows, the term "cable receiving portion" may refer to at least one between "front cable receiving portion" and "rear cable receiving portion". In what follows, the term "first receiving portion" may refer to at least one between "front first receiving portion" and "rear first receiving portion". In what follows, the term "second receiving portion" may refer to at least one between "front second receiving portion" and "rear second receiving portion". In what follows, the term "slot" may refer to at least one between "front slot" and "rear slot".

In what follows, the term "PCB receiving portion" may be referred to as "first receiving portion". In what follows, the term "cable receiving portion" may be referred to as "second receiving portion". In what follows, the term "front PCB receiving portion" may be referred to as "front first receiving portion". In what follows, the term "rear PCB receiving portion" may be referred to as "rear first receiving portion".

Figure 57:
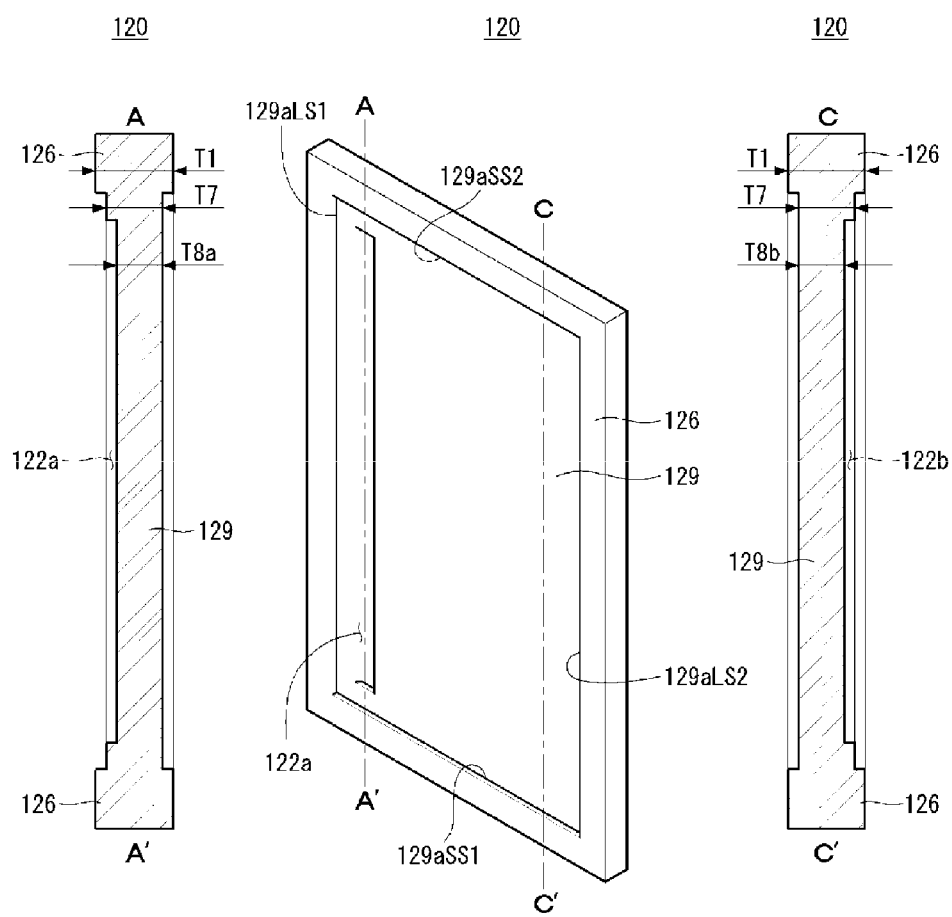
FIGS. 57, 58, 59, 60, 61, 62, 63, 64, 65, 66, 67, 68, 69, and 70 are views illustrating examples of a transparent body according to an exemplary embodiment of the present invention.

Referring to FIG. 57, a front PCB receiving portion 122*a* may be formed on a surface of the transparent body 120. For example, the front PCB receiving portion 122*a* may be formed on a surface of the transparent board 129. That is, the front PCB receiving portion 122*a* may be formed on the front side of the transparent board 129. The front PCB receiving portion 122a may be visible on the front of the transparent body 120. The front PCB receiving portion 122a may be formed in a direction from the first short side 129aSS1 of the transparent board 129 towards the second short side 129aSS2. The front PCB receiving portion 122a may be formed adjacent to either the first long side 129aLS1 or second long side 129aLS2 of the front of the transparent board 129. For example, the front PCB receiving portion 122a may be formed adjacent to the first long side 129aLS1 of the front of the transparent board 129.

A rear PCB receiving portion 122b may be formed on another surface of the transparent body 120. For example, the rear PCB receiving portion 122b may be formed on the another surface of the transparent board 129. That is, the rear PCB receiving portion 122b may be formed on the back side of the transparent board 129. The rear PCB receiving portion 122b may be visible on the back of the transparent body 120. The rear PCB receiving portion 122b may be formed parallel to the front PCB receiving portion 122a. The rear PCB receiving portion 122b may be formed adjacent to the second long side (not shown) of the back of the transparent board 129. The rear PCB receiving portion 122b may be formed adjacent to the second long side 129aLS2 of the front of the transparent board 129.

The PCB receiving portions 122a and 122b may be formed by physical action. For example, the PCB receiving portions 122a and 122b may be formed by cutting the transparent board 129 using a tool with higher rigidity than the transparent board 129. The PCB receiving portions 122a and 122b may be formed by chemical action. For example, the PCB receiving portions 122a and 122b may be formed by reacting with a chemical acting on the transparent board 129.

The PCB receiving portions 122a and 122b may receive at least a part of the PCB connected to the display panel 110 and 130. For example, the front PCB receiving portion 122a may receive at least a part of the PCB connected to the first display panel 110. For example, the rear PCB receiving portion 122b may receive at least a part of the PCB connected to the second display panel 130.

The PCB receiving portions 122a and 122b may correspond to the shape of the PCB connected to the display panel 110 and 130. The PCB receiving portions 122a and 122b may be shaped like a groove or other opening configured to accommodate various sizes of shapes of the PCB.

Referring to a cross-section taken along the line A-A' parallel to the length of the front PCB receiving portion 122a, the transparent flange 126 may have a thickness T1. The transparent board 129 may have a thickness T7. T7 may be smaller than T1. The thickness T1 may be the thickness of the outer edge of the transparent body 120.

The transparent board 129 may have a thickness T8a in the part where the front PCB receiving portion 122a is formed. The front side of the transparent board 129 may be divided into a part for the front PCB receiving portion 122a and a neighboring region. The part for the front PCB receiving portion 122a may be thinner than the neighboring region. T8a may be smaller than T7.

Referring to a cross-section taken along the line C-C' parallel to the length of the rear PCB receiving portion 122b, the transparent board 129 may have a thickness T8b in the part where the rear PCB receiving portion 122b is formed. The back side of the transparent board 129 may be divided into a part for the rear PCB receiving portion 122b and a neighboring region. The part for the rear PCB receiving portion 122b may be thinner than the neighboring region. T8b may be smaller than T7.

Figure 58:
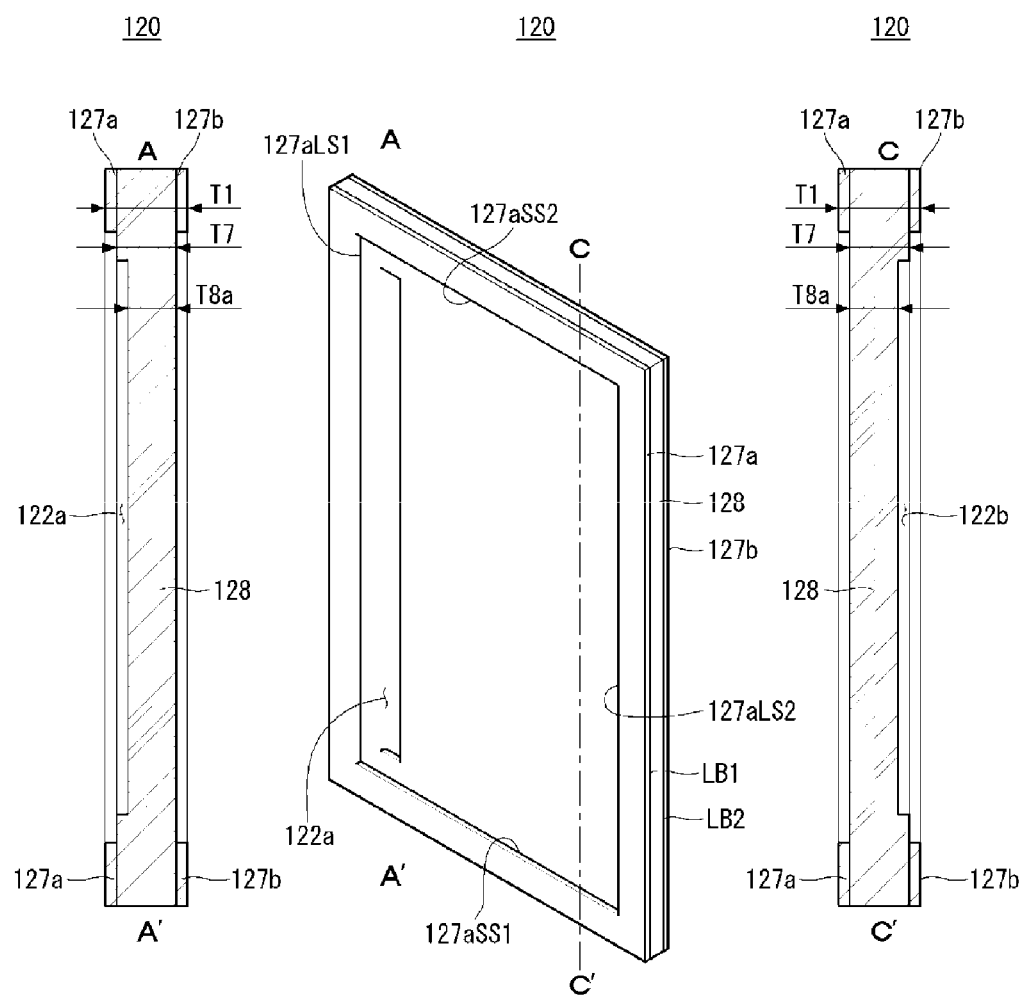

Referring to FIG. 58, the front PCB receiving portion 122a may be formed on a surface of the transparent body 120. The front PCB receiving portion 122a may be visible on the front of the transparent body 120. The front PCB receiving portion 122a may be formed on a surface of the transparent plate 128. For example, the front PCB receiving portion 122a may be formed on the front side of the transparent plate 128. The front PCB receiving portion 122a may be formed adjacent to either the first long side 127a LS1 or second long side 127a LS2 of the interior of the first transparent frame 127a. For example, the front PCB receiving portion 122a may be formed adjacent to the first long side 127a LS1 of the interior of the first transparent frame 127a. The front PCB receiving portion 122a may be formed in a direction from the first short side 127a SS1 of the interior of the first transparent frame 127a towards the second short side 127a SS2.

The rear PCB receiving portion 122b may be formed on the back side of the transparent plate 128. The rear PCB receiving portion 122b may be formed adjacent to either the first long side (not shown) or second long side (not shown) of the interior of the second transparent frame 127b. For example, the rear PCB receiving portion 122b may be formed adjacent to the second long side (not shown) of the interior of the second transparent frame 127b. The rear PCB receiving portion 122b may be formed parallel to the front PCB receiving portion 122a.

The PCB receiving portions 122a and 122b may be positioned within the area defined by the sides of the interior of the transparent frame 127. For example, the front PCB receiving portion 122a may be formed within the area defined by the first long side 127a LS1, second long side 127a LS2, first short side 127a SS1, and second short side 127a SS2 of the interior of the first transparent frame 127a. For example, the rear PCB receiving portion 122b may be formed within the area defined by the sides of the interior of the second transparent frame 127b.

The PCB receiving portions 122a and 122b may be formed by physical action. For example, the PCB receiving portions 122a and 122b may be formed by cutting the transparent plate 128 using a tool with higher rigidity than the transparent plate 128. The PCB receiving portions 122a and 122b may be formed by chemical action. For example, the PCB receiving portions 122a and 122b may be formed by reaction with a chemical agent acting on the transparent plate 128.

The front PCB receiving portion 122a may face the front of the transparent body 120. The rear PCB receiving portion 122b may face the back of the transparent body 120. The PCB receiving portions 122a and 122b may receive at least a part of the PCB connected to the display panel 110 and 130. The PCB receiving portions 122a and 122b may be shaped like a groove or other opening configured to accommodate various shapes and sizes of the PCB.

Referring to a cross-section taken along the line A-A' parallel to the length of the front PCB receiving portion 122a, the transparent plate 128 may have a thickness T8a at one point on the part where the front PCB receiving portion 122a is formed. The transparent plate 128 may have a thickness T7 in the neighboring region of the front PCB receiving portion 122a. The outer edge of the transparent body 120 may have a thickness T1.

Referring to a cross-section taken along the line C-C' parallel to the length of the rear PCB receiving portion 122b, the transparent plate 128 may have a thickness T8b at one point on the part where the rear PCB receiving portion 122b is formed. The transparent plate 128 may have the thickness T7 in the neighboring region of the rear PCB receiving portion 122b.

Figure 59:
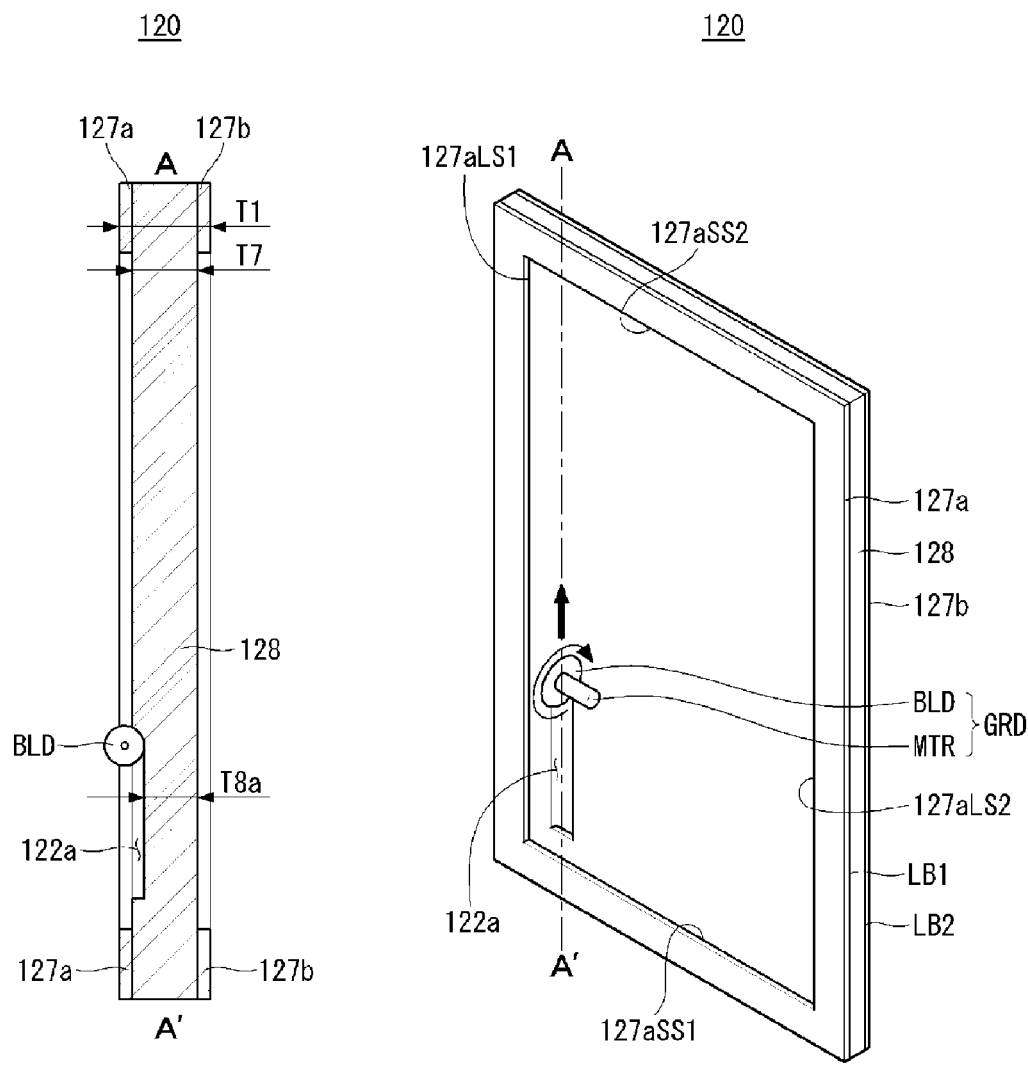

Referring to FIG. 59, a grinder GRD may form a groove on a surface of the transparent body 120. For example, the PCB receiving portion 122 may be formed by the grinder GRD. Although not shown, the grinder GRD may form a hole on a surface of the transparent body 120.

The grinder GRD may comprise a blade BLD. The blade BLD may have higher rigidity than the transparent body 120. The blade BLD may rotate. The blade BLD may be connected to a motor MTR and receive torque. The blade BLD may make contact with a surface of the transparent plate 128 and cut or grind the transparent plate 128 by rotation. Although not shown, the blade BLD may form a groove by applying torque to a surface of the transparent board 129.

Referring to a cross-section taken along the line A-A' parallel to the length of the front PCB receiving portion 122a, the blade BLD may reduce the thickness of the transparent plate 128. The transparent plate 128 may have a thickness T7 in the part where the blade BLD is not applied. The transparent plate 128 may have a thickness T8a in the part where the blade BLD is applied. T8a may be smaller than T7.

Figure 60:
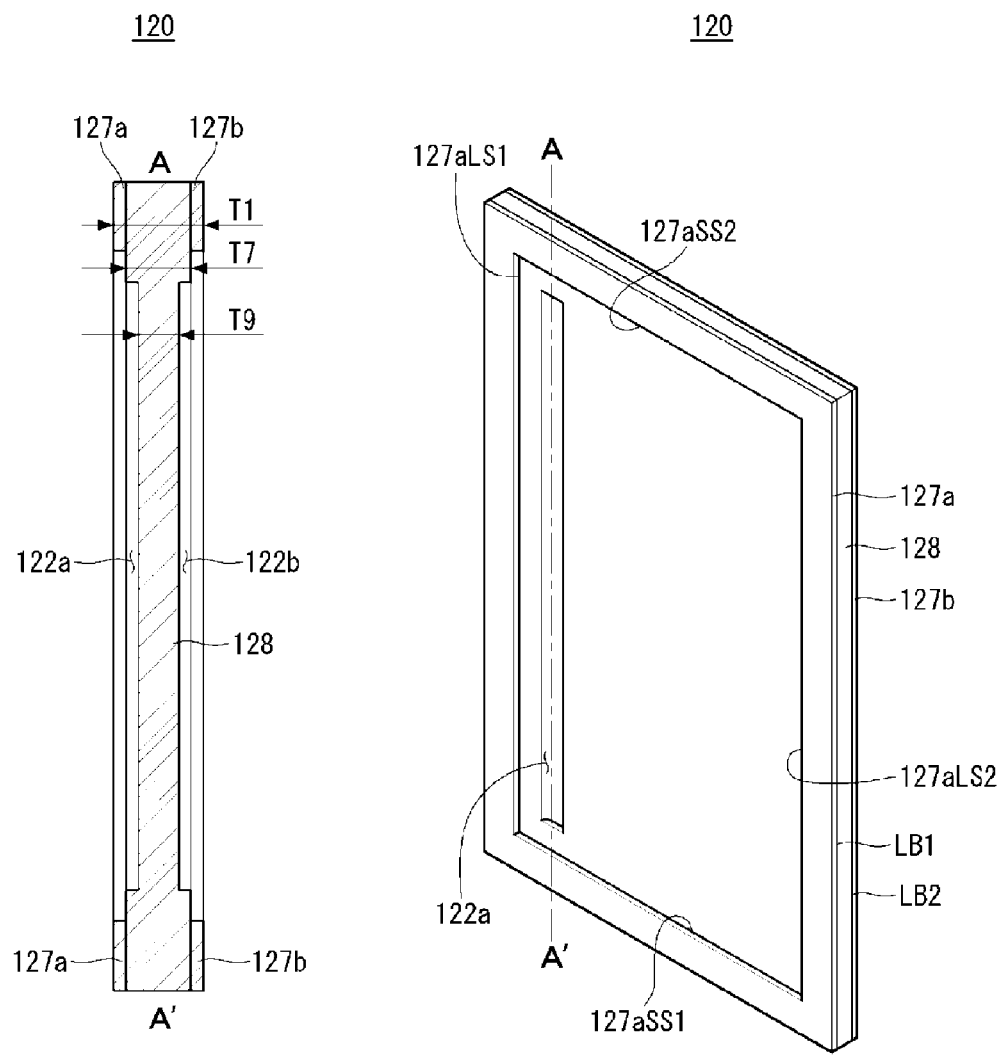

Referring to FIG. 60, the front PCB receiving portion 122a and the rear PCB receiving portion 122b may be formed on the front and back sides of the transparent plate 128, respectively. Referring to a cross-section taken along the line A-A' that is parallel to the length of the front PCB receiving portion 122a and passes through the front PCB receiving portion 122a, the position of the rear PCB receiving portion 122b may correspond to the position of the front PCB receiving portion 122a. That is, the rear PCB receiving portion 122b may overlap the front PCB receiving portion 122a in a front-back direction. Although not shown, the front PCB receiving portion 122a may overlap the rear PCB receiving portion 122b in the front-back direction on the transparent board 129.

The PCB receiving portions 122a and 122b, with the shape of a groove or hole, may reduce the rigidity or support force of the transparent body 120. The area of the PCB receiving portions 122a and 122b may affect the rigidity or bearing capacity of the transparent body 120.

If the front PCB receiving portion 122a overlaps the rear PCB receiving portion 122b in the front-back direction, this makes it easy to create an area on the transparent plate 128 where no groove or hole is formed.

Figure 61:
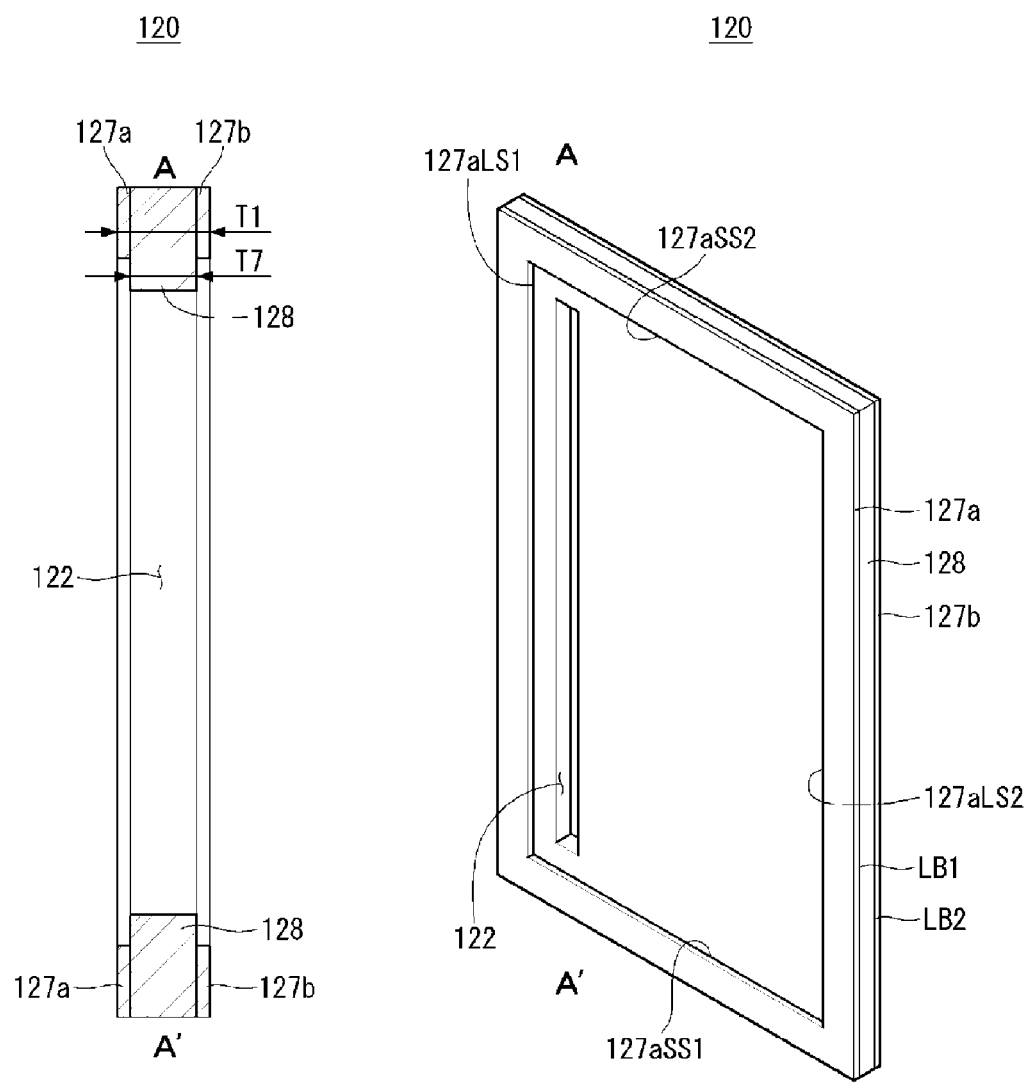

Referring to FIG. 61, the PCB receiving portion 122 may be disposed at the front or/and back of the transparent body 120. The PCB receiving portion 122 may be visible on the front or/and back of the transparent plate 128. The PCB receiving portion 122 may be a hole formed on a surface of the transparent plate 128. Although not shown, the PCB receiving portion 122 may be a hole formed on a surface of the transparent board 129.

The PCB receiving portion 122 may be formed adjacent to the first long side 127a LS1 of the interior of the first transparent frame 127a. The PCB receiving portion 122 may be formed in a direction from the first short side 127a SS1 of the interior of the first transparent frame 127a towards the second short side 127a SS2. The PCB receiving portion 122 may be understood as a structure composed of a front PCB receiving portion and a rear PCB receiving portion that communicate with each other.

The PCB receiving portion 122 may be formed by physical processing. For example, the PCB receiving portion 122 may be formed by a grinder. For example, the PCB receiving portion 122 may be formed by NC processing (or numerical control work).

The PCB receiving portion 122 may be formed by chemical processing. For example, the PCB receiving portion 122 may be formed by applying an etching solution to the transparent plate 128. For example, the PCB receiving portion 122 may be formed by applying a plasma to the transparent plate 128.

Referring to a cross-section taken along the line A-A' that is parallel to the length of the PCB receiving portion 122, the PCB receiving portion 122 may correspond to an opening through the front and back of the transparent plate 128.

Figure 62:
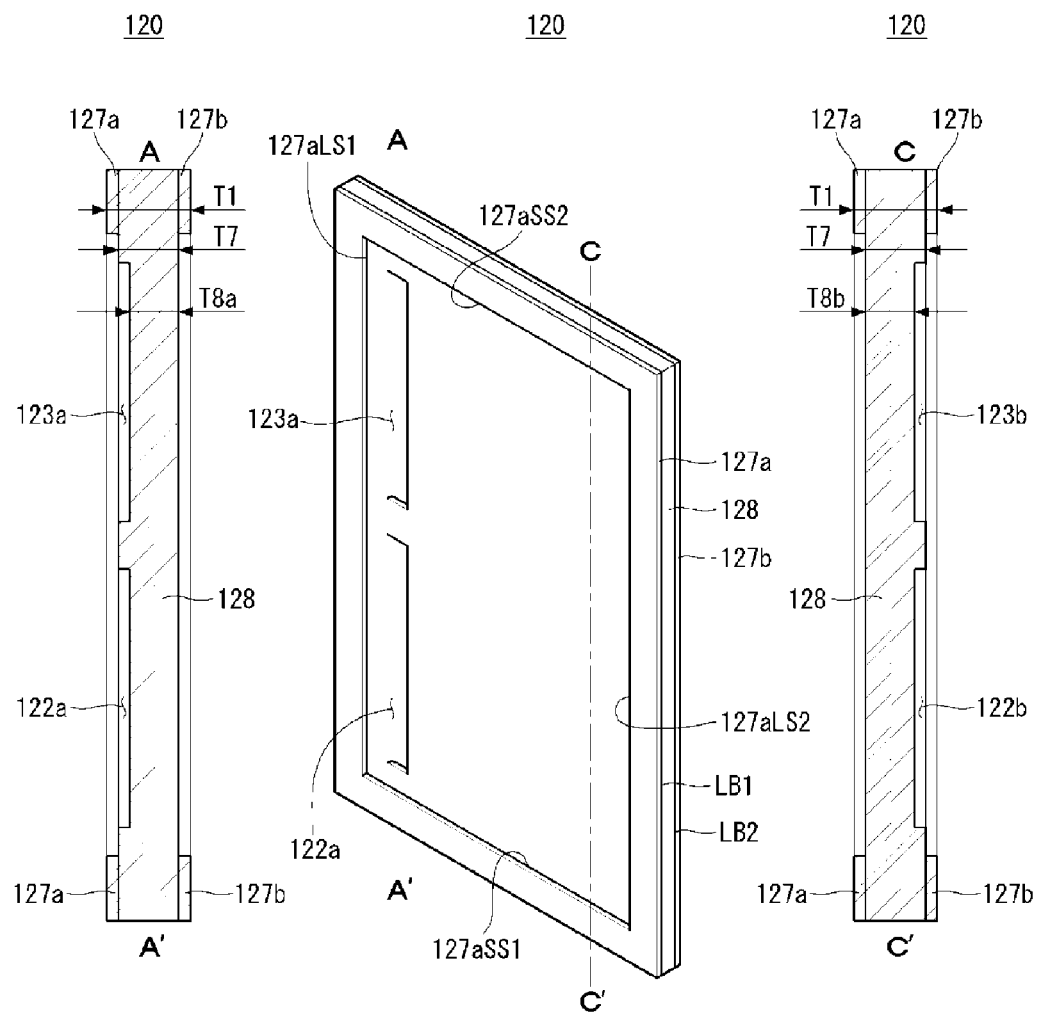

Referring to FIG. 62, the front PCB receiving portion 122a and 123a may be disposed at the front of the transparent plate 128. The front PCB receiving portion 122a and 123a may be shaped like a groove formed on the transparent plate 128. The front PCB receiving portion 122a and 123a may be provided in multiple units. For example, the front PCB receiving portion 122a and 123a may comprise a lower front PCB receiving portion 122a and an upper front PCB receiving portion 123a.

The rear PCB receiving portion 122b and 123b may be disposed on the back of the transparent plate 128. The rear PCB receiving portion 122b and 123b may be shaped like a groove formed on the transparent plate 128. The rear PCB receiving portion 122b and 123b may be provided in multiple units. For example, the rear PCB receiving portion 122b and 123b may comprise a lower rear PCB receiving portion 122b and an upper rear PCB receiving portion 123b.

The lower front PCB receiving portion 122a and the upper front PCB receiving portion 123a may be arranged in series. The lower front PCB receiving portion 122a and the upper front PCB receiving portion 123a may be arranged lengthwise in a row. The lower front PCB receiving portion 122a and the upper front PCB receiving portion 123a may be formed adjacent to the first long side 127a LS1 of the interior of the first transparent frame 127a. The lower front PCB receiving portion 122a and the upper front PCB receiving portion 123a may be sequentially arranged in a direction from the first short side 127a SS1 of the interior of the first transparent frame 127a towards the second short side 127a SS2.

The lower rear PCB receiving portion 122b and the upper rear PCB receiving portion 123b may be arranged in series. The lower rear PCB receiving portion 122b and the upper rear PCB receiving portion 123b may be arranged lengthwise in a row. The lower rear PCB receiving portion 122b and the upper rear PCB receiving portion 123b may be formed adjacent to the first long side (not shown) of the interior of the second transparent frame 127b. The lower rear PCB receiving portion 122b and the upper rear PCB receiving portion 123b may be sequentially arranged in a direction from the first short side (not shown) of the interior of the second transparent frame 127b towards the second short side 127a SS2.

Referring to a cross-section taken along the line A-A' that passes through the front PCB receiving portion 122a and 123a along the length of the front PCB receiving portion 122a and 123a, the transparent plate 128 may have a thickness T8a at one point on the part where the front PCB receiving portion 122a and 123a is formed. The thickness of the transparent plate 128 at one point on the part where the lower front PCB receiving portion 122a is formed may be the same as or different from the thickness of the transparent plate 128 at one point on the part where the upper front PCB receiving portion 123a is formed.

Referring to a cross-section taken along the line C-C' that passes through the rear PCB receiving portion 122b and 123b along the length of the rear PCB receiving portion 122b and 123b, the transparent plate 128 may have a thickness T8b at one point on the part where the rear PCB receiving portion 122b and 123b is formed. The thickness of the transparent plate 128 at one point on the part where the lower rear PCB receiving portion 122b is formed may be the same as or different from the thickness of the transparent plate 128 at one point on the part where the upper rear PCB receiving portion 123b is formed.

The PCB receiving portions 122a, 122b, 123a, and 123b may be formed on a surface of the transparent plate 128 by a physical method or/and a chemical method. For example, the PCB receiving portions 122a, 122b, 123a, and 123b may be formed by a laser.

Figure 63:
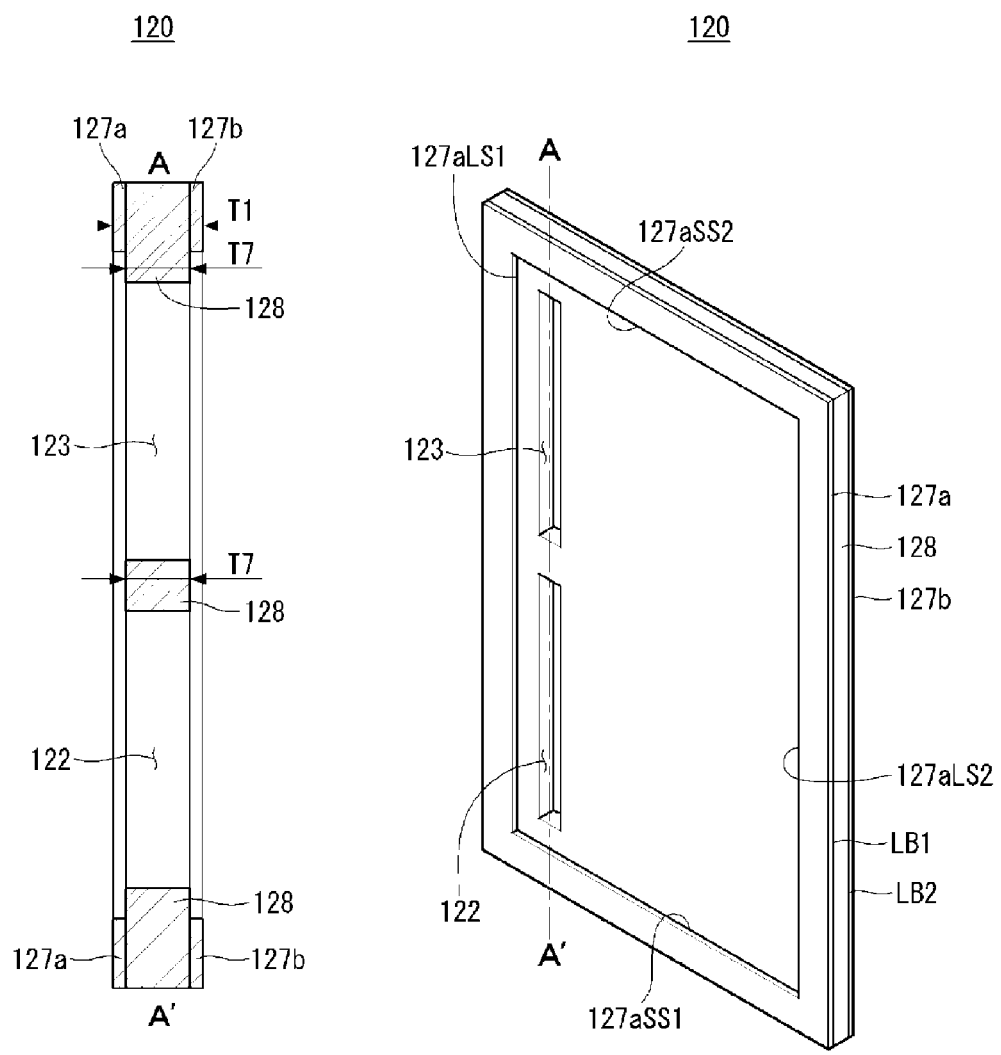

Referring to FIG. 63, the PCB receiving portion 122 and 123 may be visible on the front of the transparent plate 128. The PCB receiving portion 122 and 123 may be shaped like a groove formed on the transparent plate 128. The PCB receiving portion 122 and 123 may be provided in multiple units. For example, the PCB receiving portion 122 and 123 may comprise a lower PCB receiving portion 122 and an upper PCB receiving portion 123.

The lower PCB receiving portion 122 and the upper PCB receiving portion 123 may be arranged in series. The lower PCB receiving portion 122 and the upper PCB receiving portion 123 may be aligned and arranged lengthwise in a row. The length of the lower PCB receiving portion 122 may be parallel to the length of the upper PCB receiving portion 123. The lower PCB receiving portion 122 and the upper PCB receiving portion 123 may be formed adjacent to the first long side 127a LS1 of the interior of the first transparent frame 127a. The lower PCB receiving portion 122 and the upper PCB receiving portion 123 may be arranged parallel to a direction from the first short side 127a SS1 of the interior of the first transparent frame 127a towards the second short side 127a SS2.

Referring to a cross-section taken along the line A-A' that is parallel to the length of the PCB receiving portion 122 and 123 and passes through the PCB receiving portion 122 and 123, the front and back of the transparent plate 128 may communicate with each other at one point on the part where the PCB receiving portion 122 and 123 is formed.

The PCB receiving portion 122 and 123 may be formed on a surface of the transparent plate 128 by an optical method. For example, the PCB receiving portion 122 and 123 may be formed by a carbon dioxide laser.

Figure 64:
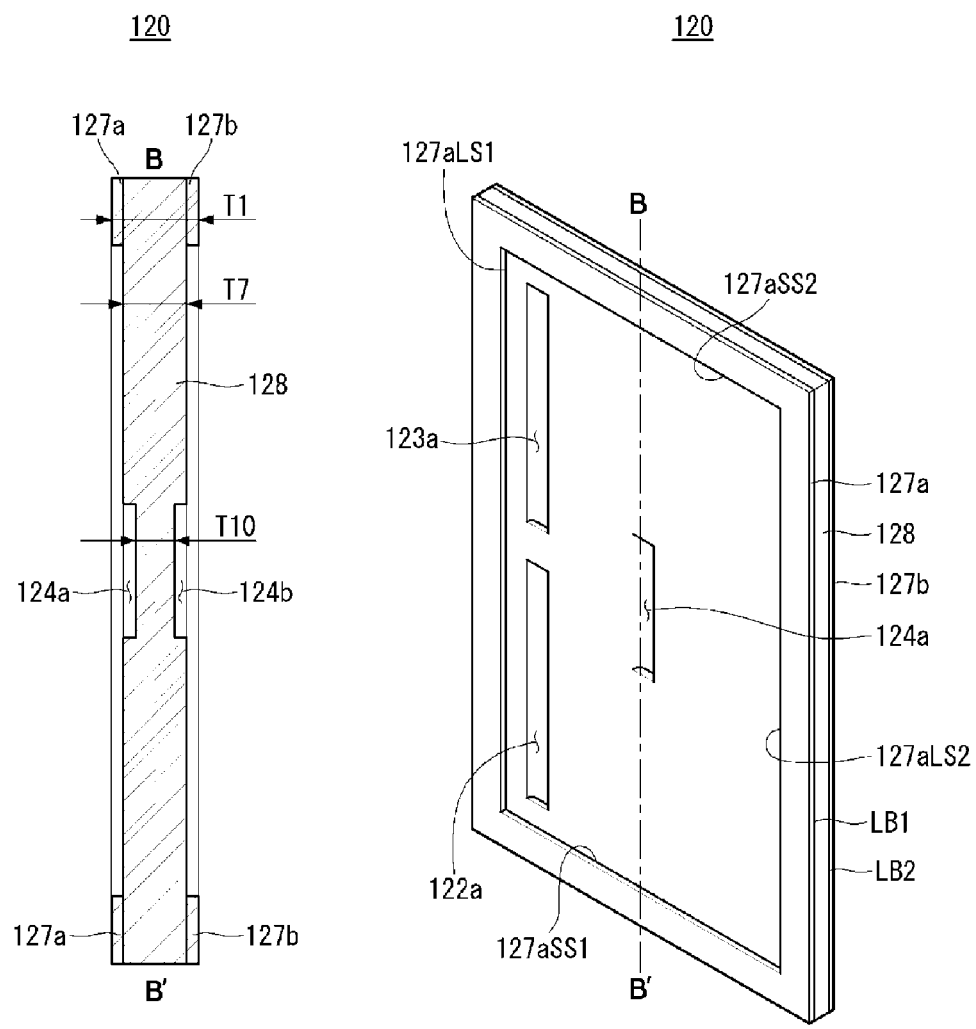

Referring to FIG. 64, a front cable receiving portion 124a may be disposed at the front of the transparent plate 128. The front cable receiving portion 124a may be shaped like a groove formed on a surface or the front side of the transparent plate 128. The front cable receiving portion 124a may receive at least a part of a cable connected to a PCB. The front cable receiving portion 124a may be positioned at the center region of a surface or the front side of the transparent plate 128. The front cable receiving portion 124a may be spaced apart from the front PCB receiving portion 122a and 123a.

A rear cable receiving portion 124b may be disposed at the back of the transparent plate 128. The rear cable receiving portion 124b may be shaped like a groove formed on another surface or the back side of the transparent plate 128. The rear cable receiving portion 124b may receive at least a part of a cable connected to a PCB. The rear cable receiving portion 124b may be positioned at the center region of the another surface or back side of the transparent plate 128. The rear cable receiving portion 124b may be spaced apart from the rear PCB receiving portion (not shown). The cable receiving portion 124 may refer to at least one between the rear cable receiving portion 124b and the front cable receiving portion 124a.

The front PCB receiving portion 122a and 123a may be positioned between the front cable receiving portion 124a and a side of the interior of the first transparent frame 127a. For example, the front PCB receiving portion 122a and 123a may be positioned between the front cable receiving portion 124a and the first long side 127a LS1 of the interior of the first transparent frame 127a.

The rear PCB receiving portion (not shown) may be positioned between the rear cable receiving portion 124b and a side of the interior of the second transparent frame 127b. For example, the rear PCB receiving portion (not shown) may be positioned between the rear cable receiving portion 124b and the first long side (not show) of the interior of the second transparent frame 127b.

The front cable receiving portion 124a may overlap the rear cable receiving portion 124b in a front-back direction. With this configuration, the part of the transparent plate 128 that is thin due to the formation of a groove or hole may be minimized.

Referring to a cross-section taken along the line B-B' that passes through the cable receiving portion 124, the transparent plate 128 may have a thickness T10 at one point on the part where the cable receiving portion 124 is formed. The transparent plate 128 may be stepped at the boundary of the cable receiving portion 124.

Figure 65:
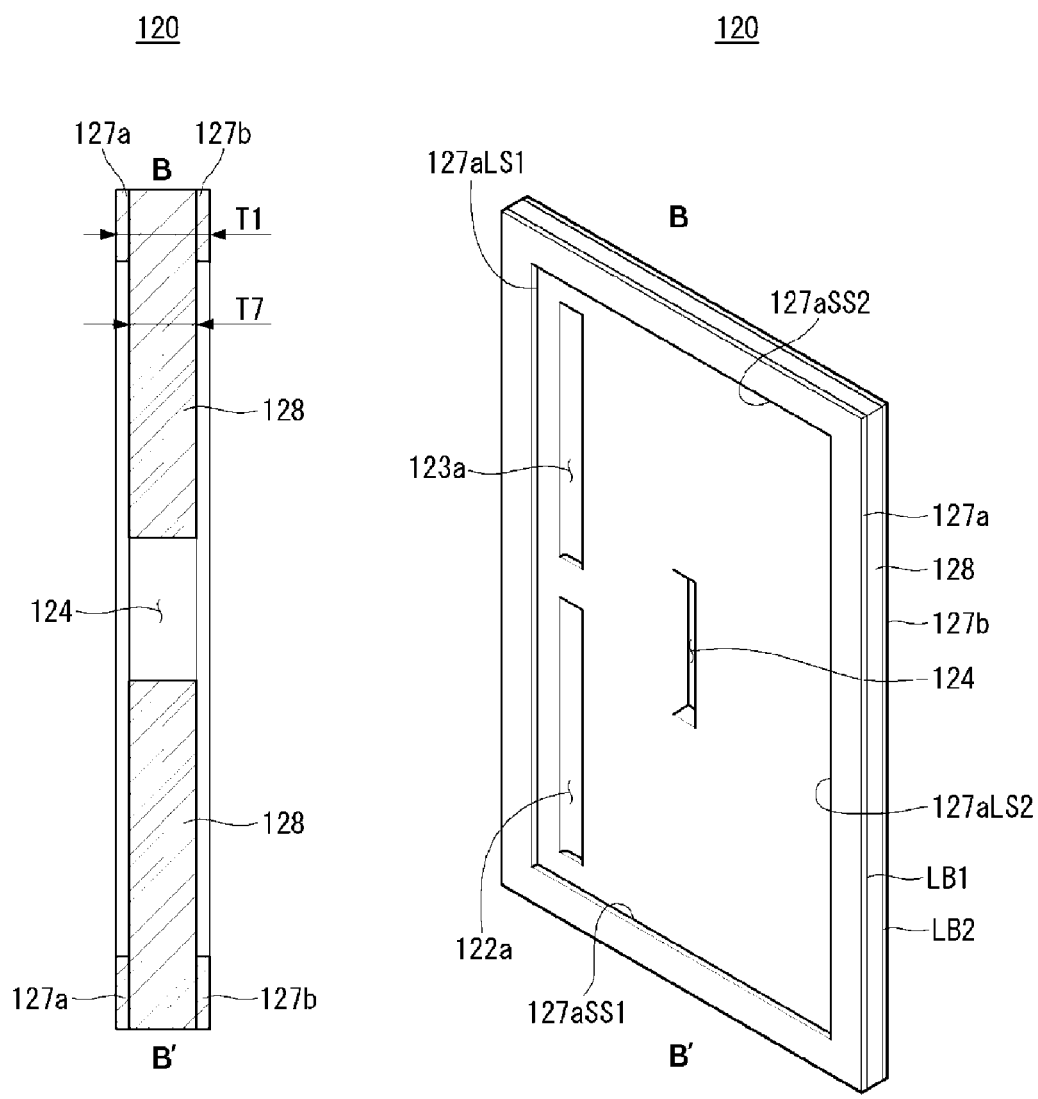

Referring to FIG. 65, the cable receiving portion 124 may be disposed at the front of the transparent plate 128. The cable receiving portion 124 may be in the shape of a hole formed on a surface of the transparent plate 128. It may be understood that the cable receiving portion 124 is composed of a front cable receiving portion and a rear cable receiving portion that communicate with each other. Although not shown, the hole-shaped cable receiving portion 124 may be formed on the transparent board 129.

The cable receiving portion 124 may receive at least a part of a cable connected to a PCB. Specifically, the cable receiving portion 124 may receive at least a part of a cable connected to a PCB connected to the first display panel and at least a part of a cable connected to a PCB connected to the second display panel. The cable receiving portion 124 may be positioned at the center region of the transparent plate 128. The cable receiving portion 124 may be spaced apart from the front PCB receiving portion 122a and 123a. Although not shown, the cable receiving portion 124 may be spaced apart from the rear PCB receiving portion The front PCB receiving portion 122a and 123a may be positioned between the cable receiving portion 124 and a side of the interior of the first transparent frame 127a. For example, the front PCB receiving portion 122a and 123a may be positioned between the cable receiving portion 124 and the first long side 127a LS1 of the interior of the first transparent frame 127a. The arrangement of the rear PCB receiving portion 122b and 123b, cable receiving portion 124, and second transparent frame 127b may be the same as or similar to the arrangement of the front PCB receiving portion 122a and 123a, cable receiving portion 124, and first transparent frame 127a.

Referring to a cross-section taken along the line B-B' that passes through the cable receiving portion 124, the cable receiving portion 124 may correspond to an opening through the front and back of the transparent plate 128.

The hole-shaped cable receiving portion 124 may be formed at the center region of the transparent plate 128. For example, a hole may be formed at the center region of the transparent plate 128 by using a high-power laser. The high-power laser may be a carbon dioxide laser or Nd-YAG laser, for example.

Figure 66:
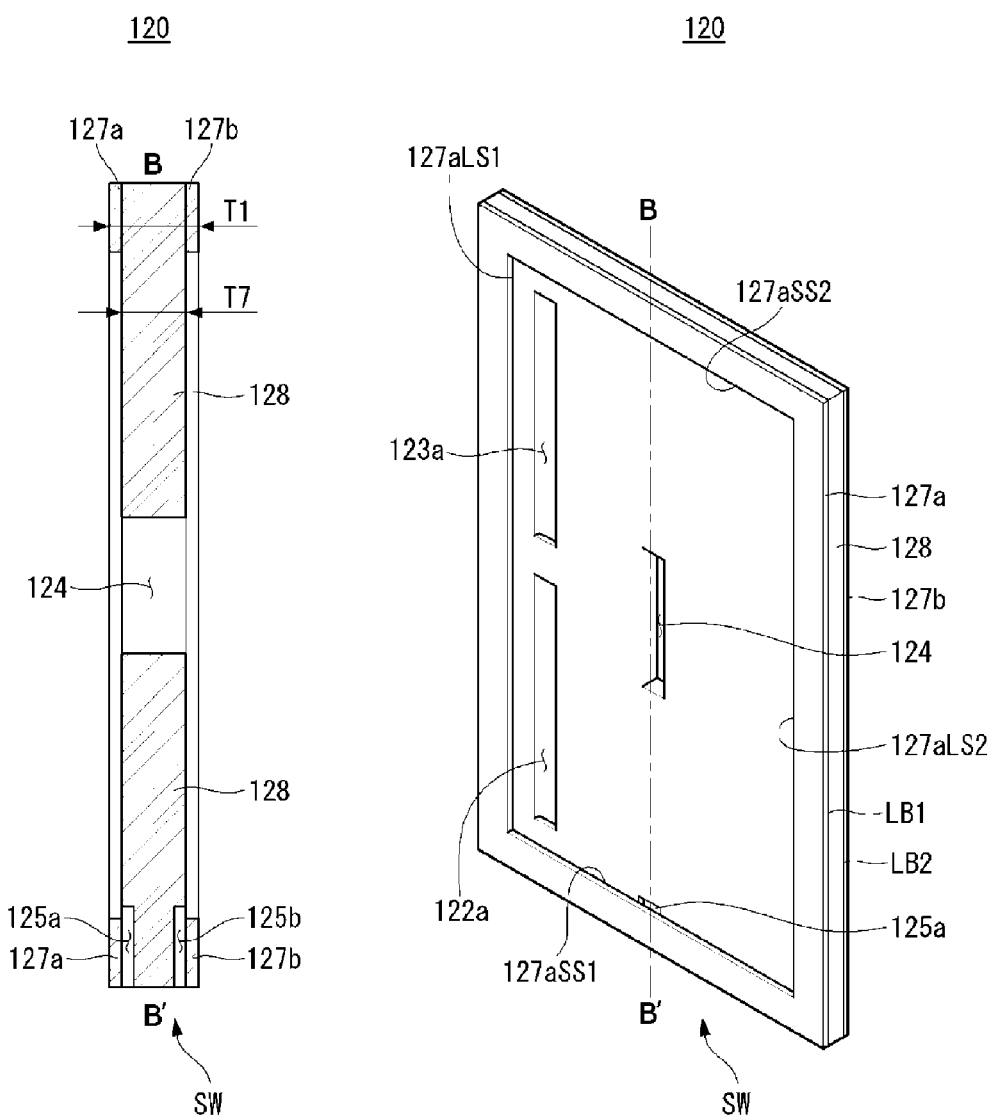

Referring to FIG. 66, a front slot 125a may be disposed at at least a part of the front of the transparent plate 128. A rear slot 125b may be disposed at at least a part of the back of the transparent plate 128. The slot 125a and 125b may refer to at least one between the front slot 125a and the rear slot 125b. Although not shown, the slot 125a and 125b may be formed on the transparent board 129 or the transparent flange 126.

The slot 125a and 125b may be shaped like a hole. The slot 125a and 125b may be formed on the transparent body 120, at one point on a side of the interior of the transparent frame 127a and 127b. For example, the slot 125a and 125b may be formed at one point on the first short sides 127a SS1 and 127b SS1 of the interior of the transparent frame 127a and 127b. The slot 125a and 125b may provide a space through which a cable passes.

A side of the interior of the transparent frame 127a and 127b where the slot 125a and 125b is formed may be connected to another side adjacent to the PCB receiving portions 122a, 123a, 122b, and 123b. For example, the first short side 127a SS1 of the interior of the first transparent frame 127a may be connected to the first long side 127a LS1. For example, the first short side 127b SS1 of the interior of the second transparent frame 127b may be connected to the second long side 127b LS1.

The front slot 125a may overlap the rear slot 125b in a front-back direction. The overlap of the front slot 125a and the rear slot 125b may be related to the overlap of the front cable receiving portion 124a and the rear cable receiving portion 124b. Alternatively, the overlap of the front slot 125a and the rear slot 125b may be related to the structure in which the front cable receiving portion 124a and the rear cable receiving portion 124b may be formed integrally and form the cable receiving portion 124.

As discussed previously herein, the slot 125a and 125b may be formed by removing part of the transparent plate 128. Alternatively, the slot 125a and 125b may be formed by removing part of the transparent frame 127. Alternatively, the slot 125a and 125b may be formed by removing part of the transparent frame 127 and part of the transparent plate 128.

The slot 125a and 125b may be formed by bonding the transparent frame 127a and 127b to a transparent plate 128 with a groove or hole in it. Alternatively, the slot 125a and 125b may be formed by bonding the transparent plate 128 to a transparent frame 127a and 127b with a groove in it. Alternatively, the slot 125a and 125b may be formed by bonding the transparent frame 127a and 127b to a transparent plate 128 on which a bay-shaped bend is located. In this case, the front slot 125a and the rear slot 125b may be formed integrally.

For example, the slot 125a and 125b be formed by bonding together the transparent plate 128 with a groove in it and the transparent frame 127a and 127b. Here, the groove in the transparent plate 128 may be adjacent to one point on the first short sides 127a SS1 and 127b SS1.

The slot 125a and 125b may open in two directions. For example, one end of the slot 125a and 125b may open towards a direction corresponding to the cable receiving portion 124. For example, the other end of the slot 125a and 125b may open towards a sidewall SW of the transparent body 120. The sidewall SW may be the sidewall SW adjacent to the first short sides 127a SS1 and 127b SS1 where the slot 125a and 125b is positioned.

The opening direction of the slot 125a and 125b may correspond to the shape of the slot 125a and 125b. A cable path through the slot 125a and 125b may correspond to the opening direction of the slots 125a and 125b. For example, if one end of the slot 125a and 125b opens towards a direction corresponding to the cable receiving portion 124 and the other end of the slot 125a and 125b opens towards the sidewall SW adjacent to the first short sides 127a SS1 and 127b SS1, the cable may be extended from the cable receiving portion 124, enter one end of the slot 125a and 125b, and pass through the other end of the slot 125a and 125b and make its way out of the sidewall SW.

Figure 67:
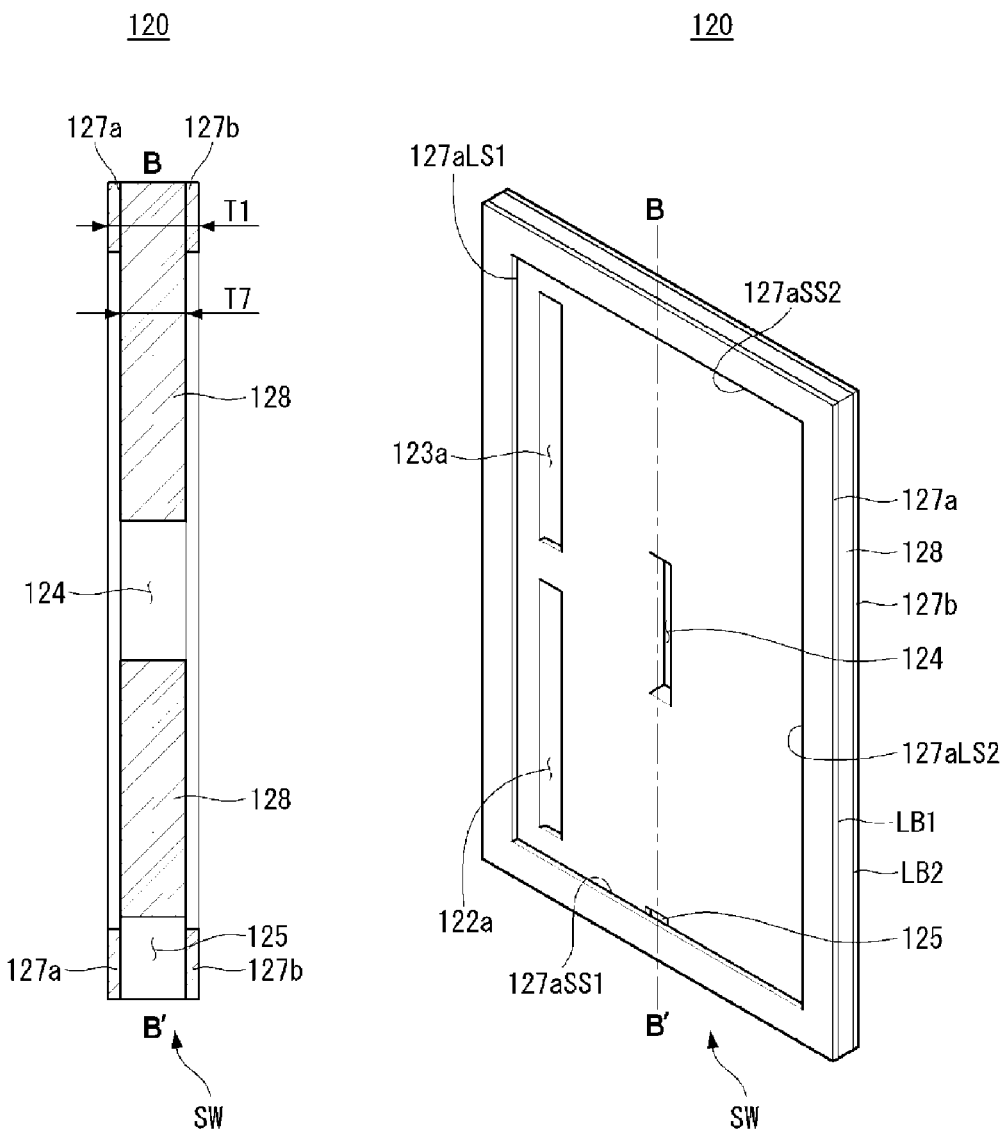

Referring to FIG. 67, the slot 125 may be disposed at at least a part of the front and/or back of the transparent plate 128. The slot 125 may be an opening through the front and side of the transparent plate 128 and allow the front and side of the transparent plate 128 to communicate with each other. Also, the slot 125 may be an opening through the back and side of the transparent plate 128 and allow the back and side of the transparent plate 128 to communicate with each other.

The slot 125 may be formed by bonding the transparent frame 127a and 127b to a transparent plate 128 on which a bay-shaped bend is located. Here, the bend may be recessed towards the sidewall SW of the transparent body 120.

Figure 68:
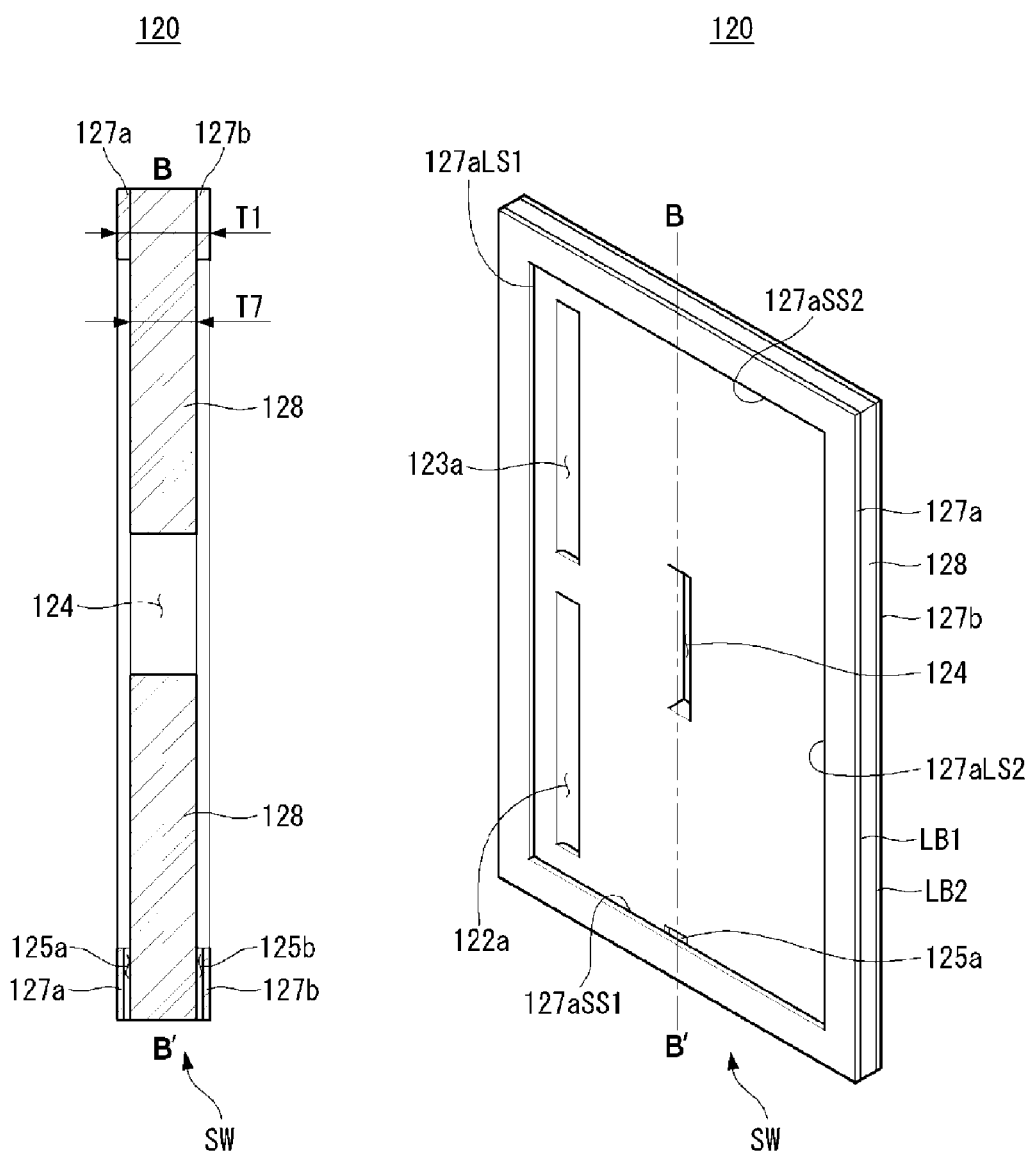

Referring to FIG. 68, the front slot 125a may be visible on at least a part of the front of the transparent plate 128. The rear slot 125b may be disposed at at least a part of the back of the transparent plate 128. The front slot 125a may be an opening through the front and side of the transparent body 120 and allow the front of the transparent plate 128 and the side of the transparent body 120 to communicate with each other. The rear slot 125b may also be an opening through the back and side of the transparent body 120 and allow the back of the transparent plate 128 and the side of the transparent body 120.

The slot 125a and 125b may be formed by bonding the transparent plate 128 to a transparent frame 127a and 127b with a groove in it. The groove formed on the transparent frame 127a and 127b may be shaped to run across the side where the groove is formed. The grooves positioned on the transparent frame 127a and 127b may be formed by a grinder, chemical etching, etc.

Figure 69:
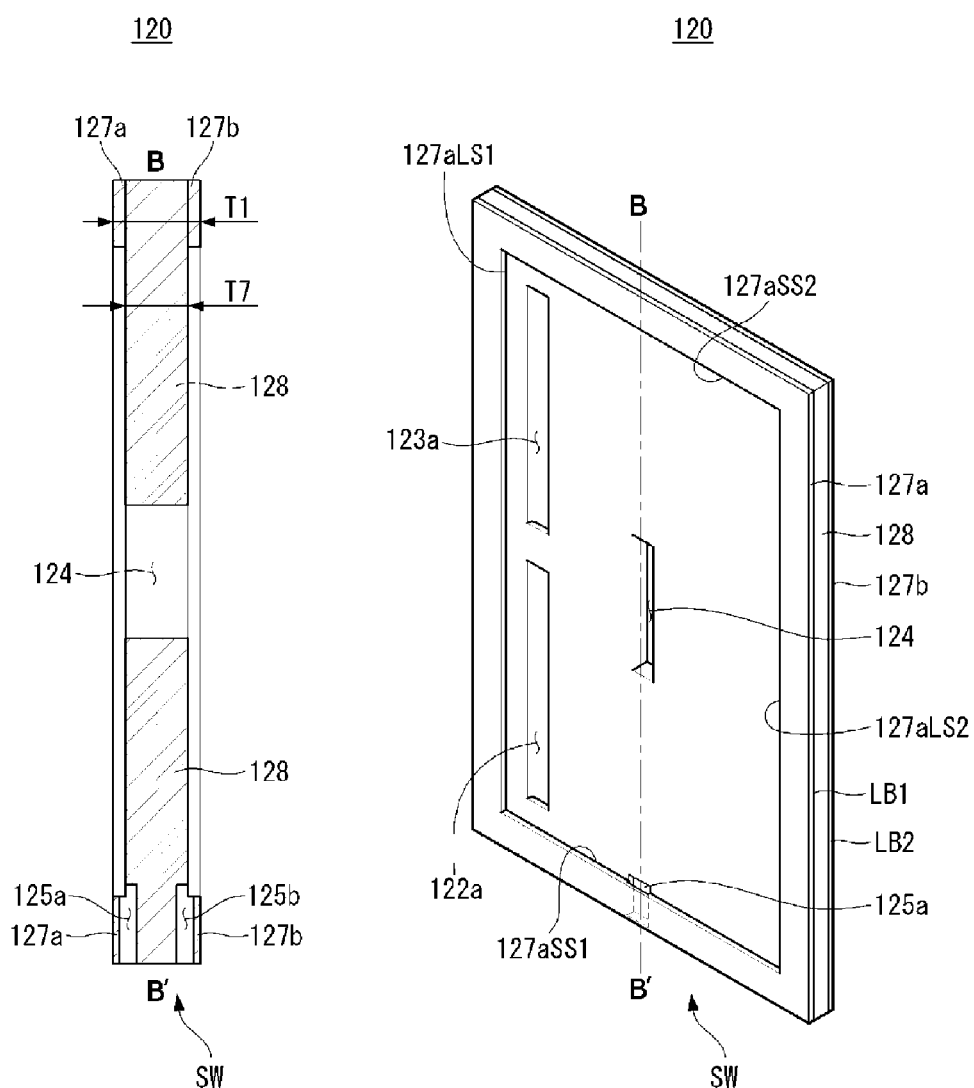

Referring to FIG. 69, the front slot 125a may be disposed at at least a part of the front of the transparent plate 128. The rear slot 125b may be visible on at least a part of the back of the transparent plate 128. The front slot 125a may be an opening through the front and side of the transparent plate 128 and allow the front of the transparent plate 128 and the side of the transparent body 120 to communicate with each other. The rear slot 125b may be an opening through the back and side of the transparent body 120 and allow the back of the transparent plate 128 and the side of the transparent body 120.

The slot 125a and 125b may be formed by bonding a transparent plate 128 with a groove in it to a transparent frame 127a and 127b with a groove in it. The groove formed on the transparent frame 127a and 127b and/or transparent plate 128 may be shaped to run across the side where the groove is formed. The groove positioned on the transparent frame 127a and 127b and/or transparent plate 128 may be formed by a grinder, chemical etching, etc.

Figure 70:
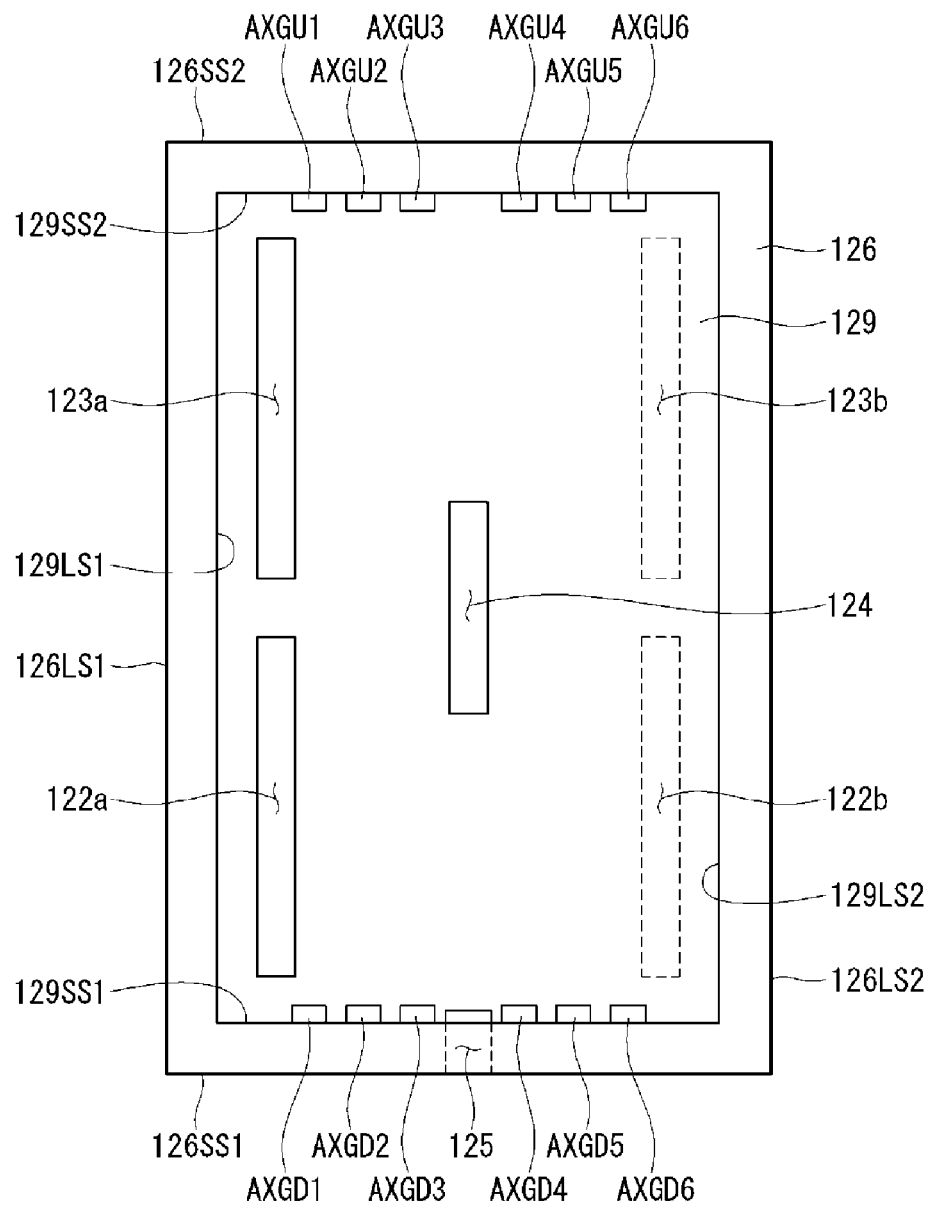

Referring to FIG. 70, auxiliary grooves AXGU1, AXGU2, AXGU3, AXGU4, AXGU5, AXGU6, AXGD1, AXGD2, AXGD3, AXGD4, AXGD5, and AXGD6 may be visible on at least a part of the front of the transparent body 120. The auxiliary grooves AXGU1, AXGU2, AXGU3, AXGU4, AXGU5, AXGU6, AXGD1, AXGD2, AXGD3, AXGD4, AXGD5, and AXGD6 may be provided in multiple units. The auxiliary grooves AXGU1, AXGU2, AXGU3, AXGU4, AXGU5, AXGU6, AXGD1, AXGD2, AXGD3, AXGD4, AXGD5, and AXGD6 may comprise upper auxiliary grooves AXGU1, AXGU2, AXGU3, AXGU4, AXGU5, and AXGU6 and lower auxiliary grooves AXGD1, AXGD2, AXGD3, AXGD4, AXGD5, and AXGD6. Although not shown, auxiliary grooves may be arranged on the back of the transparent body 120 as well.

The cable receiving portion 124 may be positioned between two groups of auxiliary grooves AXGU1, AXGU2, AXGU3, AXGU4, AXGU5, AXGU6, AXGD1, AXGD2, AXGD3, AXGD4, AXGD5, and AXGD6. At least a part of the auxiliary grooves AXGU1, AXGU2, AXGU3, AXGU4, AXGU5, AXGU6, AXGD1, AXGD2, AXGD3, AXGD4, AXGD5, and AXGD6 may be formed adjacent to a side connected to the side adjacent to the front PCB receiving portion 122a and 123a. For example, the upper auxiliary grooves AXGU1, AXGU2, AXGU3, AXGU4, AXGU5, and AXGU6 may be formed adjacent to the second short side 129SS2 connected to the first long side 129LS1 adjacent to the front PCB receiving portion 122a and 123a. For example, the lower auxiliary grooves AXGD1, AXGD2, AXGD3, AXGD4, AXGD5, and AXGD6 may be formed adjacent to the first short side 129SS1 connected to the first long side 129LS1 adjacent to the front PCB receiving portion 122a and 123a.

The auxiliary grooves AXGU1, AXGU2, AXGU3, AXGU4, AXGU5, AXGU6, AXGD1, AXGD2, AXGD3, AXGD4, AXGD5, and AXGD6 may provide space where at least some of the parts extending from the display panel are seated. Here, the parts extending from the display panel may be chips mounted on a film.

FIGS. 71 to 74 are views illustrating examples of a display panel according to an exemplary embodiment of the present invention.

Figure 71:
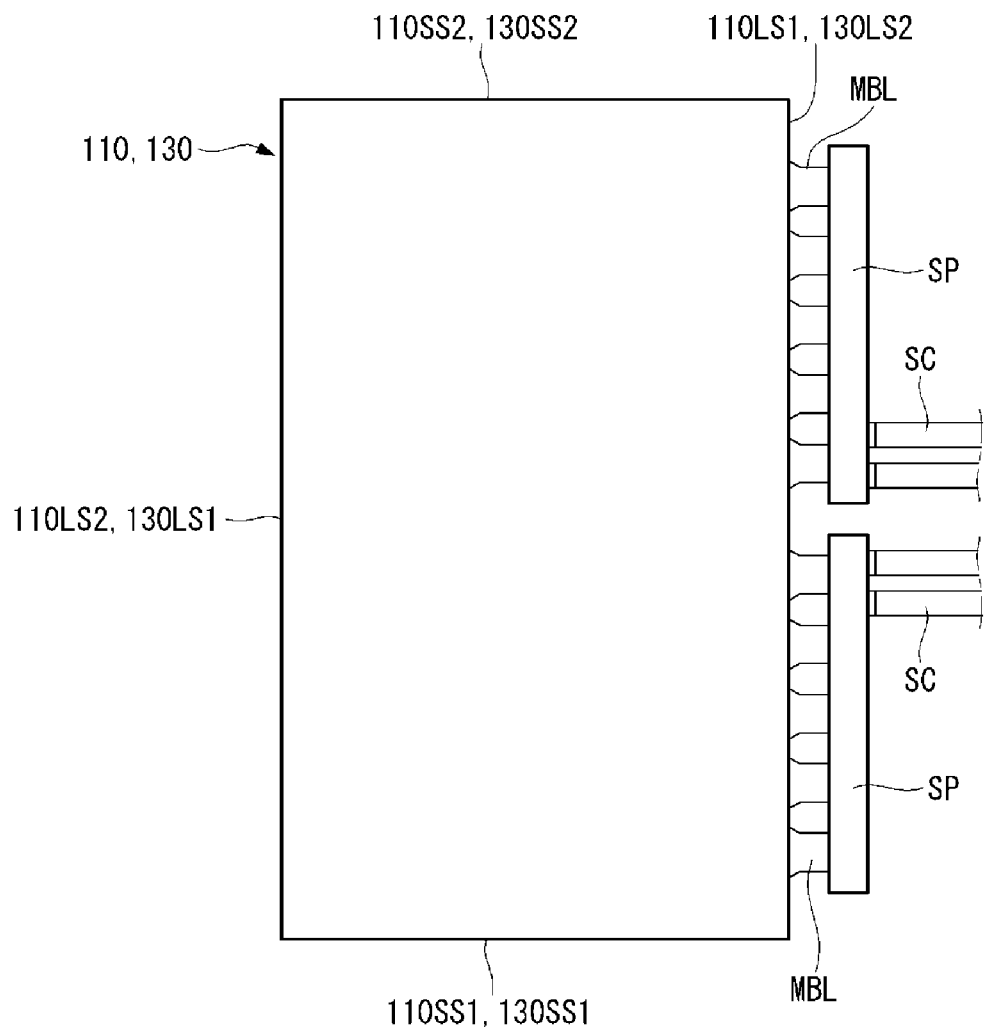
FIGS. 71, 72, 73, and 74 are views illustrating examples of a display panel according to an exemplary embodiment of the present invention.

Referring to FIG. 71, the display panel 110 and 130 may provide an image on a surface. The display panel 110 and 130 may break an image down into a plurality of pixels and output the image in accordance with the color, brightness, and saturation of each individual pixel. The display panel 110 and 130 may produce light of a color comprising at least one among red, green, and blue, in response to a control signal.

A member layer MBL may be connected to a side of the display panel 110 and 130. For example, the member layer MBL may extend from the first long side 110LS1 of the first display panel 110. For example, the member layer MBL may extend from the second long side 130LS2 of the second display panel 130.

The member layer MBL may comprise at least one among COF (chip-on-film), COG (chip-on-glass), FPCB, and TCP (tape carrier package). The member layer MBL may be flexible. The member layer MBL may be provided in multiple units. The member layer MBL may be electrically connected to the display panel 110 and 130. The member layer MBL may supply electric power to the display panel 110 and 130. The pixels of the display panel 110 and 130 may be controlled by an electrical current delivered to the display panel 110 and 130 via the member layer MBL.

A cable SC may be electrically connected to the display panel 110 and 130. The cable SC may carry an electric current to the display panel 110 and 130. The cable SC may send the display panel 110 and 130 an electrical signal for controlling the pixels of the display panel 110 and 130. The cable SC may be electrically connected to the member layer MBL.

A PCB SP may be electrically connected to the member layer MBL. The PCB SP may be electrically connected to the cable SC. The PCB SP may be relatively larger than the member layer MBL and/or the cable SC. The PCB SP may take up a certain amount of volume on a side of the display panel 110 and 130. The thickness of the PCB SP may vary depending on the type, arrangement, or/and shape of electronic devices mounted on the PCB SP. The PCB SP may be a source PCB.

Figure 72:
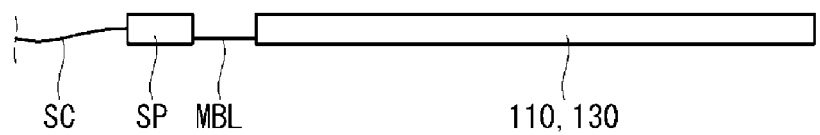

Referring to FIG. 72, a cross-section of the display panel 110 and 130, a cross-section of the member layer MBL, a cross-section of the PCB SP, and a cross-section of the cable SC are depicted.

The display panel 110 and 130 may be connected to the member layer MBL. The member layer MBL may connect the PCB SP and the display panel 110 and 130. The PCB SP may be thicker than the display panel 110 and 130. The cable SC may be connected to the PCB SP.

The cable SC may be electrically connected to the PCB SP. The PCB SP may be electrically connected to the member layer MBL. The member layer MBL may be electrically connected to the display panel 110 and 130. Electrical connection of two different devices may mean that an electrical signal and/or current may be sent and received between two different devices.

Figure 73:
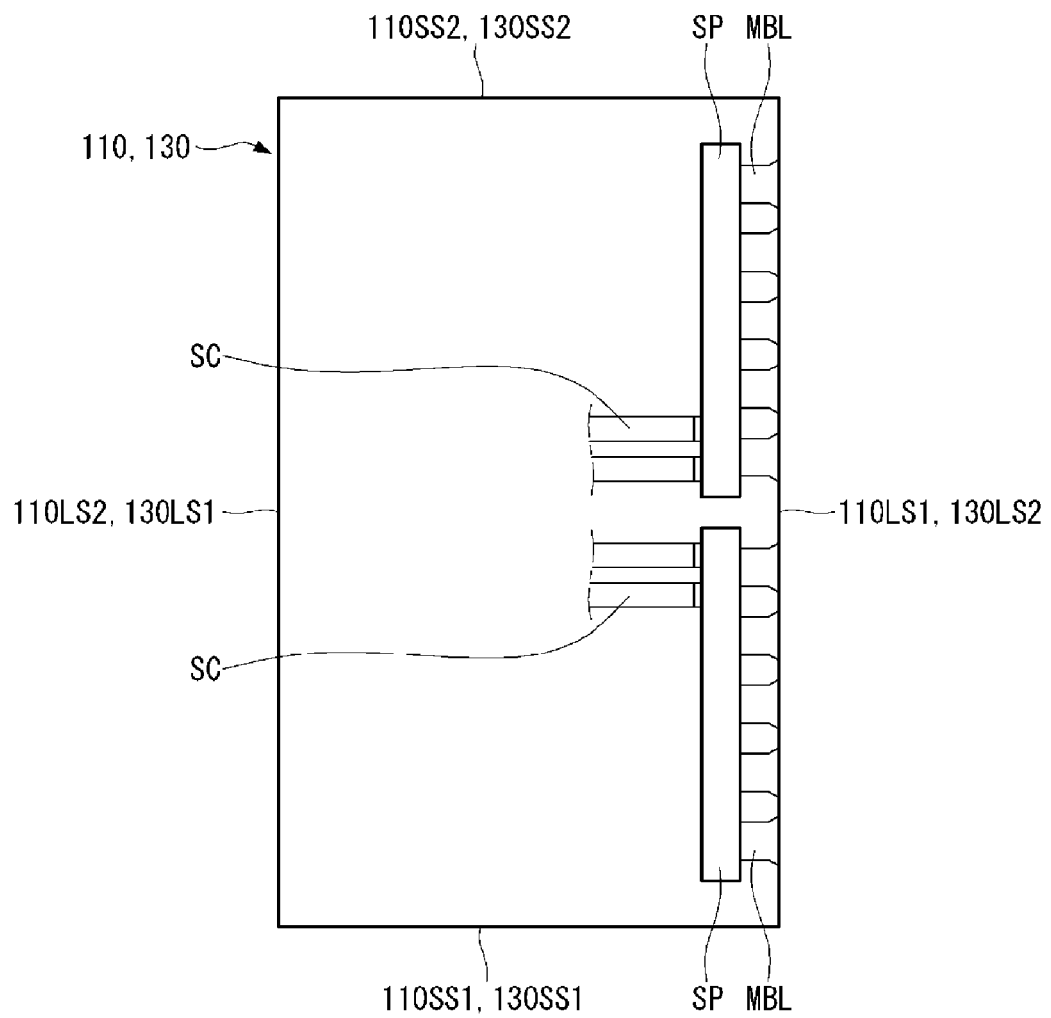

Referring to FIG. 73, the member layer MBL may bend. The member layer MBL may overlap the display panel 110 and 130 since it is flexible. That is, at least a part of the member layer MBL may overlap the display panel 110 and 130. At least a part of the member layer MBL may be positioned on the back of the display panel 110 and 130.

The member layer MBL may extend from a side of the display panel 110 and 130 towards an opposite side of the display panel 110 and 130. For example, the member layer MBL may extend from the first long side 110LS1 of the first display panel 110 towards the second long side 110LS2. For example, the member layer MBL may extend from the first long side 130LS1 of the first display panel 130 towards the second long side 130LS2.

The PCB SP connected to the member layer MBL may be adjacent to a side of the display panel 110 and 130 that is connected to the member layer MBL. For example, the PCB SP may be positioned adjacent to the first long side 110LS1 of the first display panel 110. For example, the PCB SP may be positioned adjacent to the second long side 130LS2 of the second display panel 130.

The PCB SP may be positioned between the first long side 110LS1 and second long side 110LS2 of the first display panel 110. Also, the PCB SP may be positioned between the second long side 130LS2 and first long side 130LS1 of the second display panel 130. The cable SC connected to the PCB SP may be extended in a direction from the member layer MBL to the PCB SP.

Figure 74:
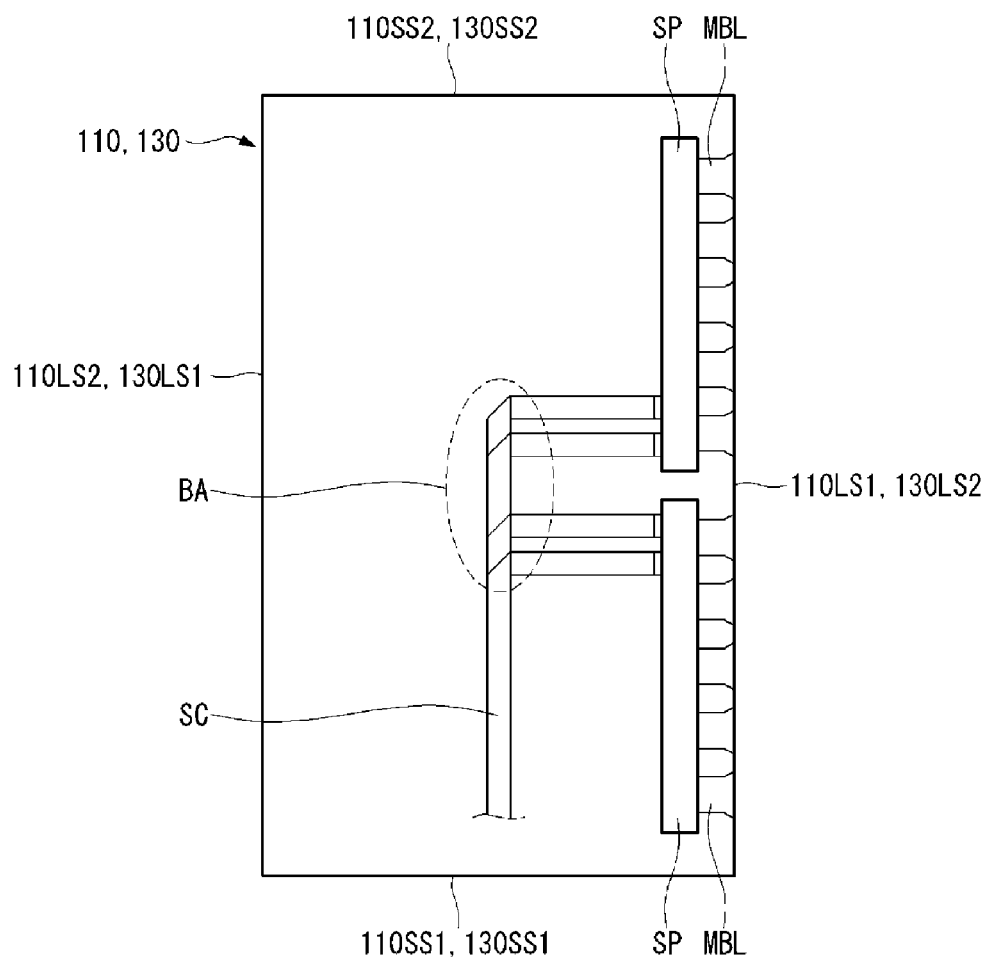

Referring to FIG. 74, the cable SC extended from the PCB SP may bend. The arrangement of the member layer MBL, PCB SP, and cable SC will be discussed. The member layer MBL may extend from a side of the display panel 110 and 130 towards an opposite side of the display panel 110 and 130. For example, the member layer MBL may extend from the first long side 110LS1 of the first display panel 110 towards the second long side 110LS2. For example, the member layer MBL may extend from the second long side 130LS2 of the second display panel 130 towards the first long side 130LS1.

The PCB SP may be connected to the member layer MBL, and closer to the opposite side of the display panel 110 and 130 than the member layer MBL is. For example, the PCB SP may be closer to the second long side 110LS2 of the first display panel 110 than the member layer MBL is. For example, the PCB SP may be closer to the first long side 130LS1 of the second display panel 130 than the member layer MBL is The cable SC may make its way from the PCB SP towards the opposite side of the display panel 110 and 130, and be bent towards an adjacent side connected to the side from which the member layer MBL extends. For example, the cable SC may make its way towards the second long side 110LS2 of the first display panel 110, and be bent towards the first short side 110SS1 connected to the first long side 110LS1. For example, the cable SC may make its way towards the first long side 130LS1 of the second display panel 130, and be bent towards the first short side 130SS1 connected to the second long side 130LS2.

An area where the cable SC is bent may be formed. For example, the cable SC may have a bending area BA where the cable SC is bent. In the bending area BA, a plurality of cables SC may be bent and stacked. The stacked cables SC may be thickest in the bending area BA.

Although not shown, the cable SC that is bent and extended may be connected to a controller that does not overlap the display panel 110 and 130 in a front-back direction. Since the cable SC is bent, the display panel 110 and 130 may be placed in various attitudes.

The arrangement of the member layer MBL, PCB SP, and cable SC relative to a side of the display panel 110 and 130 connected to the member layer MBL and the opposite side will be discussed. For example, the member layer MBL, PCB SP, and cable SC may be sequentially connected in a direction from the first long side 110LS1 of the first display panel 110, connected to the member layer MBL, towards the second long side 110LS2. For example, the member layer MBL, PCB SP, and cable SC may be sequentially connected in a direction from the second long side 130LS2 of the second display panel 130, connected to the member layer MBL, towards the first long side 130LS1.

Figure 75:
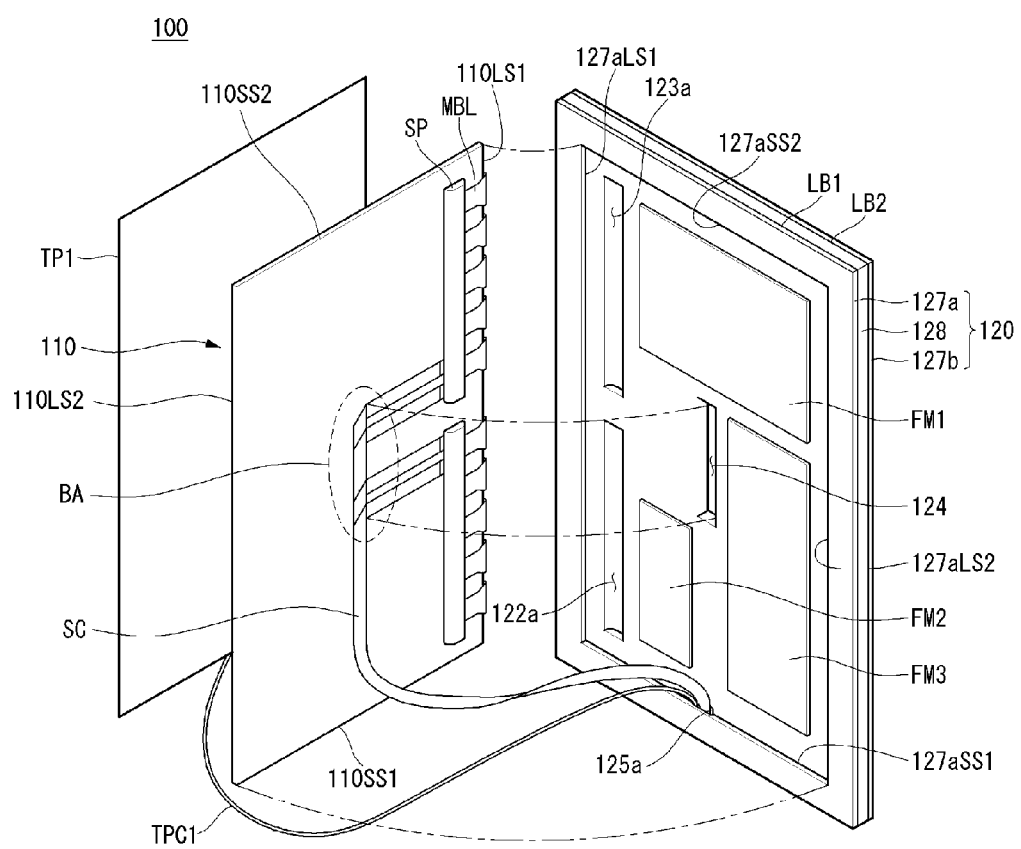
FIGS. 75, 76, and 77 are views illustrating examples of how the components of a display device according to an exemplary embodiment of the present invention are attached to one another.
Figure 76:
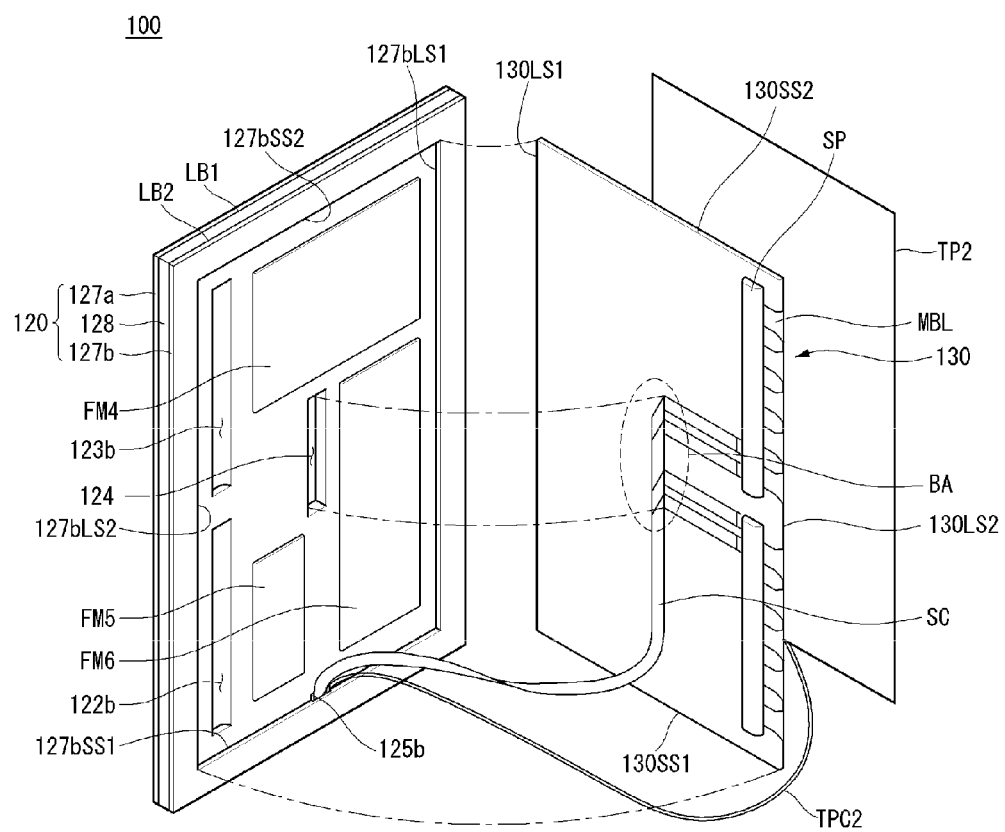
Figure 77:
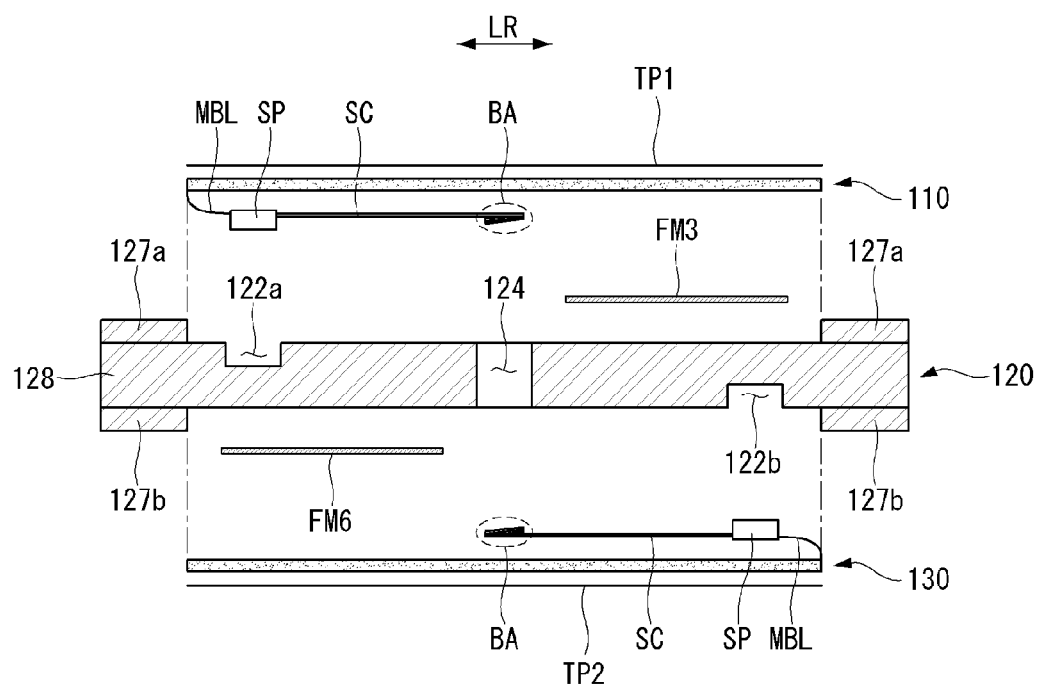

FIGS. 75 to 77 are views illustrating examples of how the components of a display device according to an exemplary embodiment of the present invention are attached to one another.

Referring to FIG. 75, the back side of the first display panel 110 may be positioned to face the front side of the transparent body 120. For example, the first long side 110LS1, first short side 110SS1, second long side 110LS2, and second long side 110SS2 of the first display panel 110 may face the first long side 127*a* LS1, first short side 127*a* SS1, second long side 127*a* LS2, and second long side 127*a* SS2 of the interior of the first transparent frame 127*a*.

The back side of a first touch panel TP1 may be positioned at the front side of the first display panel 110. The first touch panel TP1 may receive and detect touch input. The first touch panel TP1 may be transparent. The first touch panel TP1 may allow at least a part of an image displayed on the first display panel 110 to pass through and be visible. The first touch panel TP1 may correspond to the shape of the first display panel 110.

A first touch panel cable TPC1 may be extended from a side of the first touch panel TP1. The first touch panel cable TPC1 may be passed through the front slot 125*a*. The first touch panel cable TCP1 may run along a side of the first display panel 110, between a side of the first touch panel TP1 and the front slot 125*a*. For example, the first touch panel cable TPC1 may run along the first short side SS1 of the first display panel 110. The first touch panel TP1 may be positioned on the side of the first display panel 110. Although not shown, the first touch panel cable TPC1 passed through the front slot 125*a* may be electrically connected to a controller.

With the first display panel 110 attached to the transparent body 120, the first long side 127*a* LS1, first short side 127*a* SS1, second long side 127*a* LS2, and second long side 127*a* SS2 of the interior of the first transparent frame 127*a* may correspond to the first long side 110LS1, first short side 110SS1, second long side 110LS2, and second long side 110SS2 of the first display panel 110. For example, the front PCB receiving portion 122*a* and 123*a* may be formed along the length of the first long side 110LS1 of the first display panel 110. For example, the front slot 125*a* may be formed adjacent to the first short side 110SS1 connected to the first long side 110LS1 of the first display panel 110.

At least a part of the member layer MBL, PCB SP, and cable SC may be positioned on the back side of the first display panel 110. When the first display panel 110 and the transparent body 120 are coupled together, at least a part of the member layer MBL, PCB SP, and cable SC may be positioned between the first display panel 110 and the transparent plate 128. The cable SC may be passed through the front slot 125*a*.

An attachment members FM1, FM2, and FM3 may be positioned at the front of the transparent plate 128. The attachment members FM1, FM2, and FM3 may have a certain thickness. For example, the thickness of the attachment members FM1, FM2, and FM3 may be greater than the thickness of the cable SC. The attachment members FM1, FM2, and FM3 may be adhesive tape or a magnet. The attachment members FM1, FM2, and FM3 may form a layer. For example, the attachment members FM1, FM2, and FM3 may be formed by stacking adhesive tape and a magnet. The attachment members FM1, FM2, and FM3 may be provided in multiple units. For example, the attachment members FM1, FM2, and FM3 may comprise a first attachment member FM1, a second attachment member FM2, and a third attachment member FM3.

The front PCB receiving portion 122*a* and 123*a* positioned on the front side of the transparent plate 128 may receive at least a part of the PCB SP. Since the PCB SP is received in the front PCB receiving portion 122*a* and 123*a*, the cable SC may be bent to extend between the front PCB receiving portion 122*a* and 123*a* and the front slot 125*a*. The front PCB receiving portion 122*a* and 123*a* may be shaped like a groove or a hole.

The cable receiving portion 124 positioned at the front side of the transparent plate 128 may receive at least a part of the cable SC. For example, the cable receiving portion 124 may receive a bending area BA of cable SC which has a greater thickness than the rest of the cable. The cable receiving portion 124 may be shaped like a groove or a hole.

Referring to FIG. 76, the back side of the second display panel 130 may be positioned to face the back side of the transparent body 120. For example, the first long side 130LS1, first short side 130SS1, second long side 130LS2, and second long side 130SS2 of the second display panel 130 may face the first long side 127*b* LS1, first short side 127*b* SS1, second long side 127*b* LS2, and second long side 127*b* SS2 of the interior of the second transparent frame 127*b*.

The back side of a second touch panel TP2 may be positioned at the front side of the second display panel 130. The second touch panel TP2 may receive and detect touch input. The second touch panel TP2 may be transparent. The second touch panel TP2 may allow at least a part of an image displayed on the second display panel 130 to pass through and be visible. The second touch panel TP2 may correspond to the shape of the second display panel 130. The touch panel may refer to at least one of the first and second touch panels.

A second touch panel cable TPC2 may be extended from a side of the second touch panel TP2. The second touch panel cable TPC2 may be passed through the rear slot 125b. The second touch panel cable TCP2 may run along a side of the second display panel 130, between a side of the second touch panel TP2 and the rear slot 125b. For example, the second touch panel cable TPC2 may run along the first short side 130SS1 of the second display panel 130. Although not shown, the second touch panel cable TPC2 passed through the rear slot 125b may be electrically connected to a controller. The touch panel cable may refer to at least one of the first and second touch panel cables.

With the second display panel 130 attached to the transparent body 120, the first long side 127b LS1, first short side 127b SS1, second long side 127b LS2, and second long side 127b SS2 of the interior of the second transparent frame 127b may correspond to the first long side 130LS1, first short side 130SS1, second long side 130LS2, and second long side 130SS2 of the second display panel 130. For example, the rear PCB receiving portion 122b and 123b may be formed along the length of the second long side 130LS2 of the second display panel 130. For example, the rear slot 125b may be formed adjacent to the first short side 130SS1 connected to the second long side 130LS2 of the second display panel 130.

At least a part of the member layer MBL, PCB SP, and cable SC may be positioned on the back side of the second display panel 130. When the second display panel 130 and the transparent body 120 are coupled together, at least a part of the member layer MBL, PCB SP, and cable SC may be positioned between the second display panel 130 and the transparent plate 128. The cable SC may be passed through the rear slot 125b.

Attachment members FM4, FM5, and FM6 may be positioned on the back side of the transparent plate 128. The attachment members FM4, FM5, and FM6 may have a certain thickness. For example, the thickness of the attachment members FM4, FM5, and FM6 may be greater than the thickness of the cable SC. The attachment members FM4, FM5, and FM6 may be adhesive tape or a magnet. The attachment members FM4, FM5, and FM6 may form a layer. For example, the attachment members FM4, FM5, and FM6 may be formed by stacking adhesive tape and a magnet. The attachment members FM4, FM5, and FM6 may be provided in multiple units. For example, the attachment members FM4, FM5, and FM6 may comprise a fourth attachment member FM4, a fifth attachment member FM5, and a sixth attachment member FM6.

The rear PCB receiving portion 122b and 123b positioned on the back side of the transparent plate 128 may receive at least a part of the PCB SP. Since the PCB SP is received in the rear PCB receiving portion 122b and 123b, the cable SC may be bent to extend between the rear PCB receiving portion 122b and 123b and the ear slot 125b. The rear PCB receiving portion 122b and 123b may be shaped like a groove or a hole.

The cable receiving portion 124 positioned at the back side of the transparent plate 128 may receive at least a part of the cable SC. For example, the cable receiving portion 124 may receive a bending area BA of cable SC which has a greater thickness than the rest of the cable SC. The cable receiving portion 124 may be shaped like a groove or a hole.

Referring to FIG. 77, a cross-sectional view of an example of how the display panel 110 and 130 and the transparent body 120 are coupled together is depicted. The member layer MBL, PCB SP, and cable SC may be positioned at the back side of the display panel 110 and 130. The first touch panel TP1 may be positioned in front of the first display panel 110. The second touch panel TP2 may be positioned in front of the second display panel 130.

The PCB SP may be positioned in such a way so as to be received in the PCB receiving portion 122a and 123a. The bending area BA of the cable may be received in the cable receiving portion 124. The attachment member FM3 and FM6 may attach or couple the display panel 110 and 130 and the transparent plate 128 together.

FIGS. 78 to 81 are views illustrating various examples of a cross-section of a display device according to an exemplary embodiment of the present invention.

Figure 78:
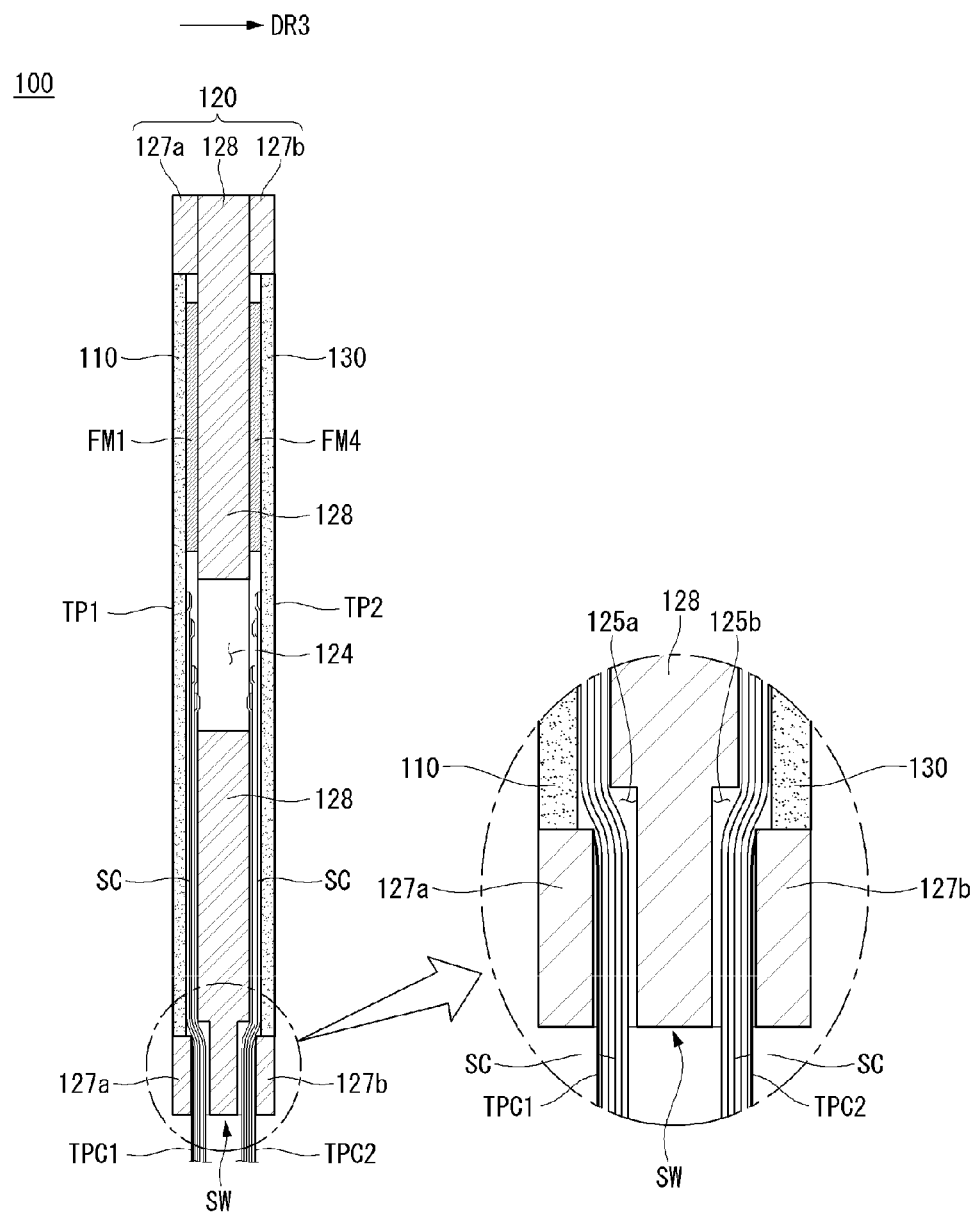
FIGS. 78, 79, 80, and 81 are views illustrating various examples of a cross-section of a display device according to an exemplary embodiment of the present invention.

Referring to FIG. 78, the display panel 110 and 130 may be attached or coupled to the transparent plate 128 by an attachment member or multiple attachment members FM1 and FM4. The display panel 110 and 130 may be fitted to the transparent frame 127a and 127b. The first touch panel TP1 may be positioned at a front of the first display panel 110. The second touch panel TP2 may be positioned at a front of the second display panel 130.

A cable SC may be extended from a side of the first display panel 110 to the cable receiving portion 124, bent at a region corresponding to the cable receiving portion 124, and inserted into or passed through the front slot 125a. The cable SC may be bent as it is inserted into the front slot 125a.

The front slot 125a may open towards the outside of the sidewall SW of the transparent body 120. The front slot 125a may be formed by attaching the first transparent frame 127a to a transparent plate 128 with a groove in it.

The cable SC may be extended from a side of the second display panel 130 to the cable receiving portion 124, bent at a region corresponding to the cable receiving portion 124, and inserted into the rear slot 125b.

The rear slot 125b may open towards the outside of the sidewall SW of the transparent body 120. The rear slot 125b may be formed by attaching the second transparent frame 127b to a transparent plate 128 with a groove in it.

The cable SC may pass through the slot 125a and 125b and make its way out of the sidewall SW of the transparent body 120. For example, the cable SC may pass through the slot 125a and 125b and come out of the bottom of the transparent body 120. The cable SC making its way out of the transparent body 120 may be electrically connected to a controller (not shown).

The first touch panel cable TPC1 may be extended from a side of the first touch panel TP1 and pass through the front slot 125a. The second touch panel cable TPC2 may be extended from a side of the second touch panel TP2 and pass through the rear slot 125b. The touch panel cable TPC1 and TPC2 may make its way out of the sidewall SW of the transparent body 120 once it has passed through the slot 125a and 125b. The touch panel cable TPC1 and TPC2 making its way out of the sidewall SW of the transparent body 120 may be electrically connected to a controller (not shown).

Figure 79:
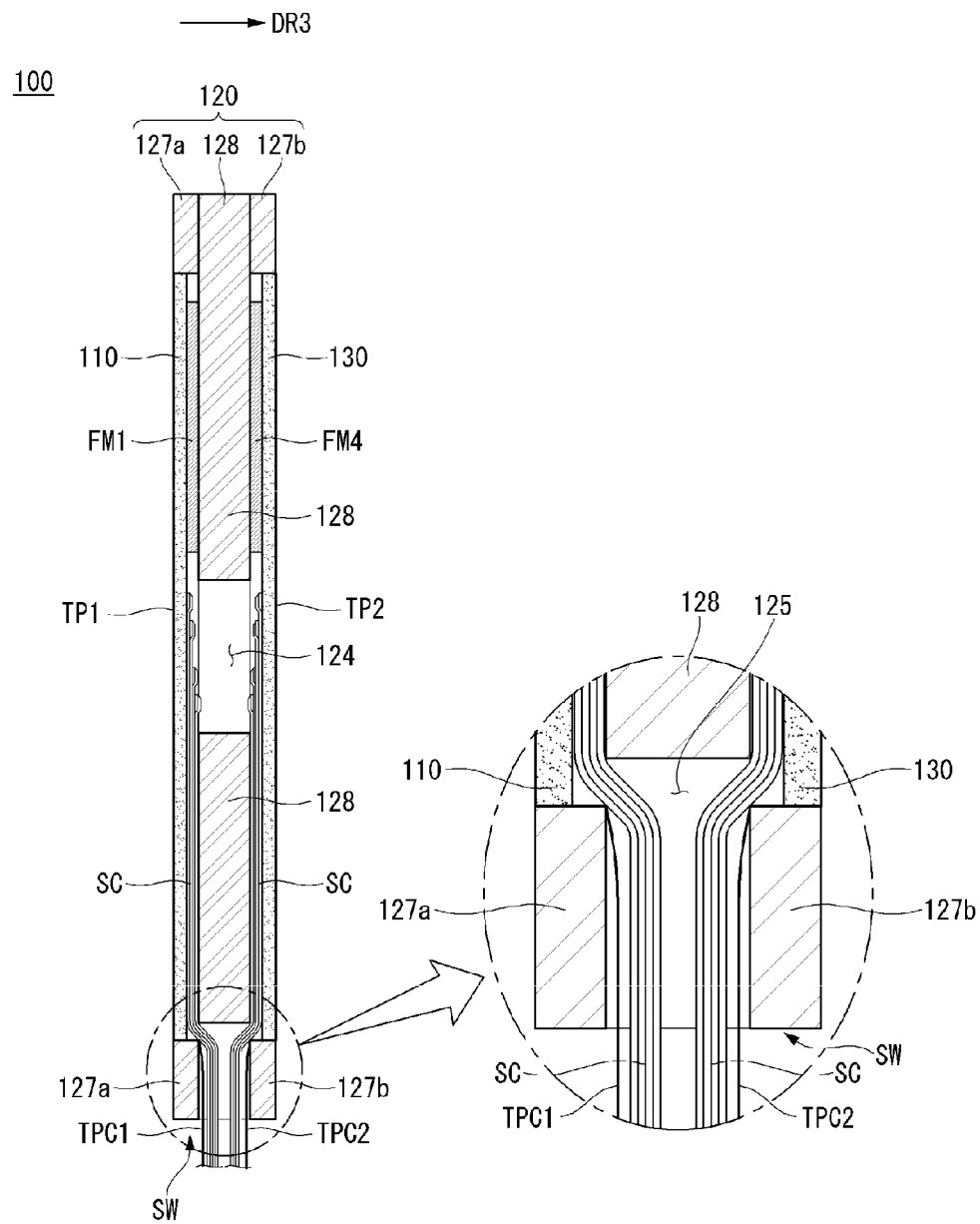

Referring to FIG. 79, the display panel 110 and 130 may be attached or coupled to the transparent plate 128 by an attachment member or multiple attachment members FM1 and FM4. The display panel 110 and 130 may be fitted to the transparent frame 127a and 127b. The first touch panel TP1 may be positioned at a front of the first display panel 110. The second touch panel TP2 may be positioned at a front of the second display panel 130.

A cable SC extended from a side of the display panel 110 and 130 may have a bending area BA where the cable SC is bent at the back side of the display panel 110 and 130. The cable SC at the bending area BA may be received in the cable receiving portion 124 formed on a side of the transparent plate 128. The cable SC may be extended from a side of the display panel 110 and 130 to the cable receiving portion 124, bent at a region corresponding to the cable receiving portion 124, and inserted into the slot 125.

The slot 125 may open towards the outside of the sidewall SW of the transparent body 120. The slot 125 may be formed by attaching the transparent frame 127a and 127b to a transparent plate 128 on which a bay-shaped bend is located. Here, the bend may be recessed towards the outside of the sidewall SW. It may be understood that the slot 125 is composed of a front slot and a rear slot that communicate with each other.

The cable SC may be bent as it enters the slot 125. The part that is bent as the cable SC enters the slot 125 may be short in length. In the area from the cable receiving portion 124 to the slot 125, the cable SC is subjected to pressure since it is positioned between the display panel 110 and 130 and the transparent plate 128. The pressure on the cable SC from the transparent plate 128 may decrease or disappear as it enters the slot 125. Due to this, the cable SC may be bent towards the back of the display panel 110 and 130 as it enters the slot 125.

The cable SC may pass through the slot 125 and make its way out of the sidewall SW of the transparent body 120 and/or backwards of the transparent body 120. For example, the cable SC may pass through the slot 125 and come out of the bottom of the transparent body 120. The cable SC making its way out of the transparent body 120 may be electrically connected to a controller (not shown).

The first touch panel cable TPC1 may be extended from a side of the first touch panel TP1 and pass through the slot 125. The second touch panel cable TPC2 may be extended from a side of the second touch panel TP2 and pass through the slot 125. The touch panel cable TPC1 and TPC2 may make its way out of the transparent body 120 once it has passed through the slot 125. The touch panel cable TPC1 and TPC2 making its way out of the transparent body 120 may be electrically connected to a controller (not shown).

Figure 80:
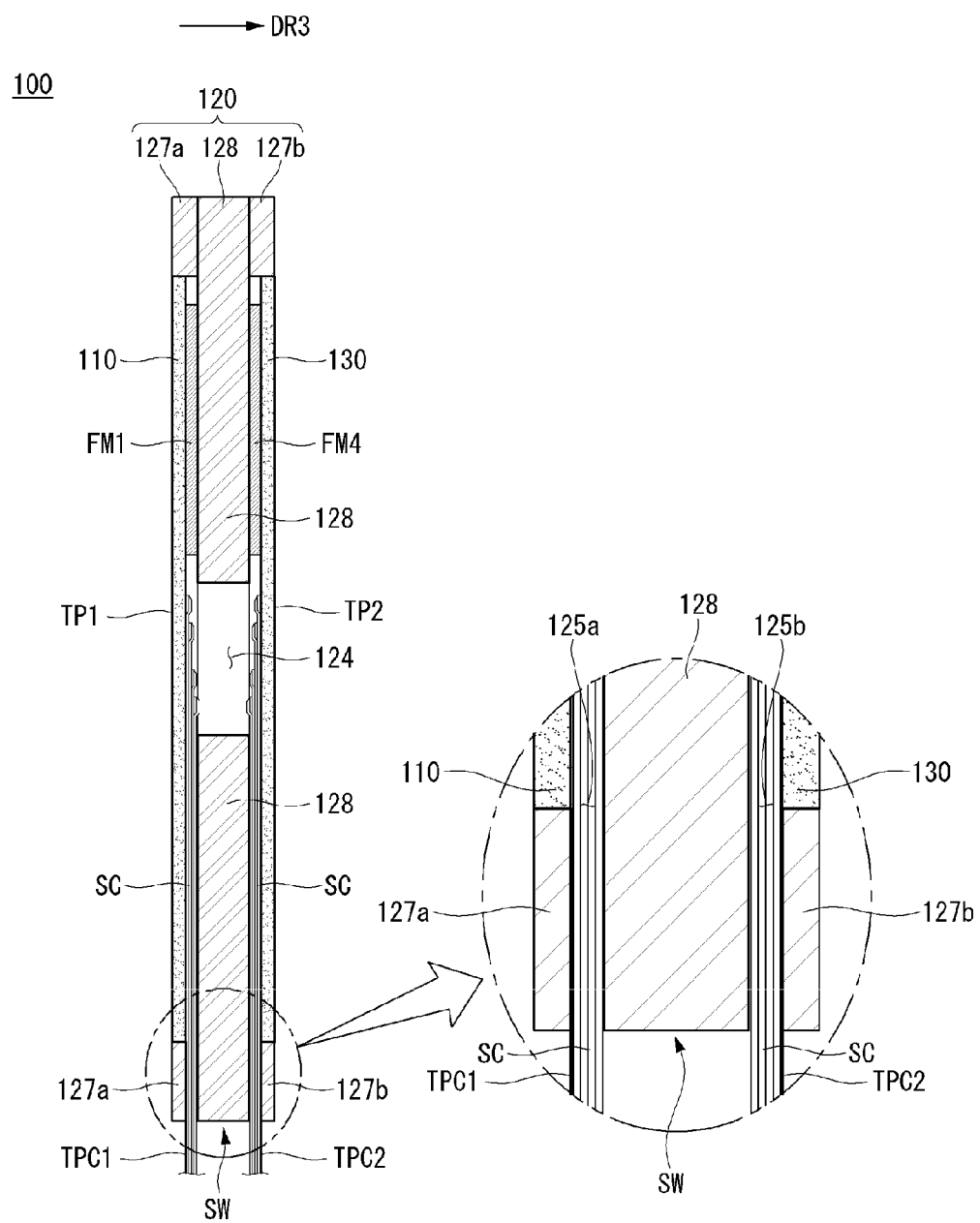

Referring to FIG. 80, the display panel 110 and 130 may be attached or coupled to the transparent plate 128 by an attachment member or multiple attachment members FM1 and FM4. The display panel 110 and 130 may be fitted to the transparent frame 127a and 127b. The first touch panel TP1 may be positioned at a front of the first display panel 110. The second touch panel TP2 may be positioned at a front of the second display panel 130.

A cable SC may be extended from a side of the first display panel 110 to the cable receiving portion 124, bent at a region corresponding to the cable receiving portion 124, and inserted into the front slot 125a. The front slot 125a may open towards the outside of the sidewall SW of the transparent body 120. The front slot 125a may be formed by attaching the transparent plate 128 to a first transparent frame 127a with a groove in it.

The cable SC may be extended from a side of the second display panel 130 to the cable receiving portion 124, bent at a region corresponding to the cable receiving portion 124, and inserted into the rear slot 125b. The rear slot 125b may open towards the outside of the sidewall SW of the transparent body 120. The rear slot 125b may be formed by attaching the transparent plate 128 to a second transparent frame 127b with a groove in it.

The cable SC may pass through the slot 125a and 125b and make its way out of the sidewall SW of the transparent body 120. For example, the cable SC may pass through the slot 125a and 125b and come out of the bottom of the transparent body 120. The cable SC making its way out of the transparent body 120 may be electrically connected to a controller (not shown).

The first touch panel cable TPC1 may be extended from a side of the first touch panel TP1 and pass through the front slot 125a. The second touch panel cable TPC2 may be extended from a side of the second touch panel TP2 and pass through the rear slot 125b. The touch panel cable TPC1 and TPC2 may make its way out of the sidewall SW of the transparent body 120 once it has passed through the slot 125a and 125b. The touch panel cable TPC1 and TPC2 making its way out of the sidewall SW of the transparent body 120 may be electrically connected to a controller (not shown).

Figure 81:
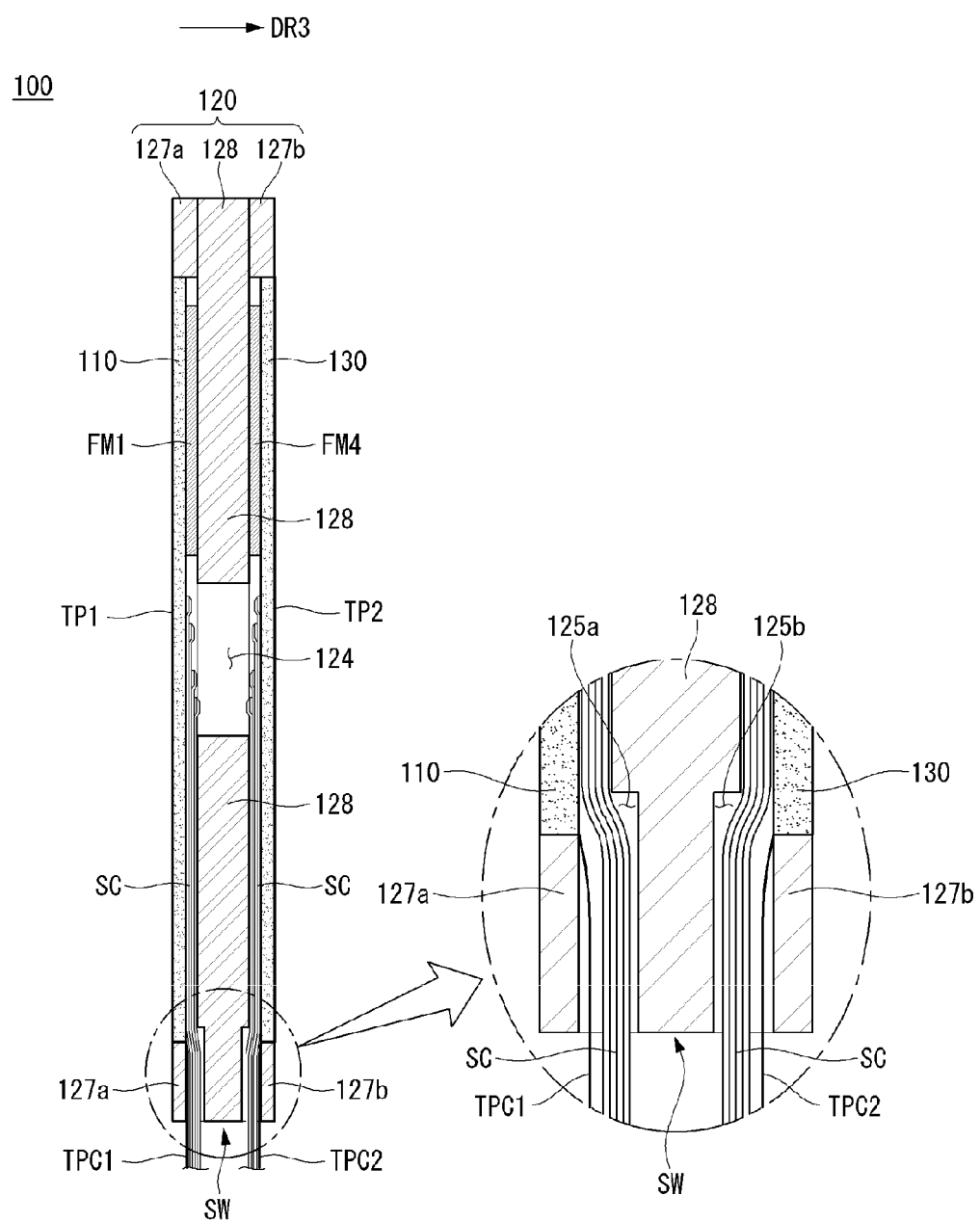

Referring to FIG. 81, the display panel 110 and 130 may be attached or coupled to the transparent plate 128 by an attachment member FM1 and FM4. The display panel 110 and 130 may be fitted to the transparent frame 127a and 127b. The first touch panel TP1 may be positioned at a front of the first display panel 110. The second touch panel TP2 may be positioned at a front of the second display panel 130.

A cable SC may be extended from a side of the first display panel 110 to the cable receiving portion 124, bent at a region corresponding to the cable receiving portion 124, and inserted into the front slot 125a. The cable SC may be bent as it is inserted into the front slot 125a. The front slot 125a may open towards the outside of the sidewall SW of the transparent body 120. The front slot 125a may be formed by forming a first transparent frame 127a with a groove in it and a transparent plate 128 with a groove and attaching them together.

A cable SC may be extended from a side of the second display panel 130 to the cable receiving portion 124, bent at a region corresponding to the cable receiving portion 124, and inserted into the rear slot 125b. The cable SC may be bent as it is inserted into the rear slot 125b. The rear slot 125b may open towards the outside of the sidewall SW of the transparent body 120. The rear slot 125a may be formed by forming a second transparent frame 127b with a groove in it and a transparent plate 128 with a groove in it and attaching them together.

The cable SC may pass through the slot 125a and 125b and make its way out of the sidewall SW of the transparent body 120. For example, the cable SC may pass through the slot 125a and 125b and come out of the bottom of the transparent body 120. The cable SC making its way out of the transparent body 120 may be electrically connected to a controller (not shown).

The first touch panel cable TPC1 may be extended from a side of the first touch panel TP1 and pass through the front slot 125a. The second touch panel cable TPC2 may be extended from a side of the second touch panel TP2 and pass through the rear slot 125b. The touch panel cable TPC1 and TPC2 may make its way out of the sidewall SW of the transparent body 120 once it has passed through the slot 125a and 125b. The touch panel cable TPC1 and TPC2 making its way out of the sidewall SW of the transparent body 120 may be electrically connected to a controller (not shown).

Some of the above-described embodiments of the present invention or other embodiments are not exclusive to or distinctive from one another. In some of the above-described embodiments of the present invention or other embodiments, the respective components or functions may be used in combination or combined with together.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a transparent plate;
   a first display panel disposed at a first surface of the transparent plate;
   a first transparent frame disposed at the first surface of the transparent plate and adjacent to the first display panel;
   a first receiving portion formed as a depressed elongated groove on the first surface of the transparent plate;
   a slot formed at at least the transparent plate or the first transparent frame;
   a first member layer connected to a first side of the first display panel;
   a first PCB connected to the first member layer and received in the first receiving portion; and
   a first cable extending from the first PCB and inserted into the slot.

2. The display device of claim 1, wherein the first receiving portion is formed adjacent to and lengthwise along a region of the transparent plate corresponding to the first side of the first display panel.

3. The display device of claim 1, wherein the slot is adjacent to a second side of the first display panel, wherein the second side of the first display panel is adjacent to the first side of the first display panel.

4. The display device of claim 1, wherein the slot comprises an opening to an outer surface of at least the transparent plate or the first transparent frame.

5. The display device of claim 1, wherein the first member layer is positioned between the first display panel and the transparent plate.

6. The display device of claim 1, wherein the first cable is bent between the first receiving portion and the slot.

7. The display device of claim 1, further comprising an additional receiving portion formed at the transparent plate, wherein the additional receiving portion is positioned between the first side of the first display panel and an opposite side of the first display panel, wherein the first side and the opposite side are parallel.

8. The display device of claim 7, wherein the additional receiving portion comprises an opening through the transparent plate.

9. The display device of claim 7, wherein at least a part of the first cable is positioned at the additional receiving portion.

10. The display device of claim 7, wherein the first cable comprises a plurality of cables and a bent portion of the plurality of cables is positioned at the additional receiving portion.

11. The display device of claim 7, wherein the additional receiving portion is formed lengthwise along the first side or the opposite side of the first display panel.

12. The display device of claim 1, wherein the transparent plate and the first transparent frame are integrally formed.

13. The display device of claim 1, wherein the transparent plate and the first transparent frame are separately constructed defining a boundary line therebetween.

14. The display device of claim 1, further comprising a first touch panel positioned at the first display panel.

15. The display device of claim 14, further comprising a first touch panel cable connected to the first touch panel, wherein the first touch panel cable is inserted into the slot.

16. The display device of claim 1, further comprising:
   a second display panel at a second surface of the transparent plate;
   a second transparent frame disposed at the second surface of the transparent plate and adjacent to the second display panel;
   a second receiving portion formed at the transparent plate;
   a second member layer connected to a first side of the second display panel;
   a second PCB connected to the second member layer and positioned at the second receiving portion; and
   a second cable extending from the second PCB and inserted into the slot,
   wherein the slot is formed at at least the transparent plate, the first transparent frame, or the second transparent frame.

17. The display device of claim 16, wherein the slot comprises:
   a first slot formed at at least the first surface of the transparent plate or the first transparent frame; and
   a second slot formed at at least the second surface of the transparent plate or the second transparent plate,
   wherein the first cable is inserted into the first slot and the second cable is inserted into the second slot.

18. The display device of claim 16, wherein the first receiving portion is in communication with the second receiving portion such that the first cable in the first receiving portion faces the second cable in the second receiving portion.

19. The display device of claim 18, wherein the first cable and the second cable are respectively bent at the first and second receiving portions.

20. The display device of claim 17, wherein the first slot and the second slot are integrated together to form an integrated slot with an opening toward an outer surface of at least the transparent plate, the first transparent frame, or the second transparent frame.

\* \* \* \* \*